(12) United States Patent
Cok et al.

(10) Patent No.: US 10,153,257 B2
(45) Date of Patent: Dec. 11, 2018

(54) MICRO-PRINTED DISPLAY

(71) Applicant: X-Celeprint Limited, Cork (IE)

(72) Inventors: Ronald S. Cok, Rochester, NY (US); Christopher Andrew Bower, Raleigh, NC (US); Matthew Meitl, Durham, NC (US); Carl Ray Prevatte, Jr., Raleigh, NC (US); Salvatore Bonafede, Chapel Hill, NC (US); Robert R. Rotzoll, Colorado Springs, CO (US)

(73) Assignee: X-Celeprint Limited, Cork (IE)

( * ) Notice: Subject to any disclaimer, the term of this patent is extended or adjusted under 35 U.S.C. 154(b) by 0 days.

(21) Appl. No.: 15/456,273

(22) Filed: Mar. 10, 2017

(65) Prior Publication Data

US 2017/0256522 A1     Sep. 7, 2017

Related U.S. Application Data

(63) Continuation-in-part of application No. 15/373,865, filed on Dec. 9, 2016.
(Continued)

(51) Int. Cl.
*H01L 25/075* (2006.01)
*H01L 27/32* (2006.01)
(Continued)

(52) U.S. Cl.
CPC .......... *H01L 25/0753* (2013.01); *H01L 25/50* (2013.01); *H01L 27/3255* (2013.01); *H01L 33/62* (2013.01); *H01L 2224/18* (2013.01)

(58) Field of Classification Search
None
See application file for complete search history.

(56) References Cited

U.S. PATENT DOCUMENTS

| 4,746,202 A | 5/1988 | Perilloux et al. |
| 5,060,027 A | 10/1991 | Hart et al. |

(Continued)

FOREIGN PATENT DOCUMENTS

| CN | 103677427 A | 3/2014 |
| EP | 1662301 A1 | 5/2006 |

(Continued)

OTHER PUBLICATIONS

U.S. Appl. No. 14/788,632, filed Jun. 30, 2015, X-Celeprint Limited.
(Continued)

*Primary Examiner* — Phat X Cao
*Assistant Examiner* — Diana C Vieira
(74) *Attorney, Agent, or Firm* — William R. Haubrook; Michael D. Schmitt; Choate, Hall & Stewart LLP

(57) ABSTRACT

A micro-printed display includes a display substrate. An array of row conductors, an array of column conductors, and a plurality of micro-pixels are disposed on the display substrate. Each micro-pixel is uniquely connected to a row and a column conductor and comprises a pixel substrate separate from the display substrate and the pixel substrate of any other micro-pixel. Pixel conductors are patterned on each pixel substrate and one or more LEDs are disposed on or over the pixel substrate. Each LED is electrically connected to one or more of the pixel conductors and has an LED substrate separate from any other LED substrate, the display substrate, and any pixel substrate. A pixel controller disposed on the pixel substrate can control the LEDs. The micro-pixel can be electrically connected to the display substrate with connection posts. Redundant or replacement LEDs or micro-pixels can be provided on the pixel or display substrate.

24 Claims, 33 Drawing Sheets

Related U.S. Application Data

(60) Provisional application No. 62/303,096, filed on Mar. 3, 2016.

(51) Int. Cl.
  *H01L 33/62* (2010.01)
  *H01L 25/00* (2006.01)

(56) References Cited

U.S. PATENT DOCUMENTS

| | | | |
|---|---|---|---|
| 5,550,066 A | 8/1996 | Tang et al. |
| 5,621,555 A | 4/1997 | Park |
| 5,625,202 A | 4/1997 | Chai |
| 5,748,161 A | 5/1998 | Lebby et al. |
| 5,815,303 A | 9/1998 | Berlin |
| 5,917,572 A | 6/1999 | Kurauchi et al. |
| 5,994,722 A | 11/1999 | Averbeck et al. |
| 6,025,730 A | 2/2000 | Akram et al. |
| 6,084,579 A | 7/2000 | Hirano |
| 6,087,680 A | 7/2000 | Gramann et al. |
| 6,142,358 A | 11/2000 | Cohn et al. |
| 6,143,672 A | 11/2000 | Ngo et al. |
| 6,169,294 B1 | 1/2001 | Biing-Jye et al. |
| 6,184,477 B1 | 2/2001 | Tanahashi |
| 6,278,242 B1 | 8/2001 | Cok et al. |
| 6,288,824 B1 | 9/2001 | Kastalsky |
| 6,340,999 B1 | 1/2002 | Masuda et al. |
| 6,392,340 B2 | 5/2002 | Yoneda et al. |
| 6,403,985 B1 | 6/2002 | Fan et al. |
| 6,410,942 B1 | 6/2002 | Thibeault et al. |
| 6,466,281 B1 | 10/2002 | Huang et al. |
| 6,504,180 B1 | 1/2003 | Heremans et al. |
| 6,552,740 B1 | 4/2003 | Wong et al. |
| 6,574,032 B1 | 6/2003 | Roddy et al. |
| 6,577,367 B2 | 6/2003 | Kim |
| 6,650,382 B1 | 11/2003 | Sumida et al. |
| 6,660,457 B1 | 12/2003 | Imai et al. |
| 6,703,780 B2 | 3/2004 | Shiang et al. |
| 6,717,560 B2 | 4/2004 | Cok et al. |
| 6,756,576 B1 | 6/2004 | McElroy et al. |
| 6,812,637 B2 | 11/2004 | Cok et al. |
| 6,828,724 B2 | 12/2004 | Burroughes |
| 6,933,532 B2 | 8/2005 | Arnold et al. |
| 6,969,624 B2 | 11/2005 | Iwafuchi et al. |
| 6,975,369 B1 | 12/2005 | Burkholder |
| 7,009,220 B2 | 3/2006 | Oohata |
| 7,012,382 B2 | 3/2006 | Cheang et al. |
| 7,091,523 B2 | 8/2006 | Cok et al. |
| 7,098,589 B2 | 8/2006 | Erchak et al. |
| 7,127,810 B2 | 10/2006 | Kasuga et al. |
| 7,129,457 B2 | 10/2006 | McElroy et al. |
| 7,195,733 B2 | 3/2007 | Rogers et al. |
| 7,259,391 B2 | 8/2007 | Liu et al. |
| 7,288,753 B2 | 10/2007 | Cok |
| 7,402,951 B2 | 7/2008 | Cok |
| 7,417,648 B2 | 8/2008 | Credelle |
| 7,420,221 B2 | 9/2008 | Nagai |
| 7,466,075 B2 | 12/2008 | Cok et al. |
| 7,521,292 B2 | 4/2009 | Rogers et al. |
| 7,557,367 B2 | 7/2009 | Rogers et al. |
| 7,586,497 B2 | 9/2009 | Boroson et al. |
| 7,605,053 B2 | 10/2009 | Couillard et al. |
| 7,614,757 B2 | 11/2009 | Nesterenko et al. |
| 7,622,367 B1 | 11/2009 | Nuzzo et al. |
| 7,629,955 B2 | 12/2009 | Asao et al. |
| 7,662,545 B2 | 2/2010 | Nuzzo et al. |
| 7,687,812 B2 | 3/2010 | Louwsma et al. |
| 7,704,684 B2 | 4/2010 | Rogers et al. |
| 7,791,271 B2 | 9/2010 | Cok et al. |
| 7,799,699 B2 | 9/2010 | Nuzzo et al. |
| 7,816,856 B2 | 10/2010 | Cok et al. |
| 7,834,541 B2 | 11/2010 | Cok |
| 7,872,722 B2 | 1/2011 | Kimura |
| 7,893,612 B2 | 2/2011 | Cok |
| 7,898,734 B2 | 3/2011 | Coleman et al. |
| 7,919,342 B2 | 4/2011 | Cok |
| 7,927,976 B2 | 4/2011 | Menard |
| 7,932,123 B2 | 4/2011 | Rogers et al. |
| 7,943,491 B2 | 5/2011 | Nuzzo et al. |
| 7,948,172 B2 | 5/2011 | Cok et al. |
| 7,969,085 B2 | 6/2011 | Cok |
| 7,972,875 B2 | 7/2011 | Rogers et al. |
| 7,982,296 B2 | 7/2011 | Nuzzo et al. |
| 7,990,058 B2 | 8/2011 | Cok et al. |
| 7,999,454 B2 | 8/2011 | Winters et al. |
| 8,004,758 B2 | 8/2011 | Coleman et al. |
| 8,029,139 B2 | 10/2011 | Ellinger et al. |
| 8,039,847 B2 | 10/2011 | Nuzzo et al. |
| 8,058,663 B2 | 11/2011 | Fan et al. |
| 8,179,401 B2 | 5/2012 | Ishii |
| 8,198,621 B2 | 6/2012 | Rogers et al. |
| 8,207,547 B2 | 6/2012 | Lin |
| 8,243,027 B2 | 8/2012 | Hotelling et al. |
| 8,261,660 B2 | 9/2012 | Menard |
| 8,288,843 B2 | 10/2012 | Kojima et al. |
| 8,334,545 B2 | 12/2012 | Levermore et al. |
| 8,394,706 B2 | 3/2013 | Nuzzo et al. |
| 8,440,546 B2 | 5/2013 | Nuzzo et al. |
| 8,450,927 B2 | 5/2013 | Lenk et al. |
| 8,470,701 B2 | 6/2013 | Rogers et al. |
| 8,502,192 B2 | 8/2013 | Kwak et al. |
| 8,506,867 B2 | 8/2013 | Menard |
| 8,536,584 B2 | 9/2013 | Yao |
| 8,581,827 B2 | 11/2013 | Park et al. |
| 8,596,846 B2 | 12/2013 | Yankov et al. |
| 8,599,118 B2 | 12/2013 | Cok |
| 8,619,011 B2 | 12/2013 | Kimura |
| 8,664,699 B2 | 3/2014 | Nuzzo et al. |
| 8,686,447 B2 | 4/2014 | Tomoda et al. |
| 8,722,458 B2 | 5/2014 | Rogers et al. |
| 8,735,932 B2 | 5/2014 | Kim et al. |
| 8,754,396 B2 | 6/2014 | Rogers et al. |
| 8,766,970 B2 | 7/2014 | Chien et al. |
| 8,791,474 B1 | 7/2014 | Bibl et al. |
| 8,794,501 B2 | 8/2014 | Bibl et al. |
| 8,803,857 B2 | 8/2014 | Cok |
| 8,817,369 B2 | 8/2014 | Daiku |
| 8,829,663 B2 | 9/2014 | Pohl et al. |
| 8,836,624 B2 | 9/2014 | Roberts et al. |
| 8,854,294 B2 | 10/2014 | Sakariya |
| 8,860,051 B2 | 10/2014 | Fellows et al. |
| 8,877,648 B2 | 11/2014 | Bower et al. |
| 8,884,844 B2 | 11/2014 | Yang et al. |
| 8,889,485 B2 | 11/2014 | Bower |
| 8,895,406 B2 | 11/2014 | Rogers et al. |
| 8,896,505 B2 | 11/2014 | Cok et al. |
| 8,901,578 B2 | 12/2014 | Kobayakawa et al. |
| 8,902,152 B2 | 12/2014 | Bai et al. |
| 8,912,020 B2 | 12/2014 | Bedell et al. |
| 8,946,760 B2 | 2/2015 | Kim |
| 8,987,765 B2 | 3/2015 | Bibl et al. |
| 9,022,632 B2 | 5/2015 | Kim et al. |
| 9,048,449 B2 | 6/2015 | Kim et al. |
| 9,105,813 B1 | 8/2015 | Chang |
| 9,153,171 B2 | 10/2015 | Sakariya et al. |
| 9,178,123 B2 | 11/2015 | Sakariya et al. |
| 9,202,996 B2 | 12/2015 | Orsley et al. |
| 9,226,361 B2 | 12/2015 | Toth |
| 9,277,618 B2 | 3/2016 | Odnoblyudov et al. |
| 9,293,422 B1 | 3/2016 | Parsa et al. |
| 9,308,649 B2 | 4/2016 | Golda et al. |
| 9,329,430 B2 | 5/2016 | Erinjippurath et al. |
| 9,343,042 B2 | 5/2016 | Miller et al. |
| 9,368,683 B1 | 6/2016 | Meitl et al. |
| 9,412,977 B2 | 8/2016 | Rohatgi |
| 9,437,782 B2 | 9/2016 | Bower et al. |
| 9,444,015 B2 | 9/2016 | Bower et al. |
| 9,520,537 B2 | 12/2016 | Bower et al. |
| 9,537,069 B1 | 1/2017 | Bower et al. |
| 9,626,908 B2 | 4/2017 | Sakariya et al. |
| 9,698,308 B2 | 7/2017 | Bower et al. |
| 9,705,042 B2 | 7/2017 | Bower et al. |
| 9,716,082 B2 | 7/2017 | Bower et al. |
| 9,741,785 B2 | 8/2017 | Bower et al. |

(56) References Cited

U.S. PATENT DOCUMENTS

| | | |
|---|---|---|
| 9,860,955 B2 | 1/2018 | Kim et al. |
| 9,871,345 B2 | 1/2018 | Bower et al. |
| 9,980,341 B2 | 5/2018 | Bower et al. |
| 9,997,501 B2 | 6/2018 | Bower et al. |
| 10,008,483 B2 | 6/2018 | Cok et al. |
| 2001/0022564 A1 | 9/2001 | Youngquist et al. |
| 2002/0096994 A1 | 7/2002 | Iwafuchi et al. |
| 2002/0140646 A1 | 10/2002 | Sato et al. |
| 2002/0171792 A1 | 11/2002 | Kubota et al. |
| 2002/0171801 A1 | 11/2002 | Hsieh et al. |
| 2003/0001165 A1 | 1/2003 | Taki |
| 2004/0080483 A1 | 4/2004 | Chosa |
| 2004/0135160 A1* | 7/2004 | Cok ................ C23C 14/042 257/88 |
| 2004/0180476 A1 | 9/2004 | Kazlas et al. |
| 2004/0212296 A1 | 10/2004 | Nakamura et al. |
| 2004/0227704 A1 | 11/2004 | Wang et al. |
| 2004/0252933 A1 | 12/2004 | Sylvester et al. |
| 2005/0006657 A1 | 1/2005 | Terashita |
| 2005/0012076 A1 | 1/2005 | Morioka |
| 2005/0116621 A1 | 6/2005 | Bellmann et al. |
| 2005/0140275 A1 | 6/2005 | Park |
| 2005/0168987 A1 | 8/2005 | Tamaoki et al. |
| 2005/0202595 A1 | 9/2005 | Yonehara et al. |
| 2005/0264472 A1 | 12/2005 | Rast |
| 2005/0275615 A1 | 12/2005 | Kahen et al. |
| 2005/0285246 A1 | 12/2005 | Haba et al. |
| 2006/0051900 A1 | 3/2006 | Shizuno |
| 2006/0063309 A1 | 3/2006 | Sugiyama et al. |
| 2006/0246811 A1 | 11/2006 | Winters et al. |
| 2006/0273862 A1 | 12/2006 | Shimmura |
| 2006/0289972 A1 | 12/2006 | Nishimura et al. |
| 2007/0035340 A1 | 2/2007 | Kimura |
| 2007/0077349 A1 | 4/2007 | Newman et al. |
| 2007/0182809 A1 | 8/2007 | Yarid et al. |
| 2007/0201056 A1 | 8/2007 | Cok et al. |
| 2008/0108171 A1 | 5/2008 | Rogers et al. |
| 2008/0211734 A1 | 9/2008 | Huitema et al. |
| 2008/0296717 A1 | 12/2008 | Beroz et al. |
| 2009/0045420 A1 | 2/2009 | Eng et al. |
| 2009/0140630 A1 | 6/2009 | Kijima et al. |
| 2009/0146921 A1 | 6/2009 | Takahashi |
| 2009/0278142 A1 | 11/2009 | Watanabe et al. |
| 2009/0284696 A1 | 11/2009 | Cheong et al. |
| 2009/0295706 A1 | 12/2009 | Feng |
| 2009/0315054 A1 | 12/2009 | Kim et al. |
| 2010/0038655 A1 | 2/2010 | Chen et al. |
| 2010/0060553 A1 | 3/2010 | Zimmerman et al. |
| 2010/0078670 A1 | 4/2010 | Kim et al. |
| 2010/0123134 A1 | 5/2010 | Nagata |
| 2010/0123268 A1 | 5/2010 | Menard |
| 2010/0148198 A1 | 6/2010 | Sugizaki et al. |
| 2010/0149117 A1 | 6/2010 | Chien et al. |
| 2010/0186883 A1 | 7/2010 | Tomoda |
| 2010/0190293 A1 | 7/2010 | Maeda et al. |
| 2010/0201253 A1 | 8/2010 | Cok et al. |
| 2010/0207852 A1 | 8/2010 | Cok |
| 2010/0214245 A1 | 8/2010 | Hirota |
| 2010/0214247 A1 | 8/2010 | Tang et al. |
| 2010/0248484 A1 | 9/2010 | Bower et al. |
| 2010/0258710 A1 | 10/2010 | Wiese et al. |
| 2010/0270912 A1 | 10/2010 | Ko |
| 2010/0289115 A1 | 11/2010 | Akiyama et al. |
| 2010/0317132 A1 | 12/2010 | Rogers et al. |
| 2010/0321414 A1 | 12/2010 | Muroi et al. |
| 2010/0328268 A1 | 12/2010 | Teranishi et al. |
| 2011/0032277 A1 | 2/2011 | Lee et al. |
| 2011/0043435 A1 | 2/2011 | Hebenstreit et al. |
| 2011/0069013 A1 | 3/2011 | Rabenstein et al. |
| 2011/0108800 A1 | 5/2011 | Pan |
| 2011/0120678 A1 | 5/2011 | Palm |
| 2011/0205448 A1 | 8/2011 | Takata |
| 2011/0211348 A1 | 9/2011 | Kim |
| 2011/0242027 A1 | 10/2011 | Chang |
| 2011/0309378 A1 | 12/2011 | Lau et al. |
| 2011/0316008 A1 | 12/2011 | Yokogawa |
| 2012/0049222 A1 | 3/2012 | Yoshizumi et al. |
| 2012/0056835 A1 | 3/2012 | Choo et al. |
| 2012/0062135 A1 | 3/2012 | Tamaki et al. |
| 2012/0105518 A1 | 5/2012 | Kang et al. |
| 2012/0119249 A1 | 5/2012 | Kim et al. |
| 2012/0126229 A1 | 5/2012 | Bower |
| 2012/0141799 A1 | 6/2012 | Kub et al. |
| 2012/0206428 A1 | 8/2012 | Cok |
| 2012/0206499 A1 | 8/2012 | Cok |
| 2012/0223636 A1 | 9/2012 | Shin et al. |
| 2012/0223875 A1 | 9/2012 | Lau et al. |
| 2012/0228669 A1 | 9/2012 | Bower et al. |
| 2012/0236022 A1 | 9/2012 | Homma et al. |
| 2012/0256163 A1 | 10/2012 | Yoon et al. |
| 2012/0274669 A1 | 11/2012 | Neal |
| 2012/0281028 A1 | 11/2012 | Orlick et al. |
| 2012/0314388 A1 | 12/2012 | Bower et al. |
| 2012/0320566 A1 | 12/2012 | Namekata |
| 2012/0320581 A1 | 12/2012 | Rogers et al. |
| 2012/0326175 A1 | 12/2012 | Hu et al. |
| 2013/0006524 A1 | 1/2013 | Sasaki et al. |
| 2013/0010405 A1 | 1/2013 | Rothkopf et al. |
| 2013/0015483 A1 | 1/2013 | Shimokawa et al. |
| 2013/0016494 A1 | 1/2013 | Speier et al. |
| 2013/0036928 A1 | 2/2013 | Rogers et al. |
| 2013/0069275 A1 | 3/2013 | Menard et al. |
| 2013/0088416 A1 | 4/2013 | Smith et al. |
| 2013/0128585 A1 | 5/2013 | Bibl et al. |
| 2013/0153277 A1 | 6/2013 | Menard et al. |
| 2013/0153934 A1* | 6/2013 | Meitl ................ G09F 9/3026 257/84 |
| 2013/0196474 A1 | 8/2013 | Meitl et al. |
| 2013/0207964 A1 | 8/2013 | Fleck et al. |
| 2013/0221355 A1 | 8/2013 | Bower et al. |
| 2013/0248889 A1 | 9/2013 | Lin |
| 2013/0257264 A1 | 10/2013 | Tamaki et al. |
| 2013/0273695 A1 | 10/2013 | Menard et al. |
| 2013/0278513 A1 | 10/2013 | Jang |
| 2014/0014960 A1 | 1/2014 | Yamazaki et al. |
| 2014/0027709 A1 | 1/2014 | Higginson et al. |
| 2014/0082934 A1 | 3/2014 | Cok |
| 2014/0084482 A1 | 3/2014 | Hu et al. |
| 2014/0085214 A1 | 3/2014 | Cok |
| 2014/0104157 A1 | 4/2014 | Burns et al. |
| 2014/0104243 A1 | 4/2014 | Sakariya et al. |
| 2014/0111442 A1 | 4/2014 | Cok et al. |
| 2014/0146273 A1 | 5/2014 | Kim et al. |
| 2014/0151715 A1 | 6/2014 | Smirnov et al. |
| 2014/0159043 A1 | 6/2014 | Sakariya et al. |
| 2014/0159065 A1 | 6/2014 | Hu et al. |
| 2014/0175498 A1 | 6/2014 | Lai |
| 2014/0183446 A1 | 7/2014 | Nago et al. |
| 2014/0192079 A1 | 7/2014 | Lee et al. |
| 2014/0197509 A1 | 7/2014 | Haddad et al. |
| 2014/0198373 A1 | 7/2014 | Ray |
| 2014/0217448 A1 | 8/2014 | Kim et al. |
| 2014/0231839 A1 | 8/2014 | Jeon et al. |
| 2014/0231851 A1 | 8/2014 | Tsai et al. |
| 2014/0240617 A1 | 8/2014 | Fukutome et al. |
| 2014/0264763 A1 | 9/2014 | Meitl et al. |
| 2014/0267683 A1 | 9/2014 | Bibl et al. |
| 2014/0306248 A1 | 10/2014 | Ahn et al. |
| 2014/0319486 A1 | 10/2014 | Hong |
| 2014/0339495 A1 | 11/2014 | Bibl et al. |
| 2014/0340900 A1 | 11/2014 | Bathurst et al. |
| 2014/0367633 A1 | 12/2014 | Bibl et al. |
| 2014/0367705 A1 | 12/2014 | Bibl et al. |
| 2015/0003040 A1 | 1/2015 | Bessho et al. |
| 2015/0021632 A1 | 1/2015 | Taghizadeh et al. |
| 2015/0135525 A1 | 5/2015 | Bower |
| 2015/0137153 A1 | 5/2015 | Bibl et al. |
| 2015/0169011 A1 | 6/2015 | Bibl et al. |
| 2015/0179453 A1 | 6/2015 | Cheng et al. |
| 2015/0263066 A1 | 9/2015 | Hu et al. |
| 2015/0280066 A1 | 10/2015 | Fujimura et al. |
| 2015/0280089 A1 | 10/2015 | Obata et al. |
| 2015/0296580 A1 | 10/2015 | Kim et al. |
| 2015/0308634 A1 | 10/2015 | van de Ven et al. |

(56) References Cited

U.S. PATENT DOCUMENTS

| | | |
|---|---|---|
| 2015/0318328 A1 | 11/2015 | Bibl et al. |
| 2015/0327388 A1 | 11/2015 | Menard et al. |
| 2015/0362165 A1 | 12/2015 | Chu et al. |
| 2015/0370130 A1 | 12/2015 | Lin |
| 2015/0371585 A1 | 12/2015 | Bower et al. |
| 2015/0371974 A1 | 12/2015 | Bower et al. |
| 2015/0372051 A1 | 12/2015 | Bower et al. |
| 2015/0372052 A1 | 12/2015 | Bower et al. |
| 2015/0372053 A1 | 12/2015 | Bower et al. |
| 2015/0372187 A1 | 12/2015 | Bower et al. |
| 2015/0373793 A1 | 12/2015 | Bower et al. |
| 2016/0004123 A1 | 1/2016 | Tanabe |
| 2016/0005721 A1 | 1/2016 | Bower et al. |
| 2016/0018094 A1 | 1/2016 | Bower et al. |
| 2016/0056725 A1 | 2/2016 | Kim et al. |
| 2016/0057822 A1 | 2/2016 | Chu |
| 2016/0057827 A1 | 2/2016 | Miskin |
| 2016/0057832 A1 | 2/2016 | Briggs et al. |
| 2016/0064363 A1 | 3/2016 | Bower et al. |
| 2016/0085120 A1 | 3/2016 | Xu |
| 2016/0093600 A1 | 3/2016 | Bower et al. |
| 2016/0131329 A1 | 5/2016 | Park et al. |
| 2016/0211245 A1 | 7/2016 | Do |
| 2016/0260388 A1 | 9/2016 | Yata et al. |
| 2016/0266697 A1 | 9/2016 | Cheng et al. |
| 2016/0343772 A1 | 11/2016 | Bower et al. |
| 2016/0351539 A1 | 12/2016 | Bower et al. |
| 2016/0364030 A1 | 12/2016 | Peana et al. |
| 2017/0005244 A1 | 1/2017 | Bower et al. |
| 2017/0025484 A1 | 1/2017 | Forrest et al. |
| 2017/0047393 A1 | 2/2017 | Bower et al. |
| 2017/0048976 A1 | 2/2017 | Prevatte et al. |
| 2017/0061842 A1 | 3/2017 | Cok et al. |
| 2017/0068362 A1 | 3/2017 | Den Boer et al. |
| 2017/0092863 A1 | 3/2017 | Bower et al. |
| 2017/0102797 A1 | 4/2017 | Cok |
| 2017/0122502 A1 | 5/2017 | Cok et al. |
| 2017/0133818 A1 | 5/2017 | Cok |
| 2017/0167703 A1 | 6/2017 | Cok |
| 2017/0206845 A1 | 7/2017 | Sakariya et al. |
| 2017/0250219 A1 | 8/2017 | Bower et al. |
| 2017/0256521 A1 | 9/2017 | Cok et al. |
| 2017/0287882 A1 | 10/2017 | Cok et al. |
| 2017/0352646 A1 | 12/2017 | Bower et al. |
| 2017/0357127 A1 | 12/2017 | Cok et al. |
| 2017/0358717 A1 | 12/2017 | Cok et al. |
| 2018/0033853 A1 | 2/2018 | Bower et al. |
| 2018/0041005 A1 | 2/2018 | Bower et al. |
| 2018/0084614 A1 | 3/2018 | Bower et al. |
| 2018/0119931 A1 | 5/2018 | Bower et al. |
| 2018/0130400 A1 | 5/2018 | Meitl et al. |
| 2018/0211945 A1 | 7/2018 | Cok et al. |
| 2018/0226386 A1 | 8/2018 | Cok |

FOREIGN PATENT DOCUMENTS

| | | |
|---|---|---|
| EP | 2078978 A2 | 7/2009 |
| EP | 2148264 A2 | 1/2010 |
| EP | 2 610 314 A1 | 7/2013 |
| EP | 2703969 A2 | 3/2014 |
| GB | 2 496 183 A | 5/2013 |
| JP | 11-142878 | 5/1999 |
| WO | WO-2006/027730 A1 | 3/2006 |
| WO | WO-2006/099741 A1 | 9/2006 |
| WO | WO-2008/103931 A2 | 8/2008 |
| WO | WO-2010/032603 A1 | 3/2010 |
| WO | WO-2010/111601 A2 | 9/2010 |
| WO | WO-2010/132552 A1 | 11/2010 |
| WO | WO-2013/064800 A1 | 5/2013 |
| WO | WO-2013/165124 A1 | 11/2013 |
| WO | WO-2014/121635 A1 | 8/2014 |
| WO | WO-2014/149864 A1 | 9/2014 |
| WO | WO-2015/088629 A1 | 6/2015 |
| WO | WO-2015/193434 A2 | 12/2015 |
| WO | WO-2016/030422 A1 | 3/2016 |
| WO | WO-2016/046283 A2 | 3/2016 |
| WO | WO-2017/042252 A1 | 3/2017 |
| WO | WO-2017/060487 A4 | 7/2017 |
| WO | WO-2017/149067 A1 | 9/2017 |
| WO | WO-2017/174632 A1 | 10/2017 |

OTHER PUBLICATIONS

U.S. Appl. No. 14/807,311, filed Jul. 23, 2015, X-Celeprint Limited.
U.S. Appl. No. 14/822,866, filed Aug. 10, 2015, Bower et al.
Choi, H. W. et al., Efficient GaN-based Micro-LED Arrays, Mat. Res. Soc. Symp. Proc. 743:L6.28.1-L6.28.6 (2003).
Cok, R. S. et al., AMOLED displays with transfer-printed integrated circuits, Journal of SID 19/(4):335-341(2011).
Hamer et al., "63.2: AMOLED Displays Using Transfer-Printed Integrated Circuits," SID 09 Digest, 40(2):947-950 (2009).
Johnson, K. et al., Advances in Red VCSEL Technology, Advances in Optical Technologies, 2012:569379, 13 pages (2012).
Kasahara, D. et al, Nichia reports first room-temperature blue/'green' VCSELs with current injection, Appl. Phys. Express, 4(7):3 pages (2011).
Koma, N. et al., 44.2: Novel Front-light System Using Fine-pitch Patterned OLED, SID, 08:655-658 (2008).
Lee, S. H. etal, Laser Lift-Offof GaN Thin Film and its Application to the Flexible Light Emitting Diodes, Proc. of SPIE 8460:846011-1-846011-6 (2012).
Poher, V. et al., Micro-LED arrays: a tool for two-dimensional neuron stimulation, J. Phys. D: Appl. Phys. 41:094014 (2008).
Roscher, H., VCSEL Arrays with Redundant Pixel Designs for 10Gbits/s 2-D Space-Parallel MMF Transmission, Annual Report, optoelectronics Department, (2005).
Seurin, J.F. et al, High-power red VCSEL arrays, Proc. of SPIE 8639:1-9 (2013).
Yaniv et al., A 640×480 Pixel Computer Display Using Pin Diodes with Device Redundancy, 1988 International Display Research Conference, IEEE, CH-2678-1/88:152-154 (1988).
Yoon, J. et al., Heterogeneously Integrated Optoelectronic Devices Enabled by MicroTransfer Printing, Adv. Optical Mater. 3:1313-1335 (2015).
International Search Report, PCT/EP2017/054887, 4 pages, dated May 31, 2017.
Matioli, E. et al., High-brightness polarized light-emitting diodes, Light: Science & Applicaitons, 1:e22:1-7 (2012).
Written Opinion, PCT/EP2017/054887, 7 pages, dated May 31, 2017.
Yu, Jennifer and Bulovic, Vladimir, Micropatterning metal electrode of organic light emitting devices using rapid polydimethylsiloxane lift-off, Applied Physics Letters, 91:043102-1043102-3, (2007).

* cited by examiner

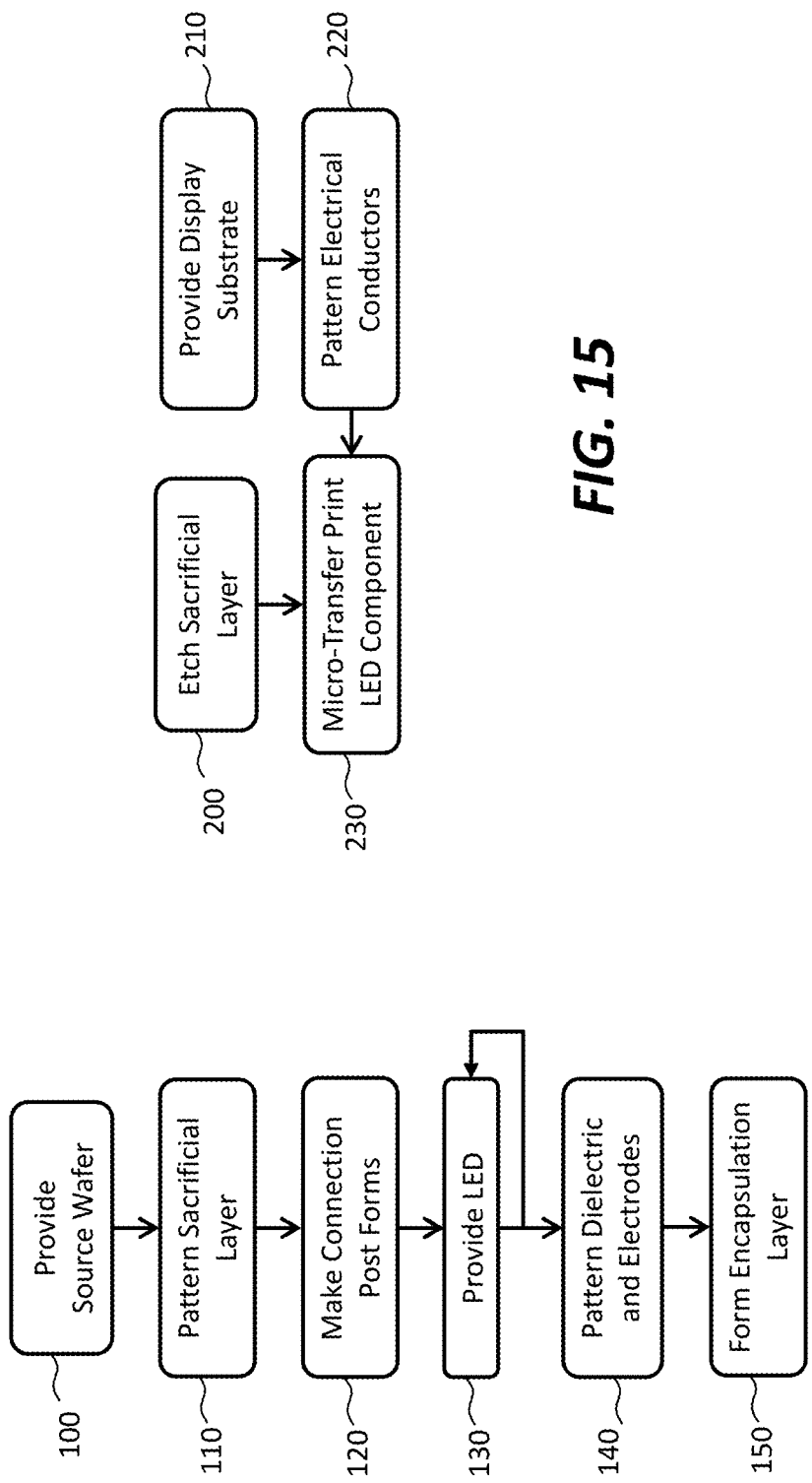

MICRO-PRINTED DISPLAY

PRIORITY APPLICATION

This application claims priority to U.S. patent application Ser. No. 15/373,865, entitled Micro-Transfer Printable Electronic Component, filed Dec. 9, 2016, which claims priority to U.S. Patent Application No. 62/303,096, entitled Micro-Transfer Printable LED Component, filed Mar. 3, 2016, the disclosures of which are incorporated herein by reference in their entirety.

CROSS REFERENCE TO RELATED APPLICATIONS

Reference is made to U.S. Pat. No. 8,889,485, entitled Methods for Surface Attachment of Flipped Active Components by Christopher Bower, filed Jun. 7, 2012, to U.S. patent application Ser. No. 14/822,868 to Bower et al., entitled Compound Micro-Assembly Strategies and Devices, filed Aug. 10, 2015, to U.S. patent application Ser. No. 14/807,226 to Cok et al., entitled Parallel Redundant Chiplet System, filed Jul. 23, 2015, to U.S. patent application Ser. No. 15/003,721 to Cok, entitled Serial Row-Select Matrix-Addressed System, filed Jan. 21, 2016, to U.S. patent application Ser. No. 15/040,810 to Cok et al., entitled Matrix-Addressed Device Repair, filed Feb. 10, 2016, to U.S. Patent Application Ser. No. 62/366,945 to Bower et al., entitled Single Metal Layer Display, filed Jul. 26, 2016, and to U.S. patent application Ser. No. 14/822,864, entitled Chiplets with Connection Posts by Prevatte et al., filed Aug. 10, 2015, the disclosures of which are incorporated herein by reference in their entirety.

FIELD OF THE INVENTION

The present invention relates to structures and methods for electrically interconnecting light-emitting diodes to contact pads on a substrate using micro-transfer printing.

BACKGROUND OF THE INVENTION

Substrates with electronically active components such as transistors or light-emitting diodes distributed over the extent of the substrate can be used in a variety of electronic systems, for example, flat-panel imaging devices such as flat-panel liquid crystal or organic light emitting diode (OLED) display devices and in flat-panel solar cells. A variety of methods may be used to distribute electronically active circuits over substrates, including forming the electronically active circuits on a substrate and forming the components on separate substrates and placing them on a substrate. In the latter case, a variety of assembly technologies for device packaging may be used.

The electronically active components are typically formed on a substrate by sputtering a layer of inorganic semiconductor material or by spin-coating organic material over the entire substrate. Inorganic semiconductor materials can be processed to improve their electronic characteristics, for example amorphous silicon can be treated to form low-temperature or high-temperature poly-crystalline silicon. In other process methods, microcrystalline semiconductor layers can be formed by using an underlying seeding layer. These methods typically improve the electron mobility of the semiconductor layer. The substrate and layer of semiconductor material can be photo-lithographically processed to define electronically active components, such as transistors. Such transistors are known as thin-film transistors (TFTs) since they are formed in a thin layer of semiconductor material, typically silicon. Transistors may also be formed in thin layers of organic materials. In these devices, the substrate is often made of glass, for example Corning Eagle® or Jade® glass designed for display applications.

The above techniques have some limitations. Despite processing methods used to improve the performance of thin-film transistors, such transistors may provide performance that is lower than the performance of other integrated circuits (ICs) formed in mono-crystalline semiconductor material. Semiconductor material and active components can be provided only on portions of the substrate, leading to wasted material and processing costs. The choice of substrate materials can also be limited by the processing steps necessary to process the semiconductor material and the photolithographic steps used to pattern the active components. For example, plastic substrates have a limited chemical and heat tolerance and do not readily survive photolithographic processing. Furthermore, the manufacturing equipment used to process large substrates with thin-film circuitry is relatively expensive. Other substrate materials that may be used include quartz, for example, for integrated circuits using silicon-on-insulator structures as described in U.S. Patent Application Publication No. 2010/0289115 and U.S. Patent Application Publication No. 2010/0123134. However, such substrate materials can be more expensive or difficult to process.

Other methods used for distributing electronically functional components over a substrate in the circuit board assembly industry include, for example, pick-and-place technologies for integrated circuits provided in a variety of packages, for example, pin-grid arrays, ball-grid arrays, and flip-chips. Such packages typically include an integrated circuit die located within a package cavity with wire bonds connecting electrical contacts on the die to pins extending from the package. However, these techniques may be limited in the size of the integrated circuits that can be placed.

In other manufacturing techniques, a mono-crystalline semiconductor wafer is employed as the substrate. While this approach can provide substrates with the same performance as integrated circuits, the size of such substrates may be limited, for example, to a 12-inch diameter circle, and the wafers are relatively expensive compared to other substrate materials such as glass, polymer, or quartz.

In yet another approach, thin layers of semiconductor are bonded to a substrate and then processed. Such a method is known as semiconductor-on-glass or silicon-on-glass (SOG) and is described, for example, in U.S. Pat. No. 7,605,053, issued Oct. 20, 2009. If the semiconductor material is crystalline, high-performance thin-film circuits can be obtained. However, the bonding technique and the processing equipment for the substrates to form the thin-film active components on large substrates can be relatively expensive.

Publication No. 11-142878 of the Patent Abstracts of Japan entitled Formation of Display Transistor Array Panel describes etching a substrate to remove it from a thin-film transistor array on which the TFT array was formed. TFT circuits formed on a first substrate can be transferred to a second substrate by adhering the first substrate and the TFTs to the surface of the second substrate and then etching away the first substrate, leaving the TFTs bonded to the second substrate. This method may require etching a significant quantity of material, and may risk damaging the exposed TFT array.

Other methods of locating material on a substrate are described in U.S. Pat. No. 7,127,810. In this approach, a first substrate carries a thin-film object to be transferred to a second substrate. An adhesive is applied to the object to be transferred or to the second substrate in the desired location of the object. The substrates are aligned and brought into contact. A laser beam irradiates the object to abrade the transferring thin film so that the transferring thin film adheres to the second substrate. The first and second substrates are separated by peeling the film in the abraded areas from the first substrate and transferring it to the second substrate. In one embodiment, a plurality of objects is selectively transferred by employing a plurality of laser beams to abrade selected area. Objects to be transferred can include thin-film circuits.

U.S. Pat. No. 6,969,624 describes a method of transferring a device from a first substrate onto a holding substrate by selectively irradiating an interface with an energy beam. The interface is located between a device for transfer and the first substrate and includes a material that generates ablation upon irradiation, thereby releasing the device from the substrate. For example, a light-emitting diode (LED) is made of a nitride semiconductor on a sapphire substrate. The energy beam is directed to the interface between the sapphire substrate and the nitride semiconductor releasing the LED and allowing the LED to adhere to a holding substrate coated with an adhesive. The adhesive is then cured. These methods, however, may require the patterned deposition of adhesive on the object(s) or on the second substrate. Moreover, the laser beam that irradiates the object may need to be shaped to match the shape of the object, and the laser abrasion can damage the object to be transferred. Furthermore, the adhesive cure takes time, which may reduce the throughput of the manufacturing system.

Another method for transferring active components from one substrate to another is described in AMOLED Displays using Transfer-Printed Integrated Circuits published in the Proceedings of the 2009 Society for Information Display International Symposium Jun. 2-5, 2009, in San Antonio Tex., US, vol. 40, Book 2, ISSN 0009-0966X, paper 63.2 p. 947. In this approach, small integrated circuits are formed over a buried oxide layer on the process side of a crystalline wafer. The small integrated circuits, or chiplets, are released from the wafer by etching the buried oxide layer formed beneath the circuits. A PDMS stamp is pressed against the wafer and the process side of the chiplets is adhered to the stamp. The chiplets are pressed against a destination substrate or backplane coated with an adhesive and thereby adhered to the destination substrate. The adhesive is subsequently cured. In another example, U.S. Pat. No. 8,722,458 entitled Optical Systems Fabricated by Printing-Based Assembly teaches transferring light-emitting, light-sensing, or light-collecting semiconductor elements from a wafer substrate to a destination substrate or backplane.

In such methods, it is generally necessary to electrically connect the small integrated circuits or chiplets to electrically conductive elements such as contact pads on the destination substrate. By applying electrical signals to conductors on the destination substrate the small integrated circuits are energized and made operational. The electrical connections between the small integrated circuits and the contact pads are typically made by photolithographic processes in which a metal is evaporated or sputtered onto the small integrated circuits and the destination substrate to form a metal layer, the metal layer is coated with a photoresist that is exposed to a circuit connection pattern, and the metal layer and photoresist are developed by etching and washing to form the patterned electrical connections between the small integrated circuits and the contact pads on the destination substrate. Additional layers, such as interlayer dielectric insulators can also be required. This process is expensive and requires a number of manufacturing steps. Moreover, the topographical structure of the small integrated circuits over the destination substrate renders the electrical connections problematic. For example, it can be difficult to form a continuous conductor from the destination substrate to the small integrated circuit because of the differences in height over the surface between the small integrated circuits and the destination substrate.

There is a need, therefore, for structures and methods that enable the electrical interconnection of small integrated circuits, such as micro transfer printed chiplets or light-emitting diodes, to destination substrates.

SUMMARY OF THE INVENTION

In accordance with embodiments of the present invention, electronic components incorporating one or more electronic devices having active elements such as transistors, diodes, or light-emitting diodes and passive elements such as resistors, capacitors, and conductors are micro transfer printed from a native source wafer to a non-native destination substrate or backplane. The electronic components include an electrically conducting connection post that protrudes from a side of the electronic component and is brought into contact with a destination substrate contact pad to form an electrical connection between the electronic component and the destination substrate. The electronic components can be at least partially adhered to the destination substrate by forcefully driving the connection posts into the contact pads when micro transfer printing, for example by exerting mechanical pressure on the transfer stamp. The connection posts, the contact pads, or both the connection posts and contact pads can be deformed or crumpled and the connection post can be driven into or through the backplane contact pad, thereby wedging the connection post in the destination substrate contact pad to adhere the connection post to the destination substrate contact pad and form an electrical contact between them. As a consequence, the connection post can be welded to the destination substrate contact pad. An additional heat treatment can be provided to facilitate the welding. Alternatively, or additionally, a layer of metal, for example a solder can be provided on either the surface of the connection post or the destination substrate contact pad, or both, that can be heated, causing the solder to reflow and thereby both adhere and electrically connect the connection post to the destination substrate contact pad. Moreover, an adhesive can be provided on the destination substrate or electronic component to adhere the electronic component to the destination substrate. The adhesive can be patterned, can be located between the electronic component and the destination substrate, or can underfill the volume between the electronic component and the destination substrate. The adhesive can cover the destination substrate contact pad and the connection post can extend through the adhesive.

The electronic component can be a micro-transfer printable electronic component and can include a tether that fractures, separates, or disengages when the electronic component is micro-transfer printed. The electronic devices in the electronic component can also be micro-transfer printed to the electronic component and can also include a similar tether that fractures, separates, or disengages when the electronic device(s) are micro-transfer printed. Thus, the electronic component can be made using micro-transfer printing and the electronic component itself can be micro-transfer printed. The connection posts can have an electrically conductive layer formed over a core of a different material, for example a metal layer formed over a dielectric core, such as silicon oxide or silicon nitride.

In an embodiment of the present invention, the electronic component includes a plurality of electronic devices, such as integrated circuits, disposed in contact with a dielectric layer. The electronic devices have device electrical contacts. Alternatively, the electronic component is an LED component including at least one LED electronic device having LED electrical contacts for providing electrical power to the LED. The electronic component has a post side and an opposing stamp side, and a plurality of electrical conductors. The stamp side is configured for contact with a stamp pillar (for example an elastomeric stamp) for micro-transfer printing. At least one electrical conductor is electrically connected to each of the device electrical contacts. One or more electrically conductive connection posts protrude from the dielectric layer in a direction opposite to the stamp side. Each connection post is electrically connected to at least one of the electrical conductors.

The device electrical contacts can be provided on a common side of the electronic component. The dielectric layer or a dielectric substrate can be provided on the connection post side or on the stamp side of the electronic component opposite the connection posts. If the dielectric layer or dielectric substrate is provided on the connection post side, the connection posts protrude beyond the dielectric layer or dielectric substrate. If the dielectric layer is provided on the stamp side of the electronic component, the dielectric layer can serve as an encapsulation and environmental protection layer that also provides addition mechanical support to the electronic component. The dielectric layer can be a substrate on which other elements of the component are formed and can be transparent so that light emitted by the LED component can pass through the dielectric layer. The LED component can emit light in the direction of the connection posts or in an opposite direction.

In another embodiment, the printable electronic component includes one or more electrically conductive additional connection posts that protrude beyond the dielectric layer in a direction opposite to the stamp side. Each additional connection post is electrically connected with an electrical conductor to either a connection post or an additional connection post.

The printable electronic component can include a plurality of electronic devices with device electrical contacts connected to electrical conductors. For example, the electronic component can include one or more integrated circuits, light-emitting diodes, light-emitting diode lasers, light-sensing diodes or transistors, opto-electronic devices, an acoustic wave device, transistors, capacitors, resistors, inductors, and antennas or electrically conductive wires to electrically connect electronic devices. The printable electronic component can also include electronic devices such as control circuitry or an integrated circuit controller chiplet electrically connected to the connection posts and the device electrical contacts. The integrated circuit controller chiplet can control other electronic devices such as one or more LEDs.

A printable electronic component, for example including light-emitting electronic devices such as LEDs or LED lasers, can be provided on a display substrate having a plurality of contact pads. Contact pads are electrical conductors designed for making electrical contacts to an external electrical device such as the printable electronic component and can be a designated portion of an electrical conductor or a special structure electrically connected to an electrical conductor. Each connection post of the printable electronic components can be in electrical contact with a contact pad or electrical conductor on the display substrate so that the post side is adjacent to the display substrate.

An LED display can include a display substrate with an array of row conductors formed on or over the display substrate, the row conductors extending in a row direction. The display substrate also includes an array of column conductors formed on or over the display substrate, the column conductors electrically isolated from the row conductors and extending in a column direction different from the row direction to form an array of intersections. In an embodiment, the row and column conductors are formed at least partially in different electrically isolated layers. Each printable electronic component of a plurality of printable electronic components has at least a row connection post and a column connection post. The row connection post of each of the printable electronic components is in electrical contact with a row conductor and the column connection post of each of the printable electronic components is in electrical contact with a column conductor to provide a micro-transfer printable electronic component electrically connected between the row and column conductors of each intersection of the array of intersections.

In an alternative embodiment, the row conductors are formed in row segments between the column conductors in the same layer on the display substrate as the column conductors. A jumper electrically connects the row segments in a common row on opposite sides of a column conductor. The jumper has two or more electrically connected electrically conductive connection posts and a connection post is electrically connected to a row segment on each side of the column conductor to electrically connect the two row segments in the common row. In an embodiment, the row conductors include a portion that is substantially parallel to the column conductor, the portion providing space for another printable electronic component electrically connected between the row and column conductors.

In an alternative or additional embodiment, the connection posts are first connection posts and the printable electronic components comprise one or more electrically conductive additional connection posts that protrude beyond the post side. Each additional connection post is electrically connected with an electrical conductor to a first connection post or to an additional connection post. Each printable electronic component electrically connects the row segments in a common row on each side of a column conductor with a first connection post and an additional connection post or with two additional connection posts to electrically connect the two row segments in the common row. In an embodiment, the printable electronic components include two or more first connection posts and an additional connection post electrically connected to one of the two first connection posts.

A method of making an LED display includes providing a display substrate having an array of row conductors and an array of column conductors formed on or over the display substrate. The column conductors are electrically isolated from the row conductors and extend in a column direction different from the direction in which the row conductors extend. A plurality of printable electronic LED components is provided. The one or more electrically conductive connection posts of each printable electronic LED component includes a row connection post and a column connection post. A plurality of printable electronic LED components from a printable electronic LED component wafer are micro-transfer printed to the display substrate, so that each row conductor is at least indirectly connected to each column conductor with one printable electronic LED component, for example through an LED or controller chiplet. The row connection post of the one printable electronic component is electrically connected to the row conductor and the column connection post of the one printable electronic LED component is electrically connected to the column conductor.

In an embodiment, the connection posts are first connection posts and the method includes providing each of the printable electronic components with one or more electrically conductive additional connection posts that protrude beyond the dielectric layer in a direction opposite to the stamp side and electrically connecting each additional connection post to a first connection post or to an additional connection post with an electrical conductor. The row conductors are formed in row segments between the column conductors in the same layer on the display substrate as the column conductors. The plurality of printable electronic components is micro-transfer printed to electrically connect the row segments in common rows on each side of a column conductor with a first connection post and an additional connection post or with two additional connection posts of a printable electronic component to electrically connect the two row segments in the common row.

A printable electronic component wafer includes a wafer comprising a wafer material, a patterned sacrificial layer forming sacrificial portions spaced apart by anchor portions formed on or in the wafer, and a plurality of printable electronic components. Each printable electronic component is formed or disposed entirely over a sacrificial portion and connected to an anchor by a tether. The sacrificial portions can comprise an etchable material other than the wafer material, the sacrificial portions can comprise an anisotropically etchable portion of the wafer material, or the sacrificial portions can comprise a gap between the printable electronic component and the wafer material.

A method of making a printable electronic component wafer includes providing a wafer comprising a wafer material, forming a patterned sacrificial layer having sacrificial portions spaced apart by anchor portions formed on or in the wafer, and providing a plurality of electronic devices, where each electronic device is disposed entirely over a sacrificial portion. In an embodiment, the electronic devices are micro-transfer printed on or over the sacrificial portions and the electronic devices can include a fractured or separated tether. In another embodiment, the electronic devices are formed on or over the sacrificial portions. One or more connection post forms can be made in each sacrificial portion and electrodes can be formed in the connection post forms to make one or more connection posts and electrically connected to the electronic devices. The sacrificial portions can be etched to form a tether connecting the electronic component to the anchor and form a gap between the electronic component and the wafer material. Thus, each electronic component is disposed entirely over a sacrificial portion.

Because the electronic components can be made using integrated circuit photolithographic techniques having a relatively high resolution and cost and the destination substrate, for example a printed circuit board, can be made using printed circuit board techniques having a relatively low resolution and cost, the contact pads on the destination substrate can be much larger than the connection posts or electrical contacts on the electronic component, facilitating the use of multiple connection posts with a common contact pads, reducing electrical faults, and reducing manufacturing costs.

In certain embodiments, the two or more adjacent connection posts comprise a first and a second connection post of different heights. In certain embodiments, the distance between two or more connection posts is less than a width or length of the electrically conductive contact pad in a direction parallel to the destination substrate. In certain embodiments, the connection posts are disposed in groups, the connection posts within a group are electrically connected to a common destination substrate contact pad and the connection posts in different groups are electrically connected to different contact pads. In certain embodiments, the connection posts are disposed in groups and a spacing between adjacent connection posts within a given group is less than a spacing between adjacent groups. In certain embodiments, the connection posts within a group are electrically shorted together. In certain embodiments, each of the two or more connection posts is a multi-layer connection post. In certain embodiments, the contact pads comprise a material that is the same material as a material included in the connection post.

In certain embodiments, the printable electronic component or electronic device has at least one of a width, length, and height from 2 to 5 μm, 5 to 10 μm, 10 to 20 μm, or 20 to 50 μm. In certain embodiments, the destination substrate is a member selected from the group consisting of polymer, plastic, resin, polyimide, PEN, PET, metal, metal foil, glass, a semiconductor, and sapphire. In certain embodiments, the destination substrate has a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm.

In certain embodiments, the two or more contact pads comprise a material that is softer than that of the connection post. In certain embodiments, the connection posts comprise a material that is softer than that of the two or more contact pads. In certain embodiments, a conductive material other than a material of the contact pad or the connection post (or both) adheres or electrically connects the contact pad to the connection post. In certain embodiments, the contact pad has a first conductive layer and a second conductive layer over the first conductive layer, and the second conductive layer has a lower melting temperature than the first conductive layer. The backplane contact pad can be coated with a non-conductive layer, or the backplane contact pad can be formed on a compliant non-conductive layer. In certain embodiments, the second conductive layer is a solder. In certain embodiments, the contact pad is welded to the connection post. In certain embodiments, the contact pads are non-planar and the connection posts are inserted into the contact pads.

In another aspect, the disclosed technology includes a method of making a printable electronic component, including: providing a forming substrate having two or more forms in a surface of the substrate; disposing a patterned layer of conductive material at least in the forms to make connection posts; disposing a first dielectric layer over the patterned layer of conductive material and the forming substrate; disposing or forming one or more electronic devices having device electrical contacts on the first dielectric layer; forming electrical conductors electrically connecting the connection posts to the device electrical contacts; and defining the printable electronic component, for example by etching, to form a release layer and anchors in the forming substrate connected by tethers to the printable electronic component.

In certain embodiments, the method includes providing a destination substrate having two or more contact pads and micro transfer printing the printable electronic component to the destination substrate so that each connection post is in contact with, extends into, or extends through a backplane contact pad of the destination substrate to electrically connect the contact pads to the connection posts and the device electrical contacts.

In certain embodiments, the method includes disposing a patterned second dielectric layer over the first dielectric layer, the conductors, and the printable electronic component.

In another aspect, the disclosed technology includes a printable electronic component, including: a first dielectric layer having connection posts protruding from the dielectric layer; electronic devices optionally having a semiconductor substrate and device electrical contacts, the electronic devices disposed or formed on the first dielectric layer; and electrical conductors electrically connecting the connection posts to the device electrical contacts.

The present invention provides structures and methods that enable the construction of light-emitting components that are transfer printed on a destination substrate. The electrical interconnection process is simple and inexpensive requiring fewer process steps than known alternative methods.

In one aspect, the disclosed technology includes a micro-transfer printable electronic component, including: a dielectric layer; a plurality of electronic devices disposed in contact with the dielectric layer, each electronic device having an individual substrate and device electrical contacts for providing electrical power to the electronic device, the electronic device having a post side and an opposing stamp side; a plurality of electrical conductors, at least one electrical conductor electrically connected to each of the device electrical contacts; and one or more electrically conductive connection posts that protrude from the dielectric layer in a direction opposite to the stamp side, each connection post electrically connected to at least one of the electrical conductors.

In certain embodiments, the dielectric layer is on or adjacent to the post side, wherein the dielectric layer is on or adjacent to the stamp side, or comprising one or more dielectric layers that are on both the stamp side and the post side.

In certain embodiments, the dielectric layer is transparent, the electronic devices include one or more LEDs, and the LEDs emit light through the transparent dielectric layer.

In certain embodiments, the electronic devices include one or more LEDs and the LEDs emit light in a direction opposite the transparent dielectric layer.

In certain embodiments, the device electrical contacts are on a common side of the electronic device.

In certain embodiments, the common side is the post side.

In certain embodiments, the common side is the stamp side.

In certain embodiments, the electronic devices include one or more LEDs and the LEDs emit light through the post side.

In certain embodiments, the electronic devices include one or more LEDs and the LEDs emit light through the stamp side.

In certain embodiments, the connection posts are first connection posts and comprising one or more electrically conductive additional connection posts that protrude beyond the post side, each additional connection post electrically connected with an electrical conductor to a first connection post or an additional connection post.

In certain embodiments, the micro-transfer printable electronic component includes a tether or a fractured, broken, or separated tether, or wherein one or more of the electronic devices includes a fractured, broken, or separated tether.

In certain embodiments, the electronic devices include a circuit controller electrically connected to at least one connection post and to at least one device electrical contact.

In certain embodiments, the micro-transfer printable electronic component includes a display substrate having a plurality of contact pads or electrical conductors, wherein at least one connection post is in electrical contact with at least one contact pad or at least one electrical conductor.

In certain embodiments, the micro-transfer printable electronic component includes an adhesive that adheres the printable electronic component to the display substrate.

In certain embodiments, the adhesive includes an electrically conductive solder.

In certain embodiments, the electronic devices are one or more of an integrated circuit, an opto-electronic device, an acoustic wave device, transistors, capacitors, resistors, inductors, photo-diodes, photo-transistors, light-emitting diodes, and antennas.

In certain embodiments, one or more of the electronic devices is a passive circuit providing an electrical connection between two or more of the electrically conductive connection posts.

In certain embodiments, the one or more of the electronic devices is an active circuit including one or more transistors, diodes, or light-emitting diodes.

In certain embodiments, the electronic component is an LED component having one or more LED electronic devices and an optional circuit controller and the device electrical contacts include LED electrical contacts.

In certain embodiments, the connection posts comprise an electrically conductive layer formed over a core of a different material.

In certain embodiments, the core material is one or more of a dielectric, silicon dioxide, and silicon nitride.

In certain embodiments, the connection posts extend or electrically contact an electrical conductor through a via in a dielectric layer.

In certain embodiments, the electronic component is unpackaged and the electronic devices include one or more bare dies.

In certain embodiments, the electronic device has at least one of a width, length, and height from 2 to 5 µm, 5 to 10 µm, 10 to 20 µm, 20 to 50 µm, 50 to 100 µm, 100 to 250 µm, and 250 to 500 µm.

In certain embodiments, an LED display includes a display substrate; an array of row conductors formed on or over the display substrate, the row conductors extending in a row direction; an array of column conductors formed on or over the display substrate, the column conductors electrically isolated from the row conductors and extending in a column direction different from the row direction, the rows and column conductors formed at least partially in different electrically isolated layers; and a plurality of the micro-transfer printable electronic components, wherein the printable electronic components are micro-transfer printable LED components having one or more LED electronic devices and an optional circuit controller, each micro-transfer printable LED component having at least a row connection post and a column connection post, wherein the row connection post of each of the printable LED components is in electrical contact with a row conductor and the column connection post of each of the printable LED components is in electrical contact with a column conductor to provide a printable LED component electrically connected between each row and column conductor of the arrays of row and column conductors.

In certain embodiments, the row conductors are formed in row segments between the column conductors in the same layer on the display substrate as the column conductors and comprising a jumper electrically connecting the row segments in a common row on opposite sides of a column conductor, the jumper having two or more electrically connected electrically conductive jumper connection posts, and a jumper connection post electrically connected to a row segment on each side of the column conductor to electrically connect the two row segments in the common row.

In certain embodiments, the row conductors are formed in row segments between the column conductors in the same layer on the display substrate as the column conductors; the connection posts are first connection posts; wherein the printable LED components comprise one or more electrically conductive additional connection posts that protrude beyond the post side, each additional connection post electrically connected with an electrical conductor to a first connection post or to an additional connection post; and each printable LED component electrically connects the row segments of a common row conductor on each side of a column conductor with a first connection post and an additional connection post or with two additional connection posts to electrically connect the two row segments of the common row conductor.

In certain embodiments, the printable LED components include two first connection posts and an additional connection post electrically connected to one of the two first connection posts.

In certain embodiments, the row conductors include a portion that is substantially parallel to the column conductor, the portion providing a space for another printable LED component electrically connected between the row and column conductors.

In another aspect, the disclosed technology includes a method of making an LED display, including: providing a display substrate having an array of row conductors formed on or over the display substrate, the row conductors extending in a row direction, an array of column conductors formed on or over the display substrate, the column conductors electrically isolated from the row conductors and extending in a column direction different from the row direction; providing a printable electronic component wafer having a plurality of the micro-transfer printable electronic components described above, wherein the printable electronic components are micro-transfer printable LED components having one or more LED electronic devices and an optional circuit controller, and the one or more electrically conductive connection posts of each printable LED component includes a row connection post and a column connection post; micro-transfer printing a plurality of micro-transfer printable LED components from the printable electronic component wafer to the display substrate, so that each row conductor is connected to each column conductor with one micro-transfer printable LED component, the row connection post electrically connected to the row conductor and the column connection post electrically connected to the column conductor of the one micro-transfer printable LED component.

In certain embodiments, the connection posts are first connection posts; providing one or more electrically conductive additional connection posts that protrude beyond the post side of each of the printable LED components comprises: electrically connecting each additional connection post with an electrical conductor to a first connection post or to an additional connection post; forming the row conductors in row segments between the column conductors in the same layer on the display substrate as the column conductors; and micro-transfer printing the plurality of micro-transfer printable LED components to electrically connect the row segments of common row conductors on each side of a column conductor with a first connection post and an additional connection post or with two additional connection posts of a micro-transfer printable LED component to electrically connect the two row segments of the common row conductor.

In another aspect, the disclosed technology includes a micro-transfer printable electronic component wafer, including: a wafer comprising a wafer material; a patterned sacrificial layer forming sacrificial portions spaced apart by anchor portions formed on or in the wafer; a plurality of the micro-transfer printable electronic components described above, each micro-transfer printable electronic component formed entirely over a sacrificial portion and connected to an anchor by a tether.

In certain embodiments, the sacrificial portions comprise an etchable material other than the wafer material, the sacrificial portions comprise an anisotropically etchable portion of the wafer material, or the sacrificial portions comprise a gap between the printable electronic component and the wafer material.

In another aspect, the disclosed technology includes a method of making a micro-transfer printable electronic component wafer, comprising: providing a wafer comprising a wafer material; forming a patterned sacrificial layer having sacrificial portions spaced apart by anchor portions formed on or in the wafer; providing a plurality of the electronic components described above, each electronic component disposed entirely over a sacrificial portion.

In certain embodiments, the method includes micro-transfer printing one or more electronic devices on or over the sacrificial portions.

In certain embodiments, the method includes making one or more connection post forms in each sacrificial portion.

In certain embodiments, the method includes forming electrodes in the connection post forms to make one or more connection posts, the electrodes electrically connected to the electronic device.

In certain embodiments, the method includes etching the sacrificial portions to form a tether connecting the electronic component to the anchor and forming a gap between the electronic component and the wafer material.

In another aspect of the present invention, a micro-printed display comprises a display substrate, an array of electrically conductive patterned row conductors formed on or over the display substrate, the row conductors extending in a row direction, an array of electrically conductive patterned column conductors formed on or over the display substrate, the column conductors electrically isolated from the row conductors and extending in a column direction different from the row direction, a plurality of micro-pixels disposed over or on the display substrate, each micro-pixel uniquely electrically connected to a row conductor and a column conductor, and wherein each micro-pixel comprises: a pixel substrate separate, independent and distinct from the display substrate and the pixel substrate of any other micro-pixel, the pixel substrate having electrically conductive patterned pixel conductors provided thereon, and one or more micro-light-emitting diodes (micro-LEDs) disposed on or over the pixel substrate, each micro-LED having an LED substrate separate, independent and distinct from any other LED substrate, the display substrate, and any pixel substrate, and each of the one or more micro-LEDs electrically connected to one or more of the pixel conductors.

In certain embodiments, the one or more micro-LEDs each have connection posts that are electrically connected to the pixel conductors on the pixel substrate. The micro-pixels can each comprise a pixel controller disposed on or over the pixel substrate and having a controller substrate separate, independent and distinct from the display substrate, any pixel substrate, any micro-LED substrate, and any other controller substrate and wherein the pixel controller includes a control circuit that is electrically connected to and controls the one or more micro-LEDs of the micro-pixel. The pixel controller can have connection posts that are electrically connected to the pixel conductors on the pixel substrate.

In some embodiments, each pixel substrate has a connection post that forms at least a part of the electrical connection to the row conductor and a connection post that forms at least a part of the electrical connection to the column conductor.

In an embodiment, each pixel substrate comprises a redundant micro-LED corresponding to each micro-LED electrically connected in parallel or serial with the corresponding micro-LED. In another embodiment, the pixel substrate comprises a replacement LED location for each of the one or more micro-LEDs, the replacement micro-LED location electrically connected to one or more of the pixel conductors in parallel with the corresponding micro-LED.

In certain embodiments, the micro-printed display comprises a redundant micro-pixel corresponding to each micro-pixel disposed over or on the display substrate and electrically connected in parallel with the corresponding micro-pixel. In other embodiments, the micro-printed display comprises a replacement micro-pixel location for each of the micro-pixels, the replacement micro-pixel location electrically connected to a row conductor and a column conductor in parallel with the corresponding micro-pixel.

In some aspects of the present invention, the row and column conductors of the micro-printed display have a width that is greater than the width of the pixel conductor and the row and column conductors have a lower resolution than the pixel conductors.

The micro-printed display can comprise a plurality of row controllers disposed over or on the display substrate and electrically connected to the row conductors. The row controllers can be serially connected in a daisy chain. The micro-printed display can comprise a redundant row controller corresponding to each row controller disposed over or on the display substrate and electrically connected in parallel with the corresponding row controller. The micro-printed display can comprise a replacement row-controller location for each of the row controllers, the replacement row-controller location electrically connected in parallel with the corresponding row controller.

The micro-printed display can comprise a plurality of column controllers disposed over or on the display substrate and electrically connected to the column conductors. The column controllers can be serially connected in a daisy chain. The micro-printed display can comprise a redundant column controller corresponding to each column controller disposed over or on the display substrate and electrically connected in parallel with the corresponding column controller. The micro-printed display can comprise a replacement column-controller location for each of the column controllers, the replacement column-controller location electrically connected in parallel with the corresponding column controller.

In some embodiments, row conductors have row segments disposed between the column conductors and the micro-pixels comprise an electrical connection between adjacent row segments on opposite sides of the column conductors. Alternatively, column conductors have column segments disposed between the row conductors and the micro-pixels comprise an electrical connection between adjacent column segments on opposite sides of the row conductors.

In other embodiments, row conductors have row segments disposed between the column conductors and jumpers form an electrical connection between adjacent row segments on opposite sides of the column conductors. Alternatively, column conductors have column segments disposed between the row conductors and jumpers form an electrical connection between adjacent column segments on opposite sides of the row conductors. The jumper can be a portion of the micro-pixel. Alternatively, the jumper has a substrate separate, independent, and distinct from the micro-pixel.

In various embodiments, the micro-LEDs, the pixel controller, or the micro-pixel comprises a broken, fractured, or separated tether.

Embodiments of the present invention provide a method and structures for disposing small (e.g., microscopic) crystalline integrated circuits over a relatively large substrate (e.g., centimeters to meters in diagonal measurement) to provide high-performance integrated or opto-electronic circuits over a large substrate area that does not require thin-film semiconductor structures and materials. Other embodiments provide a micro-transfer printed display with micro-pixels, row controllers, and column controllers that does not require conventional photolithography to electrically connect the micro-pixels, row controllers, and column controllers. Micro-pixel redundant and replacement structures enable display high yields.

In another aspect, the disclosed technology includes a micro-printed display, including: a display substrate; an array of electrically conductive patterned row conductors formed on or over the display substrate, the row conductors extending in a row direction; an array of electrically conductive patterned column conductors formed on or over the display substrate, the column conductors electrically isolated from the row conductors and extending in a column direction different from the row direction; and a plurality of micro-pixels disposed over or on the display substrate, each micro-pixel uniquely electrically connected to a row conductor and a column conductor and wherein each micro-pixel includes: (i) a pixel substrate separate, independent and distinct from the display substrate and the pixel substrate of any other micro-pixel, the pixel substrate having electrically conductive patterned pixel conductors provided thereon; and (ii) one or more micro-light-emitting diodes (micro-LEDs) disposed on or over the pixel substrate, each micro-LED having an LED substrate separate, independent and distinct from any other LED substrate, the display substrate, and any pixel substrate, and each of the one or more micro-LEDs electrically connected to one or more of the pixel conductors.

In certain embodiments, the one or more micro-LEDs each have connection posts that are electrically connected to the pixel conductors on the pixel substrate.

In certain embodiments, the micro-pixels each comprise a pixel controller disposed on or over the pixel substrate and having a controller substrate separate, independent and distinct from the display substrate, any pixel substrate, any micro-LED substrate, and any other controller substrate and wherein the pixel controller includes a control circuit that is electrically connected to and controls the one or more micro-LEDs of the micro-pixel.

In certain embodiments, the pixel controller has connection posts that are electrically connected to the pixel conductors on the pixel substrate.

In certain embodiments, each pixel substrate has a connection post that forms at least a part of the electrical connection to the row conductor and a connection post that forms at least a part of the electrical connection to the column conductor.

In certain embodiments, each pixel substrate comprises a redundant micro-LED corresponding to each micro-LED electrically connected in parallel or serial with the corresponding micro-LED.

In certain embodiments, each pixel substrate comprises a replacement LED location for each of the one or more micro-LEDs, the replacement micro-LED location electrically connected to one or more of the pixel conductors in parallel with the corresponding micro-LED.

In certain embodiments, the display includes a redundant micro-pixel corresponding to each micro-pixel disposed over or on the display substrate and electrically connected in parallel with the corresponding micro-pixel.

In certain embodiments, the display includes a replacement micro-pixel location for each of the micro-pixels, the replacement micro-pixel location electrically connected to a row conductor and a column conductor in parallel with the corresponding micro-pixel.

In certain embodiments, the row and column conductors have a width that is greater than the width of the pixel conductor and the row and column conductors have a lower resolution than the pixel conductors.

In certain embodiments, the display includes a plurality of row controllers disposed over or on the display substrate and electrically connected to the row conductors.

In certain embodiments, the row controllers are serially connected in a daisy chain.

In certain embodiments, the display includes a redundant row controller corresponding to each row controller disposed over or on the display substrate and electrically connected in parallel with the corresponding row controller.

In certain embodiments, the display includes a replacement row-controller location for each of the row controllers, the replacement row-controller location electrically connected in parallel with the corresponding row controller.

In certain embodiments, the display includes a plurality of column controllers disposed over or on the display substrate and electrically connected to the column conductors.

In certain embodiments, the column controllers are serially connected in a daisy chain.

In certain embodiments, the display includes a redundant column controller corresponding to each column controller disposed over or on the display substrate and electrically connected in parallel with the corresponding column controller.

In certain embodiments, the display includes a replacement column-controller location for each of the column controllers, the replacement column-controller location electrically connected in parallel with the corresponding column controller.

In certain embodiments, row conductors have row segments disposed between the column conductors and the micro-pixels comprise an electrical connection between adjacent row segments on opposite sides of the column conductors or wherein column conductors have column segments disposed between the row conductors and the micro-pixels comprise an electrical connection between adjacent column segments on opposite sides of the row conductors.

In certain embodiments, row conductors have row segments disposed between the column conductors and comprising jumpers that form an electrical connection between adjacent row segments on opposite sides of the column conductors or wherein column conductors have column segments disposed between the row conductors and comprising jumpers that form an electrical connection between adjacent column segments on opposite sides of the row conductors.

In certain embodiments, the jumper is a portion of the micro-pixel.

In certain embodiments, the jumper has a substrate separate, independent, and distinct from the micro-pixel.

In certain embodiments, the micro-LEDs or the micro-pixel comprises a broken, fractured, or separated tether.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIGS. 14-15 are flow charts illustrating methods of the present invention;

Figure 1:
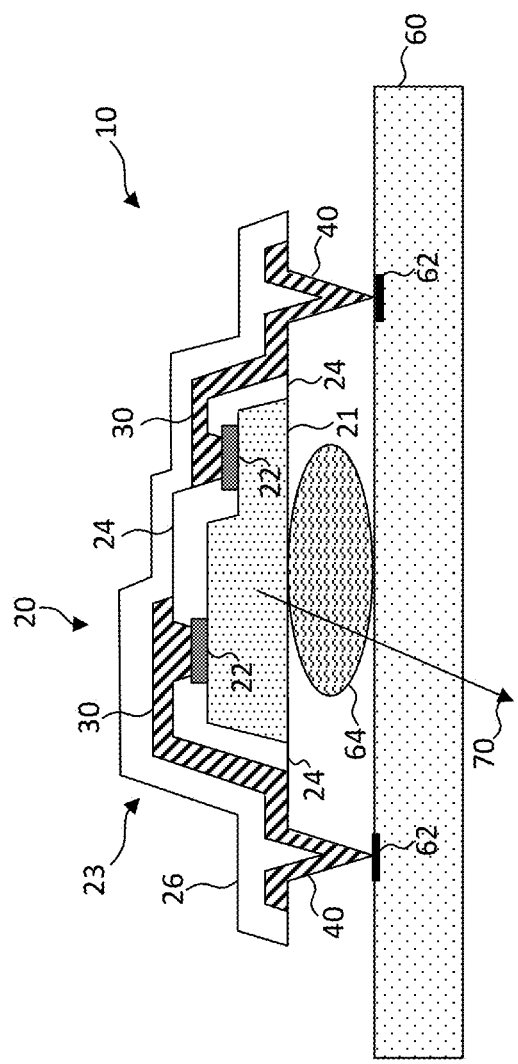
FIGS. 1-5 are cross sections of alternative embodiments of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF THE INVENTION

The present invention provides structures and methods for electrically connecting relatively small electronic devices such as integrated circuit chiplets or light-emitting diodes (LEDs) to a relatively large destination substrate in an efficient and cost-effective way and with fewer processing steps. Each micro-transfer printable electronic component can include a single integrated circuit, for example a digital circuit, an LED, a photo-diode, or a photo-transistor. Alternatively, the micro-transfer printable electronic component can include a circuit having multiple integrated circuits or other electronic or opto-electronic elements as well as electrically conductive wires interconnecting the multiple electronic elements to form a circuit on a component substrate. An electronic component can receive or provide electronic signals, but can also include electronic devices that have other modalities, such as optical elements, magnetic elements, electrical field elements, emission elements, or sensing elements. For clarity and simplicity, some of the Figures illustrate an LED as an electronic device of the electronic component, but the invention is not limited to an LED embodiment and, generally, the LED in the Figures can represent any electronic device. In embodiments of the present invention, the micro-transfer printable electronic components are micro-assembled micro-pixels that are disposed over a display substrate to make a micro-transfer printed display. The micro-pixels can include micro-transfer printed opto-electronic components and devices such as micro-LEDs and pixel controllers.

Figure 2:
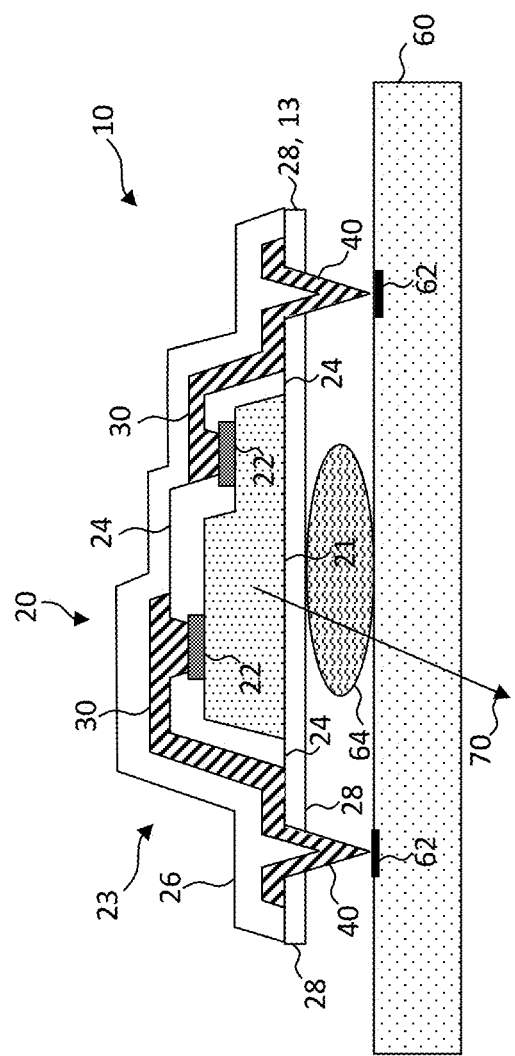

Referring to the cross sections of FIGS. 1 and 2, in an embodiment of the present invention, a printable electronic component 10 includes one or more electronic devices (e.g., LEDs) 20 disposed in contact with a dielectric layer (26 in FIG. 1, 24 in FIG. 2), each electronic device having an individual substrate and device electrical contacts 22 for providing electrical power to the electronic device 20. The electronic device 20 has a post side 21 that can be a surface and an opposing stamp side 23 that can also be a surface. A plurality of electrical conductors 30 (electrodes) are included in the printable electronic component 10 and at least one electrical conductor 30 is electrically connected to each of the device electrical contacts 22.

Figure 18:
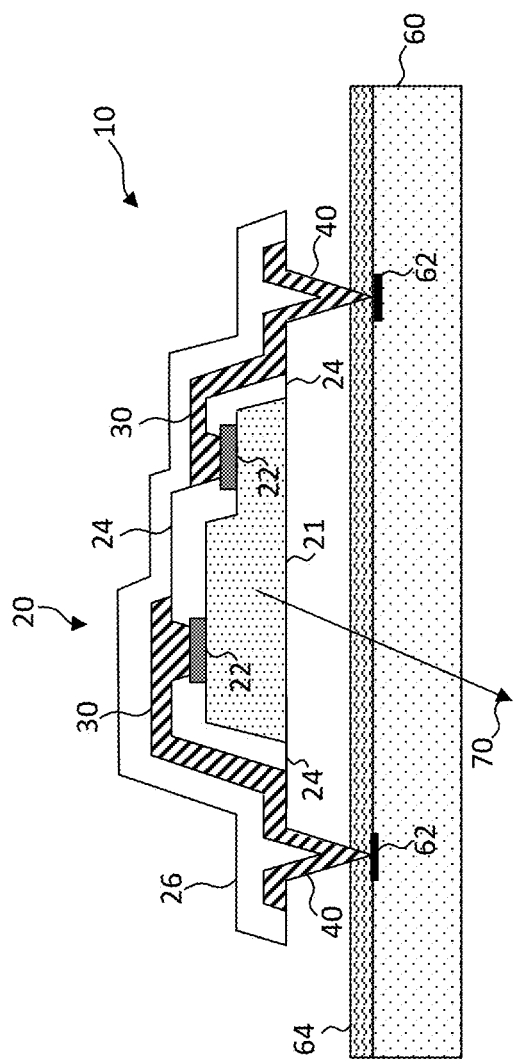
FIGS. 18 and 19 are cross sections of alternative embodiments of the present invention with a display substrate.

One or more electrically conductive connection posts 40 protrude from the dielectric layer 26 or 24 (FIGS. 1, 2) in a direction opposite to the stamp side 23 of the electronic device 20 (i.e., in the direction of the post side 21). Each connection post 40 is electrically connected to at least one of the electrical conductors 30. Each connection post 40 can be an electrical conductor 30 or can include an electrical conductor 30. In another arrangement, the electrical conductor 30 includes the connection post 40 or is electrically connected to the connection post 40. In an embodiment, each device electrical contact 22 is electrically connected to a connection post 40. An adhesive 64 can adhere the printable LED component 10 to a destination substrate 60 and the connection posts 40 can be in physical and electrical contact with contact pads 62 on the destination substrate 60. The adhesive 64 can be deposited in drops, for example as shown in FIG. 1, with an inkjet deposition device or as a layer over the destination substrate 60 (FIG. 18).

In various embodiments, an electronic device 20 is an inorganic micro-light-emitting diode (LED) 20 including semiconductor or compound semiconductor LED material such as GaN and can emit any of a variety of different colored lights. The semiconductor or compound semiconductor LED material can be crystalline or partially crystalline. An LED 20 can include multiple layers of different materials, for example conductive layers, emission layers, doped layers, or undoped layers that enable the LED 20 to emit light when provided with electrical power through the device electrical contacts 22. The LED 20 can be made using integrated circuit processes, tools, and materials. In other embodiments, the electronic device 20 is a CMOS integrated circuit made in a silicon semiconductor or is a circuit comprising multiple integrated circuits or electronic elements and can include conductive wires electrically connecting the electronic elements.

The device electrical contacts 22 can be designated portions of the electronic device material or can be electrical contact pads in contact with designated portions of the electronic device material. For example, the device electrical contacts 22 can be a metal, such as aluminum, silver, gold, tantalum, tungsten, titanium, or tin, or a metal alloy. The device electrical contacts 22 can be located on a common side of the electronic device 20 and light 70 can be emitted from a light-emitting electronic device (e.g., LED) 20 in a direction opposite the common side on which the device electrical contacts 22 are formed, as shown in FIG. 1. In an embodiment, the common side on which the device electrical contacts 22 are located is the stamp side 23 opposite the post side 21, as shown in FIG. 1, and in another embodiment the common side on which the device electrical contacts 22 are located is the post side 21 (not shown). The stamp side 23 is adapted for adhesion to a stamp, such as a PDMS stamp, or a stamp pillar, and can be contacted by the stamp to micro-transfer print the electronic component 10. In an embodiment, the electrical device 20 includes a bare die and the stamp side 23 of the electronic component 10 is exposed to the environment and is not enclosed in a package. In contrast, most integrated circuits are packaged in plastic or ceramic containers and the IC die is not exposed to the environment. As shown in FIG. 1, the electronic component 10 is unpackaged and exposed to the environment, since the encapsulation layer 26 is a part of the electronic component 10, and the electronic device 20 is a bare die and is also not packaged. The device electrical contacts 22 can be formed using photolithographic methods known in the integrated circuit arts. The electrical contacts 22 can be electrically connected to a power source to provide electrical power to the LED 20 to cause the LED 20 to emit light 70.

The electrical conductors 30 can be a metal, such as aluminum, silver, gold, tantalum, tungsten, titanium, or tin, or a metal alloy and can be patterned to form electrodes or electrical traces that conduct electricity to the device electrical contacts 22. The electrical conductors 30 can be deposited and patterned using photolithographic methods known in the integrated circuit arts, for example, using sputtering or evaporation with patterned etching. Patterned dielectric structures 24 can be formed before the electrical conductors 30 are deposited and patterned to electrically insulate portions of the electronic device 20 and control the flow of electrical current through the electronic device 20. The patterned dielectric structures 24 can be, for example, silicon dioxide, silicon nitride, or other insulators that can be patterned using photolithographic methods.

The electrically conductive connection posts 40 that protrude from the dielectric layer 28, 26 can be, but are not necessarily, the same material and can be, but are not necessarily, made in a common step with the electrical conductors 30. The electrically conductive connection posts 40 can be a spike with a sharp point. In one embodiment, the connection posts 40 are a portion of the electrical conductors 30. The connection posts 40 protrude and extend beyond the dielectric layer 24, 26 of the electronic device 20, for example, in a direction orthogonal to a surface of the post side 21 and away from the stamp side 23, so that if the printable electronic component 10 is pressed against a surface, such as a destination substrate 60, with the post side 21 adjacent to the destination substrate 60, the connection posts 40 will contact the surface of the destination substrate 60 before the electronic device 20. If the printable electronic component 10 is forcefully pressed against the surface, the connection posts 40 can be in contact with, embedded in, or pierce the surface. For example, if the surface includes electrical contact pads 62 on the destination substrate 60 (or other substrate), the connection posts 40 can form a mechanically robust electrical connection between the electrical conductors 30 and the destination substrate electrical contact pads 62.

The electrical conductors 30 can provide rigidity and mechanical strength to the printable electronic component 10 so that the printable electronic component 10 can be micro-transfer printed and the connection posts 40 pressed into an electrical contact pad 62 on a destination substrate 60 to form a robust electrical connection without harming the electronic device 20 or the electrical conductors 30 or causing them to cease proper function. In a further embodiment, the encapsulation layer 26 provides environmental protection and additional mechanical strength to the printable electronic component 10 as well as forming a core structure for the connection posts 40. The encapsulation layer 26 can be a dielectric layer and can be formed using dielectric materials (for example, silicon nitride or silicon dioxide) that are coated over the printable electronic component 10 and then patterned using photolithographic processes, such as using a photosensitive layer (e.g., photoresist) to form a patterned mask after light exposure and then etching the photosensitive layer and one or more layers beneath the photosensitive layer. Similar methods can be used to pattern the dielectric structure 24 and electrical conductors 30.

Referring to FIG. 2 in another embodiment of the present invention, a dielectric layer 28 is disposed on, disposed under, or provided adjacent to the post side 21, as shown, and a via made in the dielectric layer 28 to enable the formation of the connection post 40. The dielectric layer 28 can be a silicon dioxide or silicon nitride layer and can act as a component substrate 13 on which electronic devices 20 can be disposed. Alternatively, or in addition, an encapsulation layer 26 is formed on a side of the electronic device 20 opposite the post side 21 or on or adjacent to the electrical conductors 30, as in FIG. 1, or any combination of these. The dielectric layer 24 or encapsulation layer 26 can form a core for the connection posts 40, for example a dielectric core. The dielectric layer 28, the dielectric structure 24, and the encapsulation layer 26 can provide additional rigidity and mechanical strength to the printable electronic component 10 and connection posts 40 and can electrically insulate elements in contact with the dielectric layer 28, for example the electronic device 20 or the electrical conductors 30, as shown. In the embodiment of FIG. 2, the connection post 40 protrudes through the dielectric layer 28. In this embodiment, therefore, the connection posts 40 comprise an electrically conductive layer (e.g., a metal layer) formed over a core of a different material (e.g., a dielectric material) that protrudes through a via in the dielectric layer 28.

Figure 19:
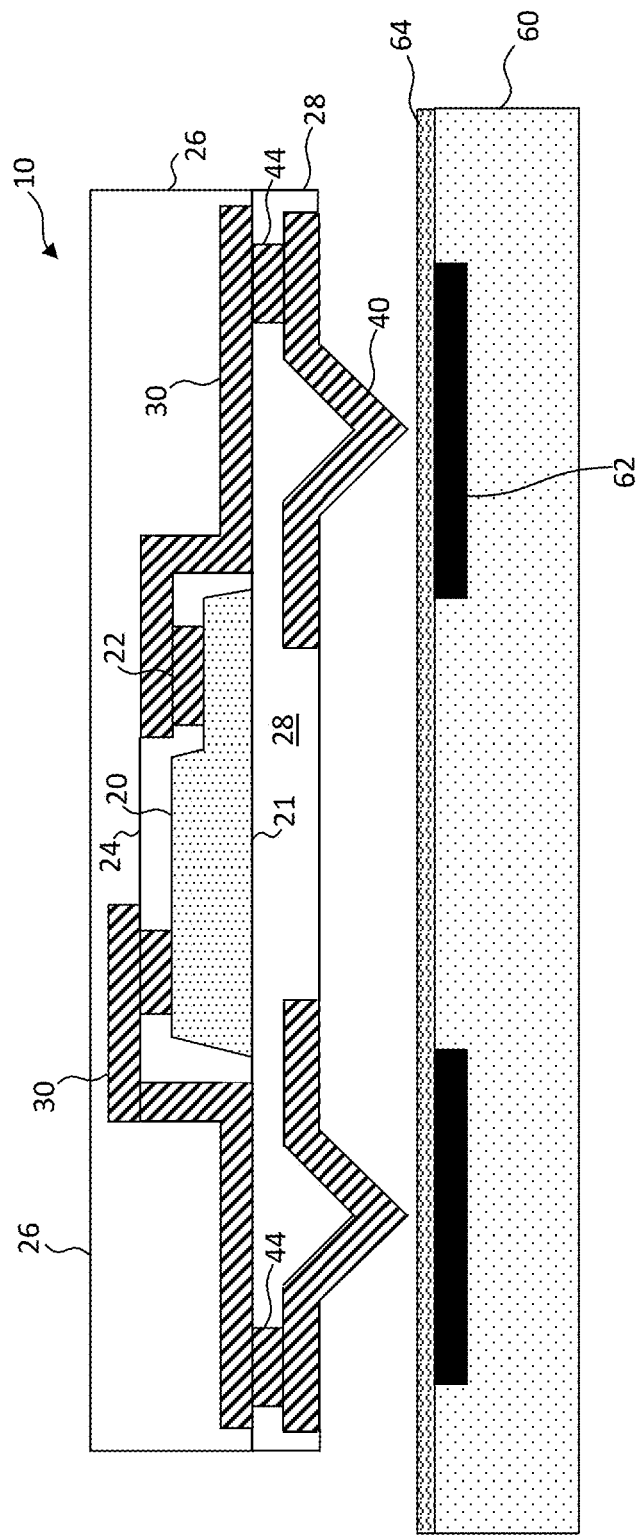

In the alternative structure of FIG. 19, the dielectric layer 28 extends over the connection post 40 except for a via 44 formed in the dielectric layer 28 and the connection post 40 is electrically connected to the electrical conductor 30 through the via 44. This structure can be constructed by forming the connection posts 44 as described below, coating the dielectric layer 28 over the connection posts 40 and sacrificial layer 52, forming the vias 44 using photolithographic processes, and then forming the electrodes 30, also using photolithographic patterning processes. The electrodes 30 extend through the via 44 to contact the connection post 40. Thus, the connection posts 40 electrically contact an electrical conductor 30 through a via 44 in a dielectric layer 28. In this embodiment, although the connection posts 40 are not formed in a common layer or surface with the post side 21, they do protrude from the dielectric layer 24 in a direction opposite the stamp side and beyond the post side 21 and have a dielectric core providing mechanical robustness to the connection post 40.

Figure 20:
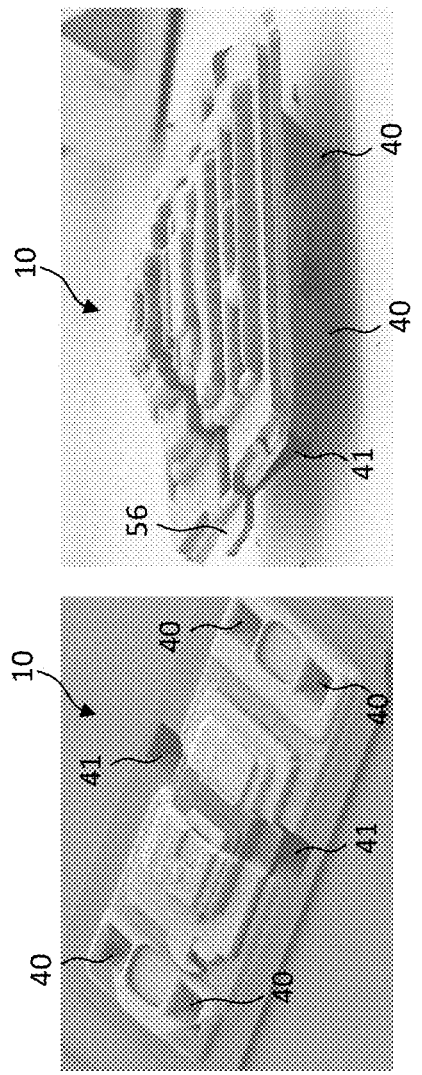
FIG. 20 is two perspective micrographs of a printable LED component according to an embodiment of the present invention.

FIG. 20 shows two micrographs of a printable electronic component 10 having an LED electronic device 20 constructed using the materials and methods described herein and corresponding to the illustration of FIG. 19. The printable electronic component 10 has 6 connection posts 40, two for each electrode located at either end of the printable electronic component 10. The two center posts 41 are not electrically connected to the electronic device 20 and serve to enhance adhesion to the optional layer of adhesive 64. The printable electronic component 10 of FIG. 20 has been micro-transfer printed successfully to a substrate and successfully tested, demonstrating light emission when provided with electrical power.

Thus, in an embodiment of the present invention, a micro-transfer printable component 10 comprises a circuit having a plurality of electronic devices 20 formed in or on a layer (e.g., encapsulation layer 26, dielectric layer 28) having a post side 21. A plurality of electrically conductive connection posts 40 protrude from the dielectric layer 26, 28. Each electrically conductive connection post 40 is electrically connected to the circuit. One or more isolated posts 41 protrude from the post side 21 of the layer. Each isolated connection post is electrically isolated from the circuit. The circuit can be a passive circuit providing an electrical connection between two or more of the electrically conductive connection posts 40. Alternatively, the circuit is an active circuit including one or more electronic devices 20 such as transistors, diodes, or light-emitting diodes.

The dielectric layer 28 can be substantially transparent to the light 70 emitted by the light-emitting electronic device (LED) 20 and the LED 20 can emit light 70 through the dielectric layer 28. In an embodiment, the LED 20 emits light 70 in the direction that the connection posts 40 protrude. In another embodiment, the LED 20 emits light 70 in a direction opposite the dielectric layer 28 or opposite the direction that the connection posts 40 protrude. By substantially transparent is meant that sufficient light 70 is transmitted to enable adequate function.

As shown in FIGS. 1 and 2, the connection posts 40 of the printable electronic component 10 are in electrical contact with electrically conductive contact pads 62 on a destination substrate 60. The contact pads 62 can be electrical conductors, or portions of electrical conductors such as wires, traces or other electrically conductive elements on the destination substrate 60. The contact pads 62 can be metal, for example aluminum, silver, tin, or copper, or a metal alloy. Thus, the contact pads 62 are in electrical contact with the electronic devices 20 and the electronic devices 20 can be controlled by a controller on the destination substrate 60 that is electrically connected to the contact pads 62. The destination substrate 60 can be a display substrate, can be a printed circuit board, or can be made of glass, polymer, metal, resin, or ceramic. In an embodiment, the destination substrate 60 is substantially transparent and light 70 emitted from the LEDs 20 is transmitted through the transparent destination substrate 60.

In the embodiments of FIGS. 1 and 2, the post side 21 is also the side through which light 70 is emitted and the side of the LED 20 adjacent to the destination substrate 60. In this embodiment, the device electrical contacts 22 are on a side of the LED 20 opposite the post side 21 and the destination substrate 60. However, other arrangements are possible in other embodiments of the present invention. For example, referring to FIG. 3, in an alternative embodiment of the present invention, the light 70 is emitted from the LED 20 in a direction opposite to the post side 21 and opposite to the destination substrate 60 and the device electrical contacts 22 of the LED 20. In this arrangement, it is not necessary that the destination substrate 60 be transparent. However, in this case a substantially planar transparent dielectric layer 28 can serve as a component substrate 13 on which the LED 20 is disposed and is arranged on a side of the LED 20 opposite the device electrical contacts 22. The electrical conductors 30 are disposed at least in part on the dielectric layer 28.

Figure 3:
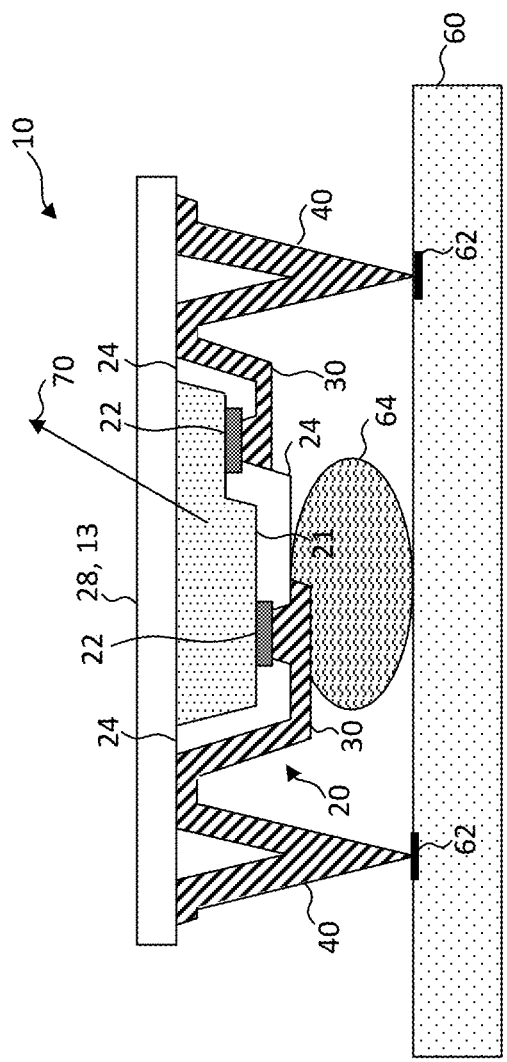

FIGS. 1-3 also illustrates the use of an adhesive 64 that adheres the printable electronic component 10 to the destination substrate 60. The adhesive 64 can be deposited in drops, for example, with an inkjet deposition device or as a layer over the destination substrate 60, and can underfill the volume between the electronic device 20 and the destination substrate 60. The adhesive 64 can also be used and emitted light 70 can pass through the adhesive 64, if present, in the configurations of FIGS. 1 and 2 (not shown). In another embodiment, the adhesive 64 is provided on the contact pads 62 on the destination substrate 60 or is a solder that reflows when exposed to heat to provide electrical conduction and adhesion.

Figure 4:
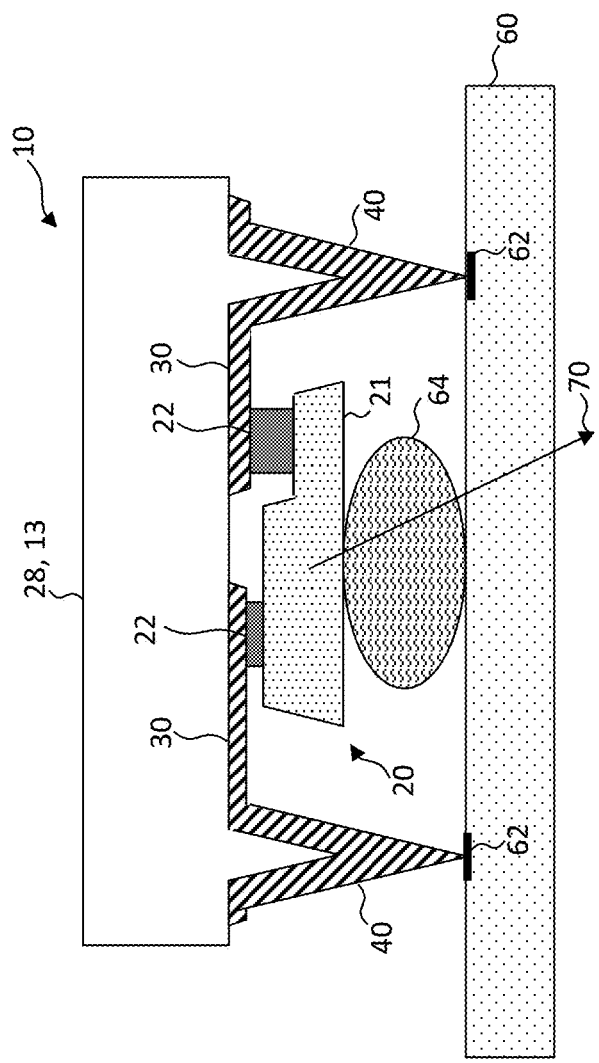

Referring to FIG. 4, in another embodiment the light 70 is emitted from the LED 20 through the post side 21 and the destination substrate 60 and on a side of the LED 20 opposite the device electrical contacts 22, as in FIGS. 1 and 2. In this case a substantially planar dielectric layer 28 can serve as a component substrate 13 on which the LED 20 is disposed. The dielectric layer 28 can have a thickness less than a thickness of the LED 20 (not shown) or greater than or equal to a thickness of the LED 20 (as shown). The device electrical contacts 22 can have different thicknesses to facilitate connecting the LED 20 to the electrical conductors 30, connection posts 40, and contact pads 62.

Figure 5:
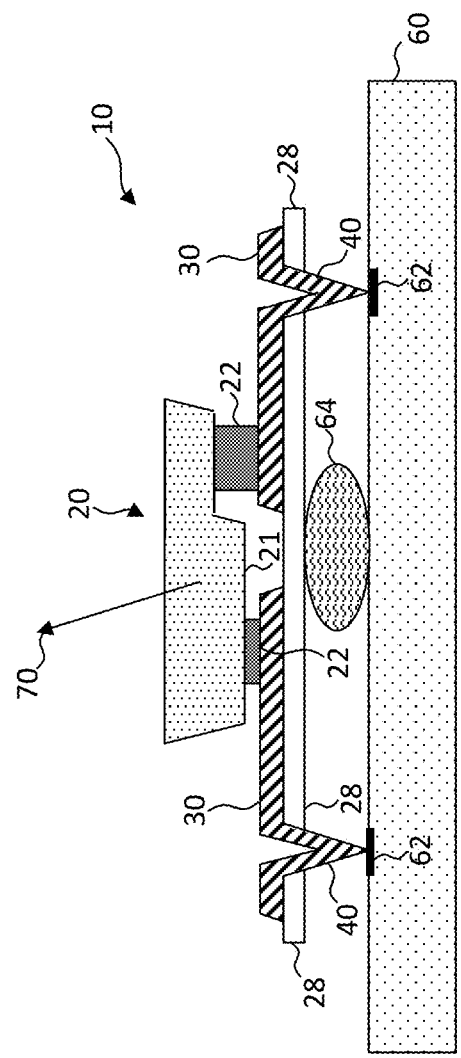

In the embodiment illustrated in FIG. 5, the light 70 is emitted through a side of the LED 20 opposite the post side 21, opposite the destination substrate 60, and opposite the device electrical contacts 22, as in FIG. 3. In this case, the substantially planar dielectric layer 28 on which the LED 20 is disposed is adjacent to the destination substrate 60 and opposite the emission side of the LED 20. As shown in this illustration, the dielectric layer 28 has a thickness less than a thickness of the LED 20. The device electrical contacts 22 can have different thicknesses to facilitate connecting the LED 20 to the electrical conductors 30, connection posts 40, and contact pads 62.

In another embodiment of the present invention, the printable electronic component 10 includes an integrated circuit controller chiplet electrically connected to at least one connection post 40 and at least one device electrical contact 22. The integrated circuit controller chiplet can control the LED 20 of the printable electronic component 10.

Figure 6:
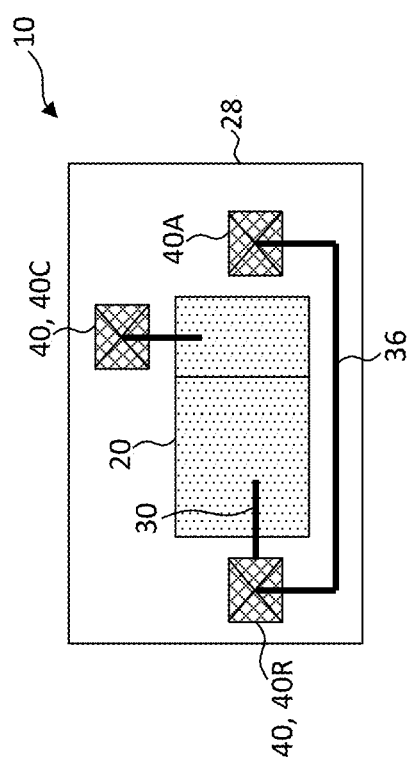
FIG. 6 is a plan view of another embodiment of the present invention having an additional connection post.

Referring to FIG. 6, in a further embodiment of the present invention, additional connection posts 40A are included in the printable electronic component 10 as well as the connection posts 40 electrically connected to the electronic devices 20 with the electrical conductors 30. As shown in FIG. 6, the connection posts 40 are first connection posts 40 and one or more electrically conductive additional connection posts 40A protrude beyond the post side 21 (not shown in the plan view of FIG. 6). Each additional connection post 40A is electrically connected with an electrical conductor 36 to a first connection post 40 or to an additional connection post 40A. The additional connection posts 40A can electrically connect other electrical conductors (e.g., row and column conductors 32, 34) and contact pads 62 on the destination substrate 60, as described below with respect to FIGS. 8 and 11. Although only one additional connection post 40A is illustrated, multiple additional connection posts 40A can be incorporated into a printable electronic component 10 of the present invention. In some embodiments, the additional connection posts 40A are electrically independent of the connection posts 40 and electronic device 20 on the printable electronic component 10, although the additional connection posts 40A and the connection posts 40 can be electrically connected through electrical connections on the destination substrate 60. In the embodiment of FIG. 6, one connection post 40 can be a row connection post 40R and another connection post 40 can be a column connection post 40C (as also indicated in FIG. 9 below).

Providing the printable electronic components 10 with additional connection posts 40A enables the electrical connection of electrical conductors (e.g., row and column conductors 32, 34) on the destination substrate 60 and therefore enables a simpler and less expensive manufacturing process for the destination substrates 60. For example, referring to FIG. 7, a destination substrate 60 is a display substrate 80 having a plurality of contact pads 62 (not shown) or electrical conductors (e.g., row and column conductors 32, 34) that provide signals to pixels in a display 82. An array of row conductors 32 extending in a row direction are formed on or over the display substrate 80. Similarly, an array of column conductors 34 extending in a column direction different from the row direction are formed on or over the display substrate 80 and are electrically isolated from the row conductors 32. The row and column conductors 32, 34 can be electrical traces or wire made of, for example, an electrically conductive metal such as aluminum, copper, silver, or tin, and can be made using printed circuit board or photolithographic techniques.

Figure 7:
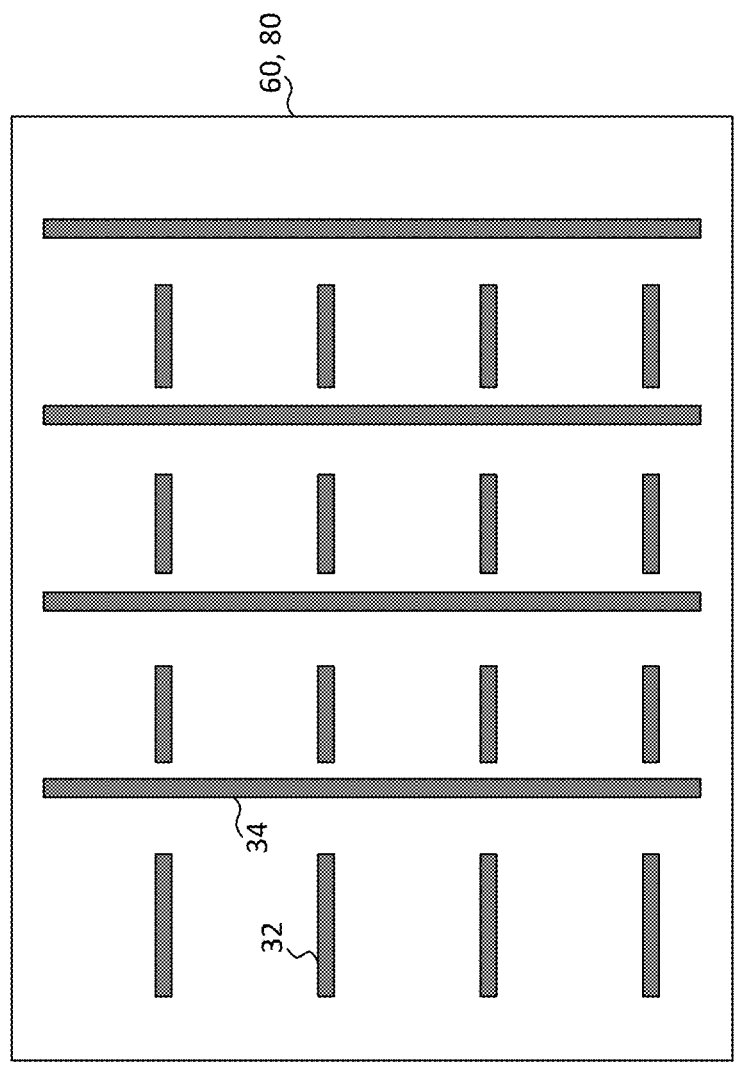
FIG. 7 is a plan view of a display substrate according to an embodiment of the present invention.

In one embodiment, the rows and column conductors 32, 34 are formed at least partially in different electrically isolated layers on the display substrate 80. In the embodiment of FIG. 7, in contrast, the row conductors 32 are formed in row segments between the column conductors 34 and in the same layer on the display substrate 80 as the column conductors 34. The row segments in a row conductor 32 are disposed in a common row. In another embodiment, the column conductors 34 are formed in column segments between the row conductors 32 and in the same layer on the display substrate 80 as the row conductors 32. The column segments in a column conductor 34 are disposed in a common column. The display substrate structure of FIG. 7 can be made with a single metal layer, reducing process steps and material costs.

Figure 8:
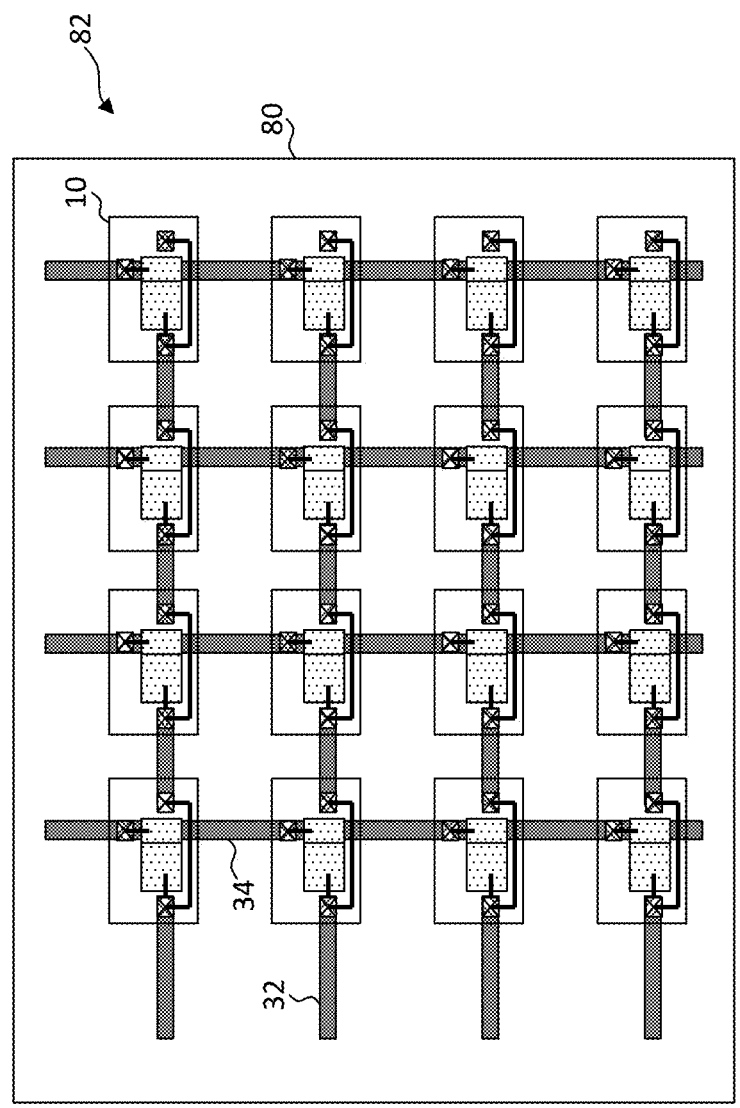
FIG. 8 is a plan view of a display according to an embodiment of the present invention using the display substrate of FIG. 7.
Figure 9:
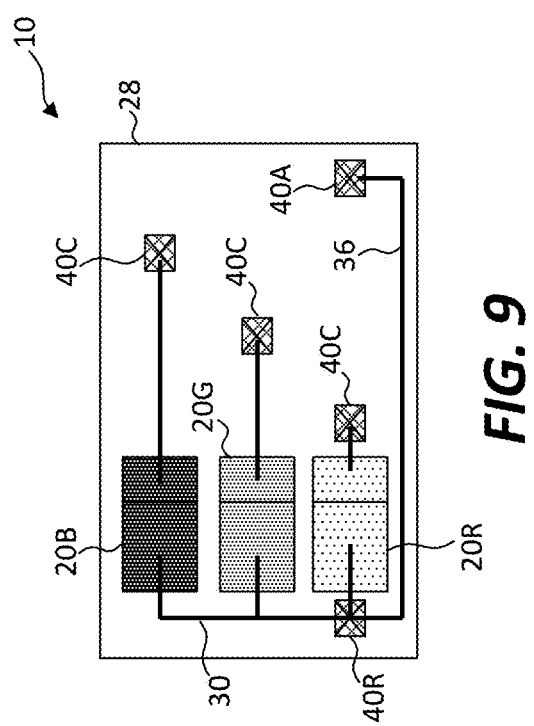
FIG. 9 is a plan view of another embodiment of the present invention having an additional connection post and a plurality of LEDs.
Figure 17:
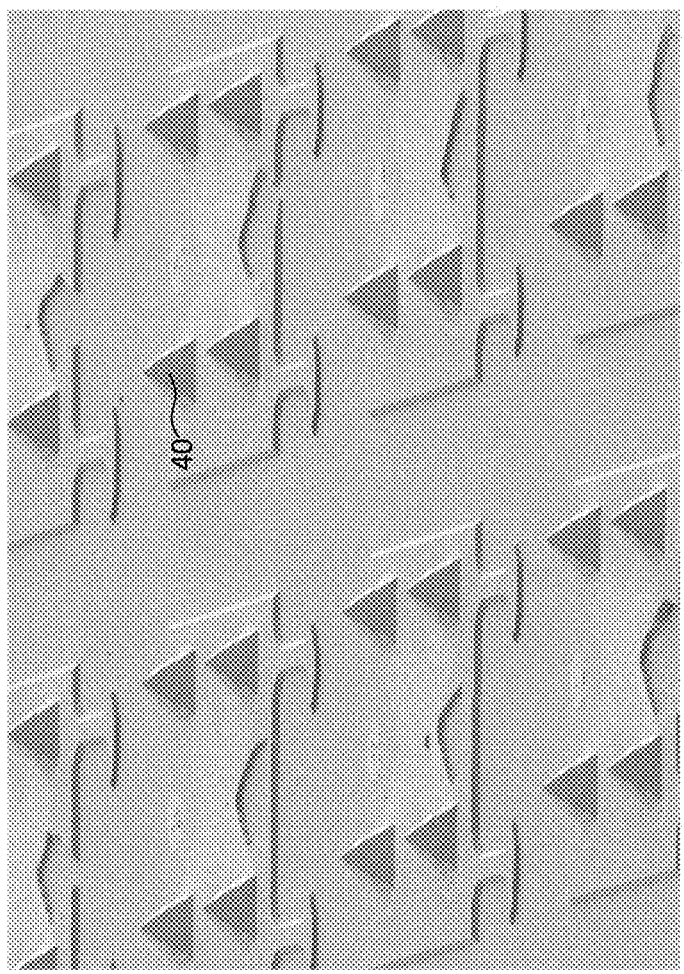
FIG. 17 is a micro-graph of connection posts in a jumper according to an embodiment of the present invention.

Referring to FIG. 8, the printable electronic components 10 of FIG. 6 are micro-transfer printed onto the display substrate 80 of FIG. 7 to form a display 82. As shown in FIG. 8, the LED 20 of the printable electronic component 10 is electrically connected between a row conductor 32 (having a row segment) and column conductor 34 through the connection posts 40. When power is applied between the row and column conductors 32, 34, for example with a passive-matrix display controller, the electronic device (e.g., LED) 20 can emit light 70. At the same time, the additional connection post 40A is connected to row segments of a common row conductor 32 on each side of a column conductor 34. The electrical conductor 36 connected to the additional connection post 40A and connection post 40 of the printable electronic component 10 thus forms an electrical jumper electrically connecting the row segments of a common row conductor 32 on opposite sides of a column conductor 34. The electrical jumper has two or more electrically connected electrically conductive jumper connection posts (e.g., an additional connection post 40A and a connection post 40 or another additional connection post 40A). The jumper connection posts of the plurality of printable electronic components 10 electrically connect the row segments of a common row conductor 32 on each side of the column conductors 34 to electrically connect the row segments of the common row conductor 32 and form an electrically continuous row conductor 32. FIG. 17 is a micro-graph of an electrical jumper having connection posts 40 according to an embodiment of the present invention.

In an alternative embodiment (not shown), the row conductors 32 are not formed of row segments in a common row but extend as a single electrical conductor across the display substrate 80 and have portions in display substrate layers separate from the column conductors 34 to avoid electrical shorts between the row and column conductors 32, 34. In this embodiment, the printable electronic component 10 does not include any additional connection posts 40A (for example as illustrated in FIG. 1). Contact pads 62 can be electrically connected through vias to conductors in the lower level (not shown).

Thus, according to an embodiment of the present invention, an LED display 82 includes a display substrate 80 with an array of row and column conductors 32, 34 formed on or over the display substrate 80 and a plurality of printable electronic components 10, each having row and column connection posts 40R, 40C. The row connection post 40R of each of the printable electronic components 10 is in electrical contact with a row conductor 32 and the column connection post 40C of each of the printable electronic components 10 is in electrical contact with a column conductor 34 to provide a printable electronic component 10 electrically connected between each row and column conductor 32, 34 of the arrays of row and column conductors 32, 34. The electronic devices (LEDs) 20 of the printable electronic components 10 form an array of light emitters in a display 82.

In a further embodiment of the present invention, referring to FIG. 9, the printable electronic component 10 includes a plurality of electronic devices (LEDs) 20 (e.g., red LED 20R emitting red light, green LED 20G emitting green light, and blue LED 20B emitting blue light, collectively LEDs 20). Each LED 20 has device electrical contacts 22 for providing electrical power to the LED 20 and a post side 21 (not shown). The printable electronic component 10 can be a full-color pixel in a display 82. Each LED 20 of the plurality of LEDs 20 has a common post side 21 (not shown) and each device electrical contact 22 is electrically connected to an electrical conductor 30. Each printable electronic component 10 has at least a row connection post 40R and a column connection post 40C. A connection post 40 can be common to two or more LEDs 20 and electrically connected to a common electrical conductor 30. In the embodiment of FIG. 9, a row connection post 40R is in common for each LED 20 and each LED 20 has a separate column connection post 40C. The row and column connection posts 40R, 40C can be connected directly to the LEDs 20 (as shown), for example in a display 82 with a passive-matrix display controller.

Figure 10:
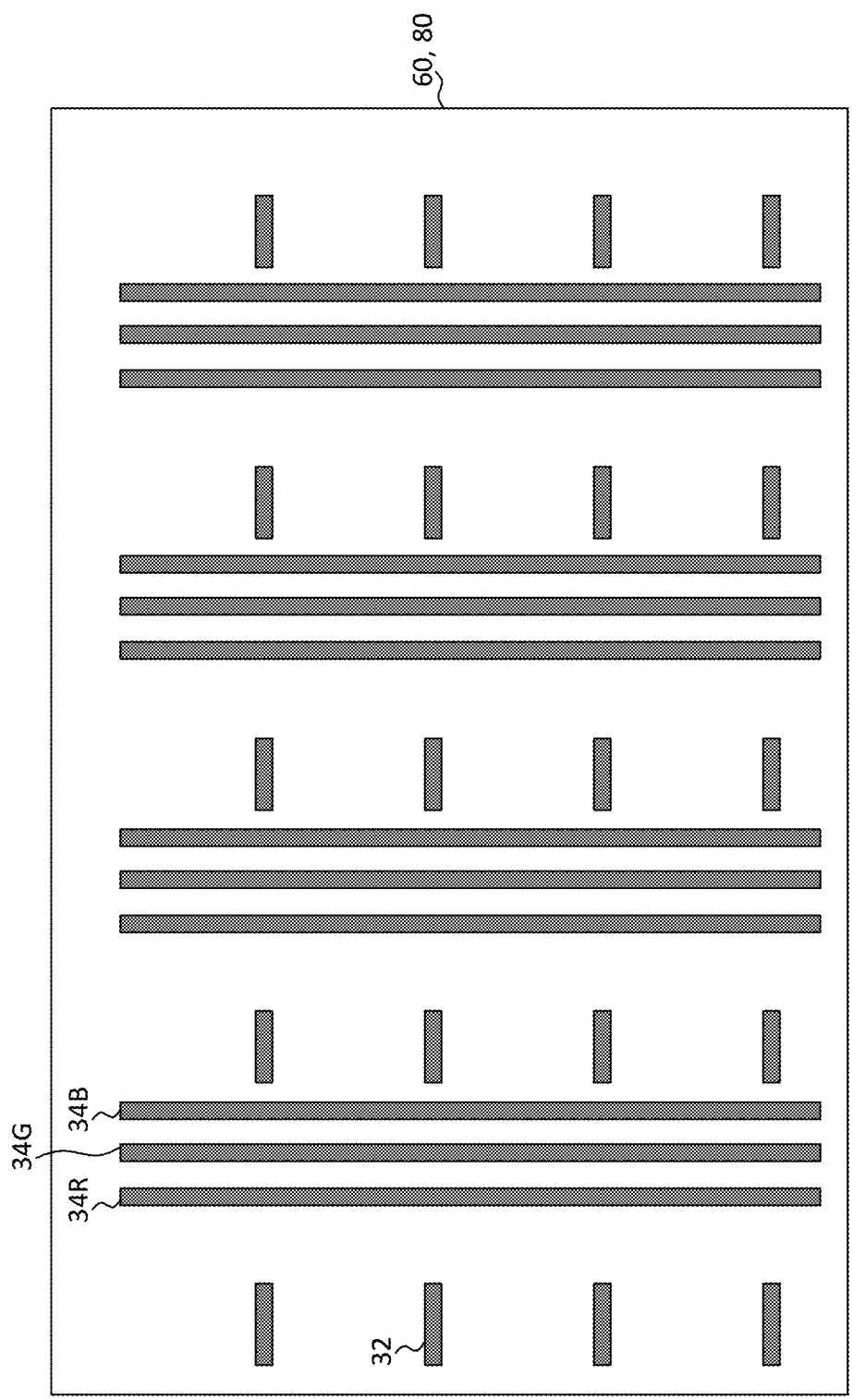
FIG. 10 is a plan view of a display substrate according to an embodiment of the present invention.

Referring next to FIG. 10, the destination substrate 60 of FIG. 7 includes a plurality of column conductors 34 (34R, 34G, 34B, collectively column conductors 34) providing signals for each of the different LEDs 20 in a printable electronic component 10, for example red, green, and blue LEDs 20R, 20G, 20B. Each of the red LEDs 20R is controlled by signals on a red column conductor 34R, each of the green LEDs 20G is controlled by signals on a green column conductor 34G, and each of the blue LEDs 20B is controlled by signals on a blue column conductor 34B.

Figure 11:
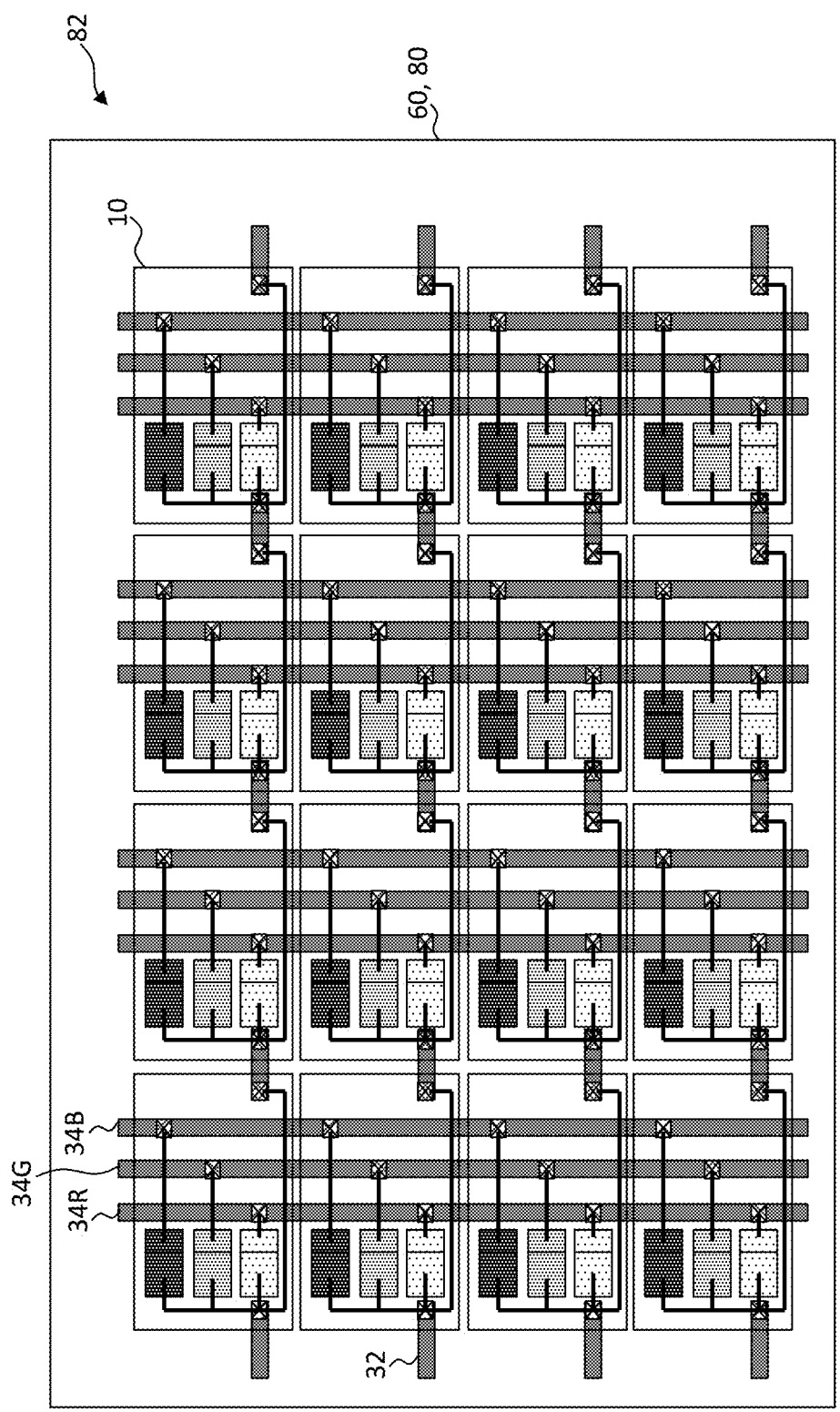
FIG. 11 is a plan view of a display according to an embodiment of the present invention using the display substrate of FIG. 10.

As shown in FIG. 11, the printable electronic components 10 of FIG. 9 are micro-transfer printed onto the display substrate 80 of FIG. 10 to form a display 82. As shown in FIG. 11, each of the red, green, and blue LEDs 20R, 20G, 20B of the printable electronic component 10 is electrically connected between a row conductor 32 (having a row segment) and the red, green, and blue column conductors 34R, 34G, 34B through the row and column connection posts 40R, 40C. When power is applied between the row conductor 32 and any one or all of the red, green, or blue column conductors 34R, 34G, 34B, for example with a passive-matrix display controller, the corresponding red, green, or blue LEDs 20R, 20G, 20B can emit light 70. At the same time, the additional connection post 40A is connected to row segments of a common row conductor 32 on each side of the red, green, and blue column conductors 34R, 34G, 34B. The electrical conductor 36 connected to the additional connection post 40A and connection post 40 of the printable electronic component 10 thus forms an electrical jumper electrically connecting the row segments in a row of a common row conductor 32 on opposite sides of the column conductors 34. The electrical jumper has two or more electrically connected electrically conductive jumper connection posts (e.g., an additional connection post 40A and a connection post 40 or another additional connection post 40A).

Figure 22:
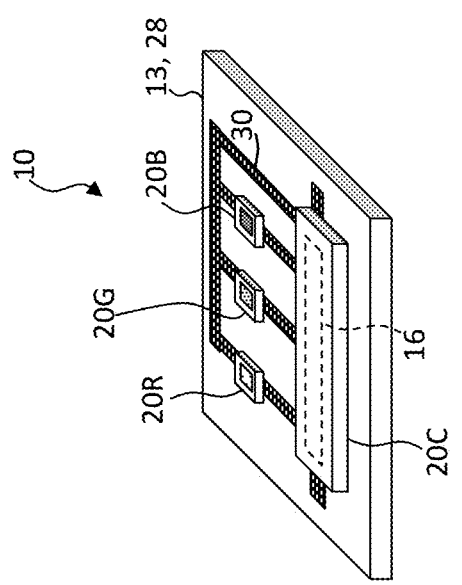
FIG. 22 is a perspective of an electronic component according to an embodiment of the present invention having a controller and three LEDs.
Figure 23:
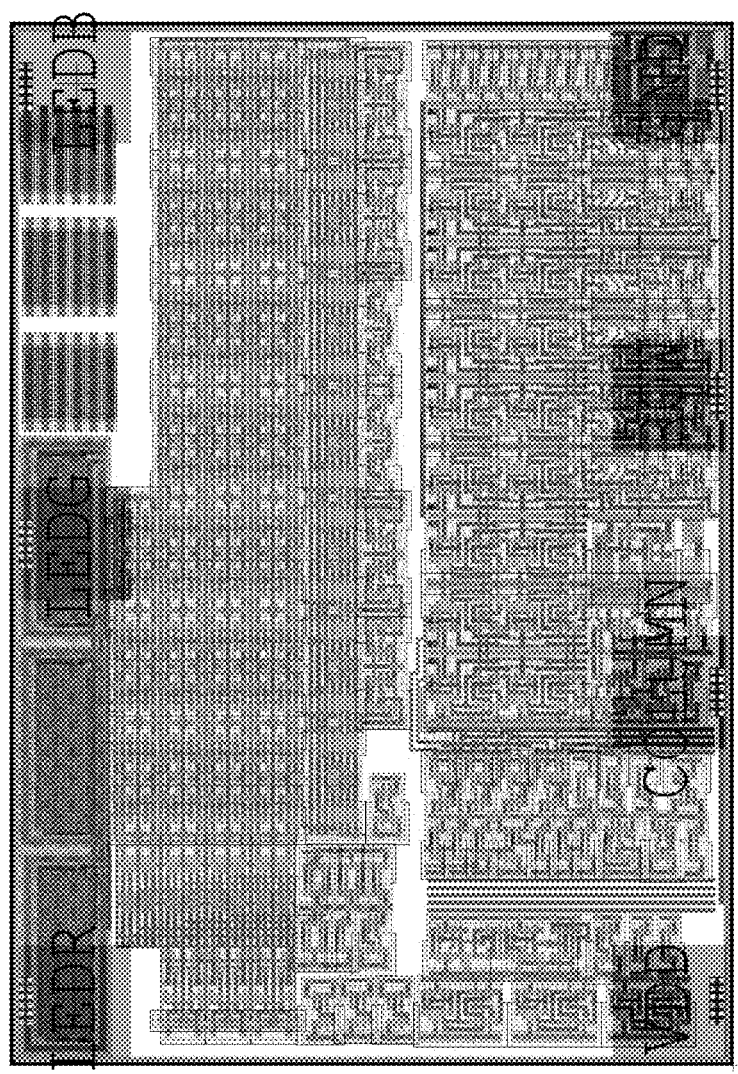
FIG. 23 is a layout schematic of the circuit of the controller of FIG. 22.
Figure 24:
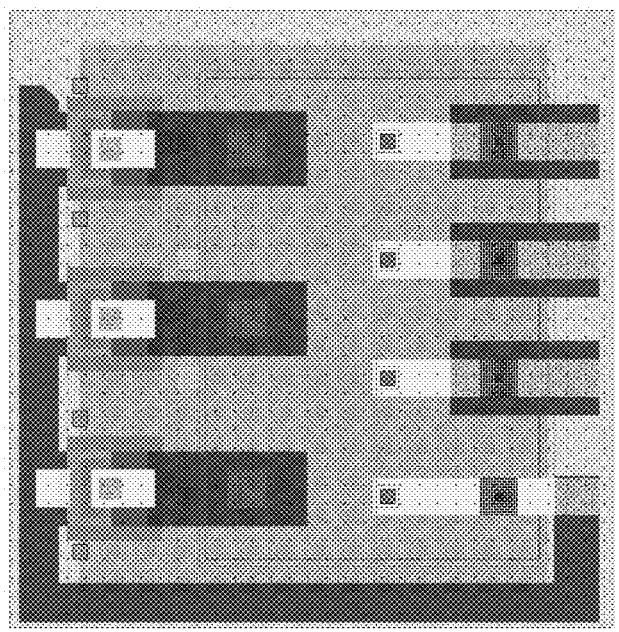
FIG. 24 is a layout schematic of the structure of FIG. 22.

In an alternative embodiment shown in FIG. 22, an integrated circuit controller 20C is included in the printable electronic component 10 and is connected to the LEDs 20 with conductive wires 36, all provided on a component substrate 13 that can be, for example, the dielectric layer 28. The row and column connection posts 40R, 40C can be connected to the integrated circuit controller or to the LEDs 20, as required for a desired circuit design. FIG. 23 is a schematic layout of a digital control circuit for red, green, and blue LEDs in a single micro-transfer printable electronic component 10. Thus, this electronic component 10 design has four electronic devices 20 (the controller and three LEDs) as shown in the layout of FIG. 24.

Figure 12:
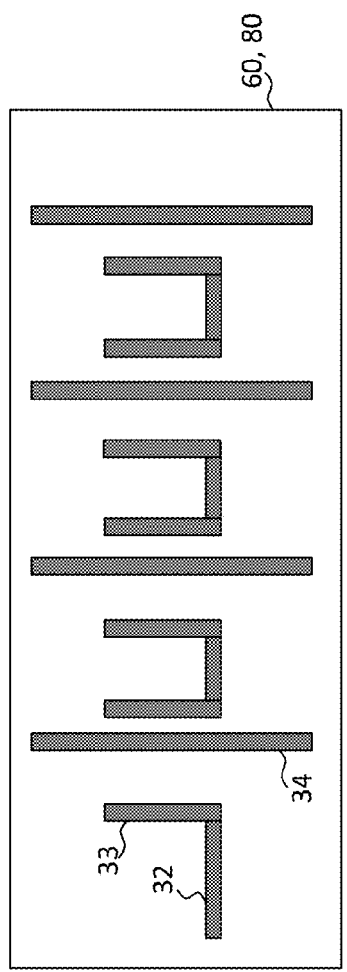
FIG. 12 is a plan view of a display substrate according to an embodiment of the present invention having space for redundant printable electronic components.
Figure 13:
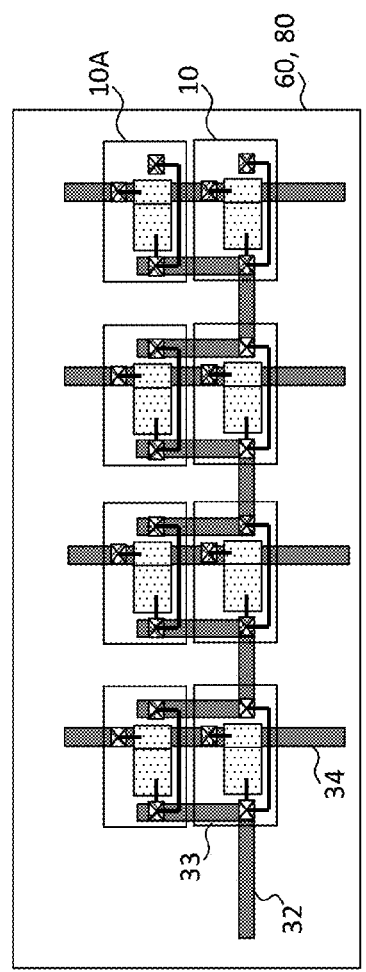
FIG. 13 is a plan view of a display substrate according to an embodiment of the present invention having redundant printable electronic components.

Referring to FIGS. 12 and 13, in another embodiment of the present invention, the row conductors 32 include a portion 33 that is substantially parallel to the column conductor 32, for example as described in U.S. patent application Ser. No. 15/040,810, whose entire contents are incorporated herein by reference. The parallel portion 33 provides a space for an additional printable electronic component 10A to be electrically connected between the row and column conductors 32, 34 in the eventuality that the printable electronic component 10 fails. This arrangement can also be used in the embodiment illustrated in FIG. 11. Substantially parallel means that similar printable electronic components 10 can be successfully electrically connected in parallel between the parallel portion and the column conductor(s) 34.

In various embodiments, the printable electronic components 10 or electronic devices 20 have at least one of a width, length, and height from 2 to 5 μm, 5 to 10 μm, 10 to 20 μm, 20 to 50 μm, 50 to 100 μm, 100 to 250 μm, and 250 to 500 μm.

Referring to FIGS. 14 and 15, a method of the present invention includes providing a display substrate 80 in step 210 and forming an array of electrical conductors on the display substrate 80 in step 220. The electrical conductors include an array of row conductors 32 disposed or formed on or over the display substrate 80. The row conductors 32 extend in a row direction. The electrical conductors also include an array of column conductors 34 disposed or formed on or over the display substrate 80. The column conductors 34 are electrically isolated from the row conductors 32 and extend in a column direction different from the row direction. The display substrate 80 can be, for example, glass, resin, polymer, metal, or ceramic or include such materials. The row and column conductors 32, 34 can be metal wires or electrical traces made of, for example, electrically conductive metals such as copper, silver, gold, aluminum, or tin, or metal alloys. Such a display substrate 80 and electrical conductors can be made using printed circuit board techniques.

Figure 16A:
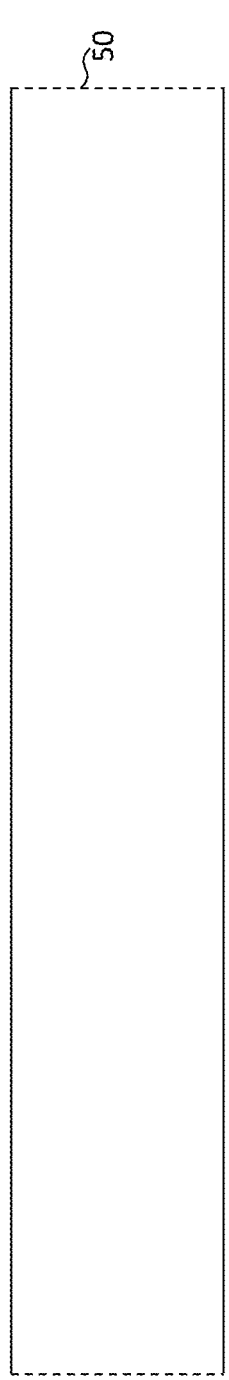
FIGS. 16A-16G are cross sections of sequential structures useful in constructing embodiments of the present invention.
Figure 16B:
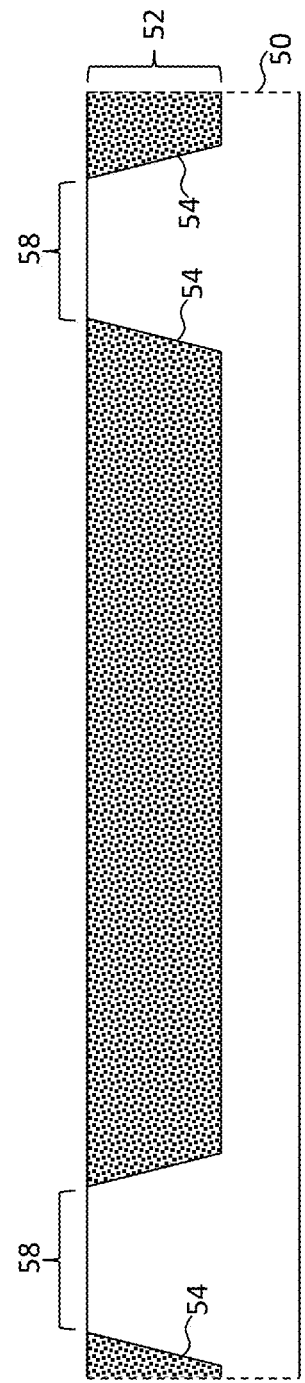
Figure 16C:
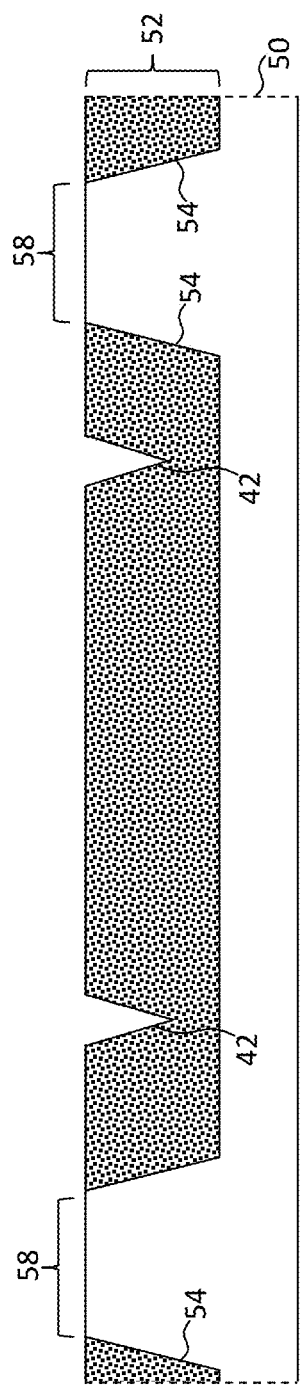
Figure 16D:
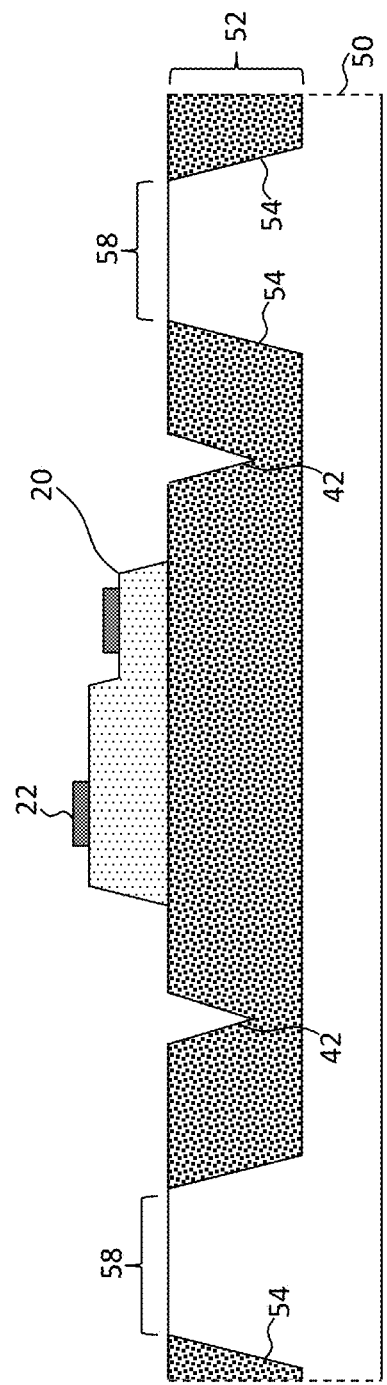

Referring also to FIGS. 16A-16G, a source printable electronic component wafer 12 is provided in step 100 (FIG. 16A). A plurality of printable electronic components 10 is provided in the printable electronic component wafer 12 by first patterning a sacrificial layer 52 in the wafer 50 in step 110 to form sacrificial portions 54 separated by anchor portions 58 (FIG. 16B) using photolithographic materials and methods. The wafer 10 can be a substrate such as a semiconductor, glass, polymer, metal, or ceramic wafer. In the embodiment of FIG. 1, if a dielectric layer 28 is desired, it is then deposited (not shown) and patterned to form vias exposing the desired location of the connection posts 40. Connection post forms 42 are etched into the sacrificial portions 54 in step 120, through the dielectric layer 28, if present. In the embodiment of FIG. 19, patterned metal is deposited in the connection post forms 42 to form the connection posts 40 and the dielectric layer 28 deposited and fills in the remaining volume of the connection post forms 42. The dielectric layer 28 can be a planarizing layer. In step 130 and as shown in FIG. 16D, an electronic device 20 is provided by forming or disposing an electronic device 20 on the sacrificial layer 52. The formation of connection posts is discussed in more detail in U.S. patent application Ser. No. 14/822,864, entitled Chiplets with Connection Posts by Prevatte et al., filed Aug. 10, 2015, referenced above.

Figure 16E:
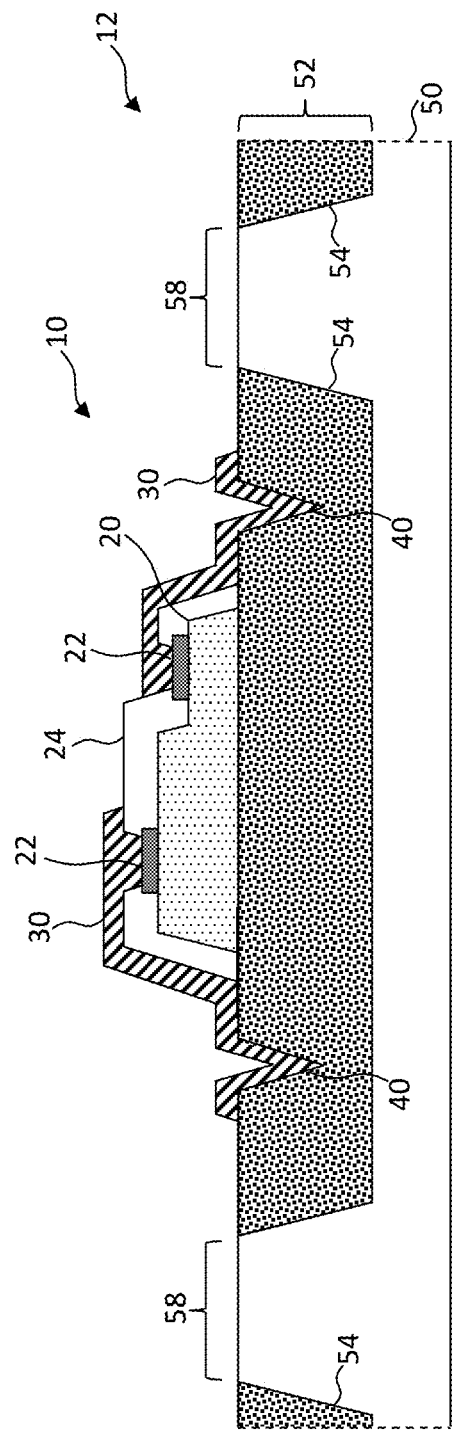

The electronic device 20 can be micro-transfer printed onto the sacrificial portion 54 and have a fractured or separated tether or formed in place and can include multiple layers such as conductive layers, p- or n-doped layers, undoped layers, or other semiconductor layers. Device electrical contacts 22 can also be formed on or in the electronic device 20. The order of steps 120 and 130 can be exchanged. Referring next to FIG. 16E and step 140, a patterned dielectric structure 24 is formed or otherwise disposed on the electronic device 20 to protect the electronic device 20 and, in the embodiment of FIG. 19, vias 44 are formed. Electrical conductors 30, such as electrodes, are formed in electrical contact with the device electrical contacts 22 over the sacrificial portion 54 and, in the embodiment of FIG. 1, the connection post form 42 to form connection posts 40. The patterned dielectric structure 24 can be, for example, silicon dioxide and the electrical conductors 30 can be metal deposited and patterned using photolithographic materials and methods such as coating, sputtering, or evaporation, and etching with patterned photoresist. One or more electrically conductive connection posts 40 of each printable electronic component 10 includes a row connection post 40R and a column connection post 40C. As shown in the printable electronic component wafer 12 of FIG. 16F, an optional encapsulation layer 26 can be provided in step 150 over the electrical conductors 30. In an embodiment, the optional encapsulation layer 26 can fill in any remaining volume of the connection post form 42 over the metal of the connection post 40 to form a solid core for the connection post 40 (FIG. 1). In some embodiments, therefore, the connection posts 40 comprise an electrically conductive layer (e.g., metal layer) formed over a core of a different material (e.g., dielectric material of encapsulation layer 26—FIG. 1—or dielectric layer 28—FIGS. 2, 19).

The sacrificial portions 54 of the printable electronic component wafer 12 are etched in step 200 (FIG. 16G) to form a plurality of printable electronic components 10. The sacrificial portions 54 can be, for example, an oxide layer or a designated anisotropically etchable portion of the wafer 50. The plurality of printable electronic components 10 are micro-transfer printed in step 230 from the printable electronic component wafer 12 to the display substrate 80, so that each row conductor 32 is connected to each column conductor 34 with one printable electronic component 10. The row connection post 40R is electrically connected to the row conductor 32 and the column connection post 40C is electrically connected to the column conductor 34 of the one printable electronic component 10 to form a display 82 (FIGS. 8, 11 and 13). The process can be repeated with a plurality of printable electronic component source wafers 12 that each can be etched and their printable electronic components 10 micro-transfer printed onto the display substrate 80.

In a further method of the present invention, the connection posts 40 are first connection posts 40. The method includes providing one or more electrically conductive additional connection posts 40A that protrude beyond the post side 21 of each of the printable electronic components 10, electrically connecting each additional connection post 40A with an electrical conductor 36 to a first connection post 40 or to an additional connection post 40A, forming the row conductors 32 in row segments between the column conductors 34 in the same layer on the display substrate 80 as the column conductors 34, and micro-transfer printing the plurality of printable electronic components 10 to electrically connect the row segments of common row conductors 32 on each side of a column conductor 34 with a first connection post 40 and an additional connection post 40A or with two additional connection posts 40A of a printable electronic component 10 to electrically connect the two row segments of the common row conductor 32.

Figure 16F:
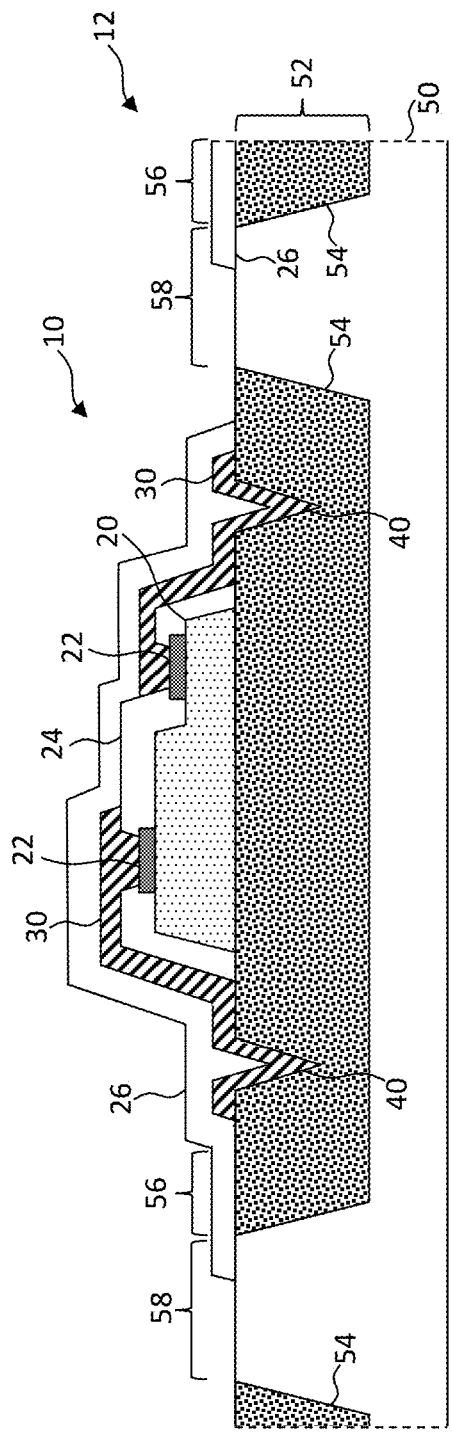
Figure 16G:
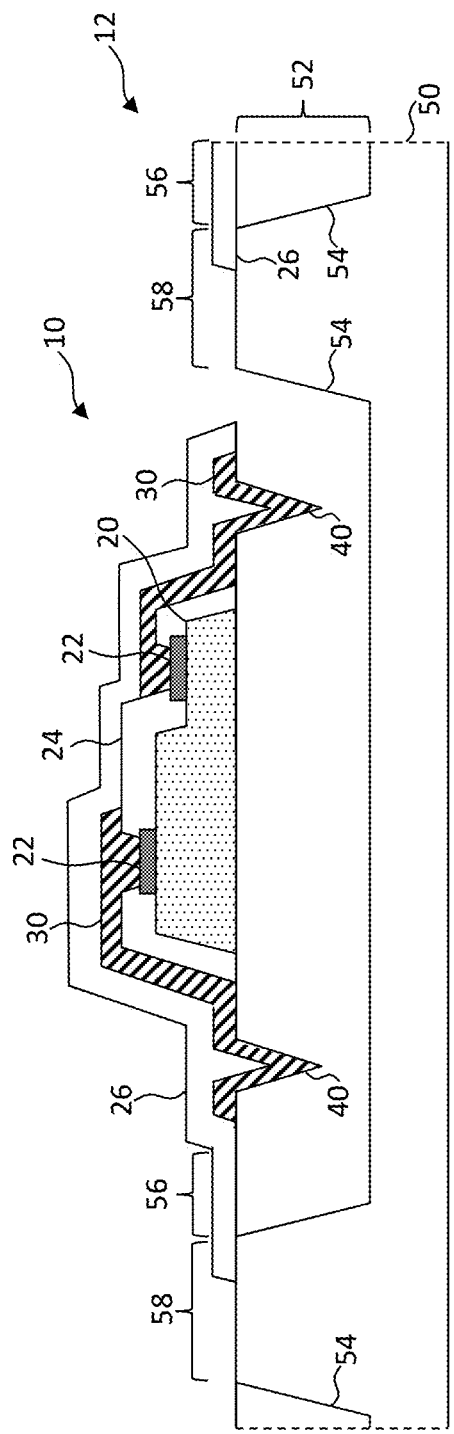
Figure 21:
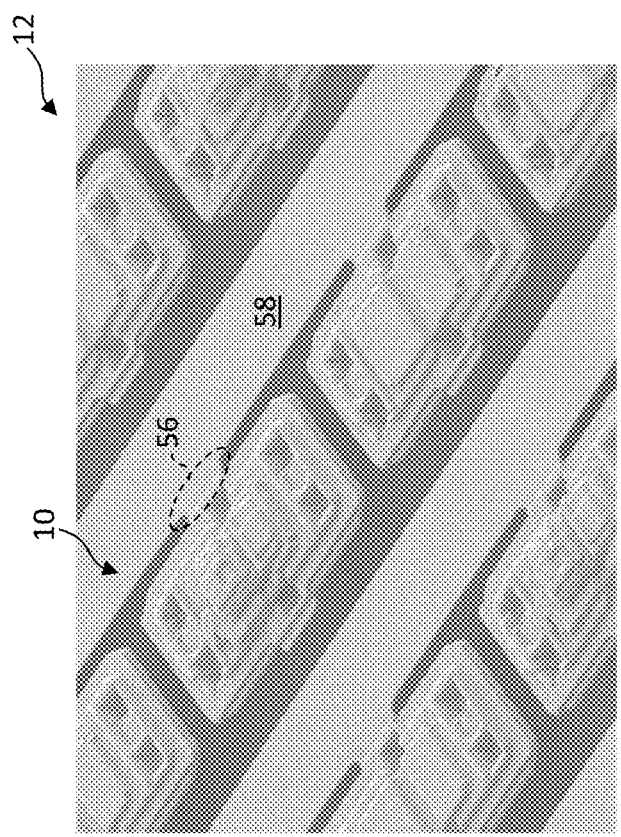
FIG. 21 is a perspective micrograph of a printable LED component wafer according to an embodiment of the present invention.

Thus, according to an embodiment of the present invention and as shown in FIGS. 16F and 16G and the perspective micrograph of FIG. 21, a printable electronic component wafer 12 includes a wafer 50 including wafer material, a patterned sacrificial layer 52 forming sacrificial portions 54 spaced apart by anchor portions 58 formed on or in the wafer 50. A printable electronic component 10 is disposed or formed entirely on or over each sacrificial portion 54 and connected to an anchor 58 by a tether 56. For example, the tether 56 can comprise material of the encapsulation layer 26, if present, or the dielectric layer 28, if present, such as silicon dioxide or silicon nitride. In an embodiment, the sacrificial portions 54 comprise an etchable material other than the wafer material 50 (as in FIG. 16F), the sacrificial portions 54 comprise an anisotropically etchable portion of the wafer material 50 (not shown), or the sacrificial portions 54 comprise a gap between the printable electronic component 10 and the wafer material 50 (as in FIG. 16G).

A method of making a printable electronic component wafer 12 includes providing a wafer 50 including wafer material (step 100), forming a patterned sacrificial layer 52 having sacrificial portions 54 spaced apart by anchor portions 58 formed on or in the wafer 50 (step 110), providing a plurality of electronic components 10, each electronic device 20 disposed entirely over a sacrificial portion 54 and connected to an anchor 58 by a tether 56 (step 130). In one embodiment, the electrical devices 20 are micro-transfer printed on or over the sacrificial portions 54; in another embodiment, the electrical devices 20 are formed on or over the sacrificial portions 54. Step 130 can be repeated by micro-transfer printing a plurality of electrical devices 20 onto each of the sacrificial portions 54. For example, red, green, and blue LEDs 20R, 20G, 20B can be micro-transfer printed from different wafers possibly made with different materials or crystalline structures onto the sacrificial portions 54 to make a structure such as that of FIG. 9. The printable electronic component wafer 12 can include a plurality of sacrificial portions 54 with a corresponding plurality of printable electronic components 12 that can be assembled in a single process step by micro-transfer printing a plurality of the red, green, and blue LEDs 20R, 20G, 20B in a common step onto corresponding sacrificial portions 54 so that each sacrificial portion 54 has one each of a red, green, and blue LED 20R, 20G, 20B.

In another embodiment, one or more connection post forms 42 are made in each sacrificial portion 54 (step 120) and electrical conductors 30 (electrodes) are formed in the connection post forms 42 and electrically connected to the LEDs 20 to make one or more connection posts 40 or additional connection posts 40A (step 140). As described above, in one method of the present invention, the sacrificial portions 54 are etched (step 200) to form a tether 56 connecting the electronic components 10 to the anchor 58 and forming a sacrificial portion 54 gap between the electronic components 10 and the wafer material 50.

The printable electronic component 10 can be an active component, for example including one or more active elements such as electronic transistors or diodes or light-emitting diodes and photodiodes that produce an electrical current in response to ambient light. The printable electronic component 10 can be or include a semiconductor device having one or more semiconductor layers, such as an integrated circuit or light-emitting diode. The printable electronic component 10 can be an unpackaged die. The printable electronic component 10 can include passive components, for example including one or more passive elements such as resistors, capacitors, or conductors. In another embodiment, the printable electronic component 10 includes both active and passive elements. In yet another embodiment, the printable electronic component 10 has a plurality of active or passive elements, such as multiple semiconductor devices with separate substrates, each with one or more active elements such as multiple LEDs 20 that each emit different colors of light, such as red, green, or blue light, or passive elements, or both. The printable electronic component 10 can itself be micro transfer printed from a source wafer 12 after the elements have been arranged thereon and released therefrom, and thus include a fractured or separated tether 56. The elements can include or be electronic processors, controllers, drivers, light-emitting diodes, photodiodes, light-control devices, or light-management devices.

The printable electronic components 10 can include active elements such as electronic circuits formed using lithographic processes and can include passive elements such as electrical connections, e.g., wires such as electrical conductors 30, 36, to the device electrical contacts 22 and connection posts 40 or additional connection posts 40A. The active or passive elements can be made in or disposed on the sacrificial portions 54 or layers formed over the sacrificial portions 54, for example by micro-transfer printing or photolithographic processes. In certain embodiments, the device electrical contacts 22 are planar electrical connections formed on a side of the printable electronic component 10 and the source wafer 12. Such device electrical contacts 22 are typically formed from metals such as aluminum or polysilicon using masking and deposition processes used in the art. In certain embodiments, the device electrical contacts 22 are electrically connected to the circuit with electrical conductors 30 such as wires. In some embodiments, device electrical contacts 22 and the circuit, together with other functional structures formed in the active layer on the source wafer 12 make up the printable electronic component 10.

The printable electronic components 10 made by methods of the present invention can include a variety of electronic devices 20 such as chiplets having semiconductor structures, a diode, a light-emitting diode (LED), a transistor, or a laser. Chiplets are small integrated circuits and can be unpackaged dies released from a source wafer and can be micro transfer printed. Likewise, the printable electronic components 10 can be unpackaged. An unpackaged electronic component 10 has electronic device(s) that are exposed to the environment (even if an encapsulating layer 26 is provided) and is not located within a separate packaging container, for example with wire bonds connected to electrically conductive pins extending from the package. Chiplets can have at least one of a width, length, and height from 2 to 5 µm, 5 to 10 µm, 10 to 20 µm, or 20 to 50 µm. Chiplets can have a doped or undoped semiconductor substrate thickness of 2 to 5 µm, 5 to 10 µm, 10 to 20 µm, or 20 to 50 µm. The chiplet or active elements can be micro-light-emitting diodes with a length greater than width, for example having an aspect ratio greater than or equal to 2, 4, 8, 10, 20, or 50 and device electrical contacts 22 that are adjacent to the ends of the printable semiconductor components along the length of the printable semiconductor components. This structure enables low-precision manufacturing processes to electrically connect wires to the device electrical contacts 22 without creating registration problems and possible unwanted electrical shorts or opens.

In some embodiments of the present invention, the printable electronic components 10 include small integrated circuits, for example chiplets, having a thin substrate with a thickness of only a few microns, for example less than or equal to 25 microns, less than or equal to 15 microns, or less than or equal to 10 microns, and a width or length of 5-10 microns, 10-50 microns, 50-100 microns, or 100-1000 microns. Such micro-transfer printable chiplets can be made in a semiconductor source wafer (e.g., a silicon or GaN wafer) having a process side and a back side used to handle and transport the wafer. The chiplets are formed using lithographic processes in an active layer on or in the process side of a source wafer. An empty release layer space (corresponding to sacrificial portion 54 in FIG. 16G) is formed beneath the micro-transfer printable chiplets with tethers 56 connecting the micro-transfer printable chiplets to the source wafer in such a way that pressure applied against the stamp side 23 of the micro-transfer printable chiplets with a transfer stamp breaks or fractures the tethers 56 to release the micro-transfer printable chiplets from the source wafer. In an alternative construction (not shown), the tether 56 is a post, for example located in the gap between the chiplet and the wafer, supporting the micro-transfer printable chiplet and the transfer processes disengages or separates the chiplet from the wafer. The chiplets are then micro-transfer printed to the printable electronic component 10. Lithographic processes in the integrated circuit art for forming micro-transfer printable chiplets in a source wafer, for example transistors, LEDS, wires, and capacitors, can be used. The same etching and transfer process can be used to micro-transfer print the assembled or constructed printable electronic components 10 on the printable electronic component wafer 12 to the destination substrate 60.

Methods of forming such structures are described, for example, in the paper AMOLED Displays using Transfer-Printed Integrated Circuits and U.S. Pat. No. 8,889,485, referenced above. For a discussion of micro-transfer printing techniques see, U.S. Pat. Nos. 8,722,458, 7,622,367 and 8,506,867, each of which is hereby incorporated by reference in its entirety. Micro-transfer printing using compound micro-assembly structures and methods can also be used with the present invention, for example, as described in U.S. patent application Ser. No. 14/822,868, filed Aug. 10, 2015, entitled Compound Micro-Assembly Strategies and Devices, which is hereby incorporated by reference in its entirety.

In an embodiment of the present invention and referring to FIGS. 25A, 25B, 26, and 27, the micro-transfer printable electronic components 10 include micro-light-emitting diodes (micro-LEDs) 90 (e.g., red micro-LEDs 90R that emit red light, green micro-LEDs 90G that emit green light, and blue micro LEDs 90B that emit blue light, and pixel controllers 92 (e.g., controller 20C) micro-assembled by micro-transfer printing onto a pixel substrate 94 (e.g., component substrate 13 or dielectric layer 28) to form a micro-pixel 96 (e.g., printable electronic component 10). An array of electrically conductive patterned row conductors 32 are formed on or over the display substrate 80 and extend in a row direction (e.g., horizontally in the perspective of FIG. 27). An array of electrically conductive patterned column conductors 34 are formed on or over the display substrate 80. The column conductors 34 are electrically isolated from the row conductors 32 and extend in a column direction different from the row direction (e.g., in a vertical direction orthogonal to the horizontal direction in the perspective of FIG. 27).

A plurality of the micro-pixels 96 are disposed in an array in the display area 84 over or on a display substrate 80 to make a micro-printed display 99. Each micro-pixel 96 is uniquely electrically connected to a row conductor 32 and a column conductor 34 and comprises a pixel substrate 94 that is separate, independent and distinct from the display substrate 80 and the pixel substrate 94 of any other micro-pixel 96. The pixel substrate 94 has electrically conductive patterned pixel conductors 30 (e.g., wires 36) provided thereon. One or more micro-light-emitting diodes (micro-LEDs) 90 are disposed on or over the pixel substrate 94 and each micro-LED 90 has an LED substrate separate, independent and distinct from any other LED substrate, the display substrate 80, and any pixel substrate 94. (In the Figures, the LED substrate of each micro-LED 90 is not distinguished from the micro-LED 90 and the controller substrate of each pixel controller 92 is not distinguished from the pixel controller 92.) Each of the one or more micro-LEDs 90 is electrically connected to one or more of the pixel conductors 30. A pixel conductor 30 can be a wire 36 or other electrical connector 36 formed or disposed on the pixel substrate 94 and can electrically connect the micro-LEDs 90 and pixel controller 92. The micro-pixels 96 can include an electrical connection for a jumper electrically connecting row segments in a row conductor 32 or column segments in a column conductor 34.

By uniquely electrically connected is meant that no conductor pair comprising a row conductor 32 and a column conductor 34 is connected to more than one micro-pixel 96. In a further embodiment, every possible conductor pair comprising a row conductor 32 and a column conductor 34 is connected to one, and only one, micro-pixel 96. A substrate that is separate, independent, and distinct from another substrate can be made separately at a different time or at a different location using different materials or methods than the other substrate. Each separate, independent, and distinct substrate can exist and be processed, transported, or manipulated independently of any other separate, independent, and distinct substrate. In embodiments of the present invention, the micro-LEDs 90 are LEDs 20 having a length or width less than or equal to 100 microns, 50 microns, 20 microns, 10 microns, 5 microns, 2 microns, or one micron.

In an embodiment of the present invention, the micro-LEDs 90 are micro-transfer printed from respective LED source wafers to the pixel substrate 94. In another embodiment of the present invention, the pixel controller 92 (e.g., controller 20C) is micro-transfer printed from a controller source wafer to the pixel substrate 94. Any of the micro-transfer printed micro-LEDs 90 or pixel controller 92 can have a broken, fractured or separated tether 56 as a consequence of micro-transfer printing. In an embodiment, the micro-pixels 96 are formed on a micro-pixel source wafer and each micro-pixel 96 is a micro-transfer printable or printed micro-pixel 96 and includes a broken, fractured or separated tether 56 as a consequence of micro-transfer printing.

Figure 25B:
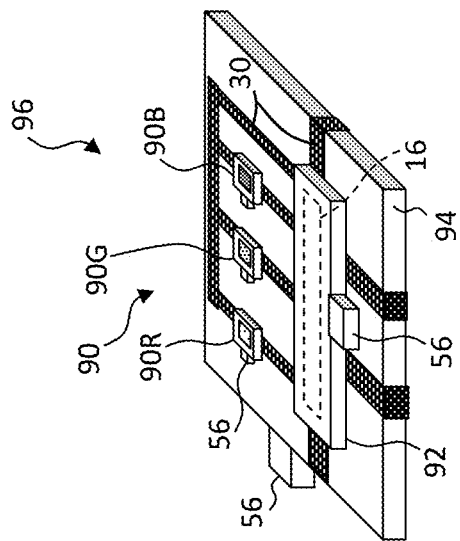
FIGS. 25A and 25B are perspectives of passive- and active-matrix micro-pixels according to embodiments of the present invention.
Figure 25A:
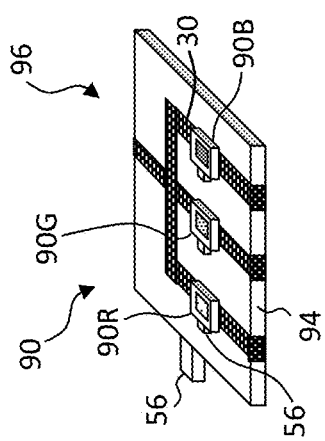

Referring to the embodiment of FIG. 25A, the micro-pixel 96 is a passive-matrix micro-pixel 96 having one or more externally controlled micro-LEDs 90 suitable for a passive-matrix micro-printed display 99 with row and column controllers external to the display area 84. The micro-LEDs 90 can each have an LED substrate separate, independent and distinct from any other LED substrate, the display substrate 80, and any pixel substrate 94.

As shown in the embodiment of FIG. 25B, the micro-pixel 96 is an active-matrix micro-pixel 96 having one or more micro-LEDs 90 controlled by a pixel controller 92 suitable for an active-matrix micro-printed display 99 with row and column controllers external to the display area 84. The pixel controller 92 is disposed on or over the pixel substrate 94 and has a controller substrate separate, independent and distinct from the display substrate 80, any pixel substrate 94, any micro-LED substrate, and any other controller substrate. The pixel controller 92 includes a control circuit 16 that is electrically connected to and controls the one or more micro-LEDs 90 of the micro-pixel 96.

Figure 26:
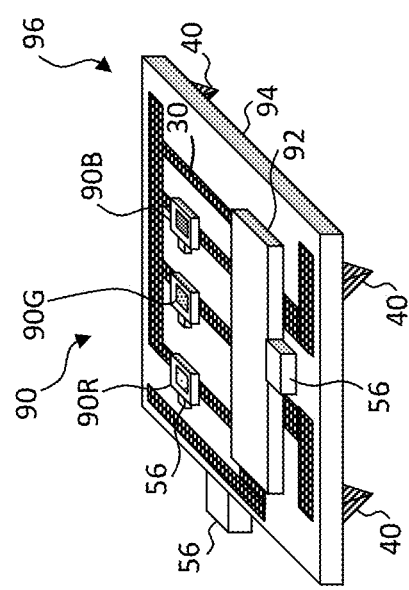
FIG. 26 is a perspective of a micro-pixel having connection posts according to an embodiment of the present invention.
Figure 27:
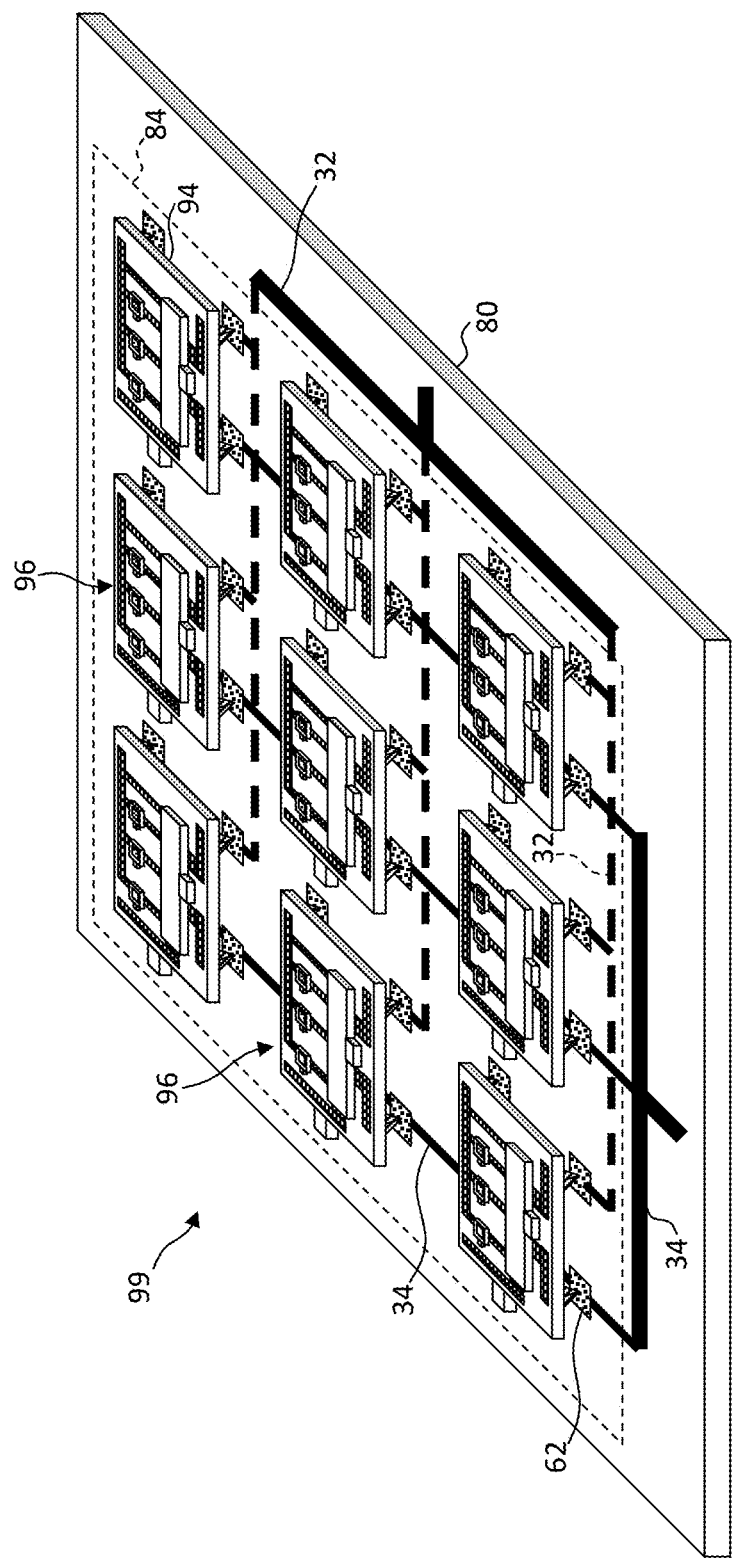
FIG. 27 is a perspective of at least a portion of a micro-printed display according to an embodiment of the present invention.

In an embodiment of the present invention, the one or more micro-LEDs 90 each have connection posts 40 that are electrically connected to the pixel conductors 30 on the pixel substrate 94. In another embodiment, the pixel controller 92 has connection posts 40 that are electrically connected to the pixel conductors 30 on the pixel substrate 94. Alternatively, one or more micro-LEDs 90 or the pixel controller 92 is electrically connected to the pixel conductors 30 using photolithographic methods and materials (as shown in FIGS. 25A, 25B, 26 and 27). Further, as shown in FIGS. 26 and 27, each pixel substrate 94 has a connection post 40 that forms at least a part of the electrical connection to the row conductor 32 and a connection post 40 that forms at least a part of the electrical connection to the column conductor 34. In the embodiment of FIGS. 26 and 27, the micro-pixel 96 has four connection posts 40 that are electrically connected to power and ground conductors (not shown), and row and column conductors 32, 34 with contact pads 62 on the display substrate 80.

Figure 28A:
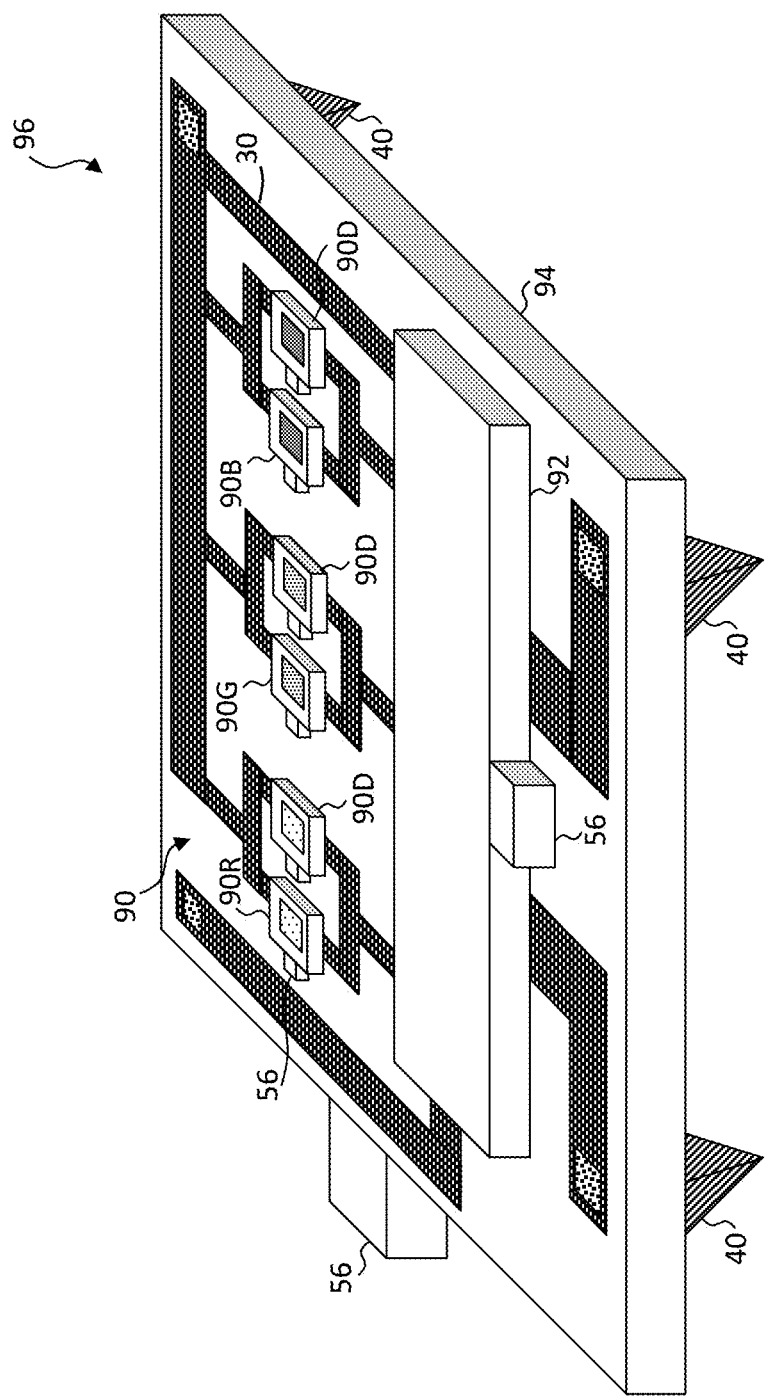
FIGS. 28A and 28B are perspectives of redundant and replacement micro-LEDs in a micro-pixel according to embodiments of the present invention.
Figure 28B:
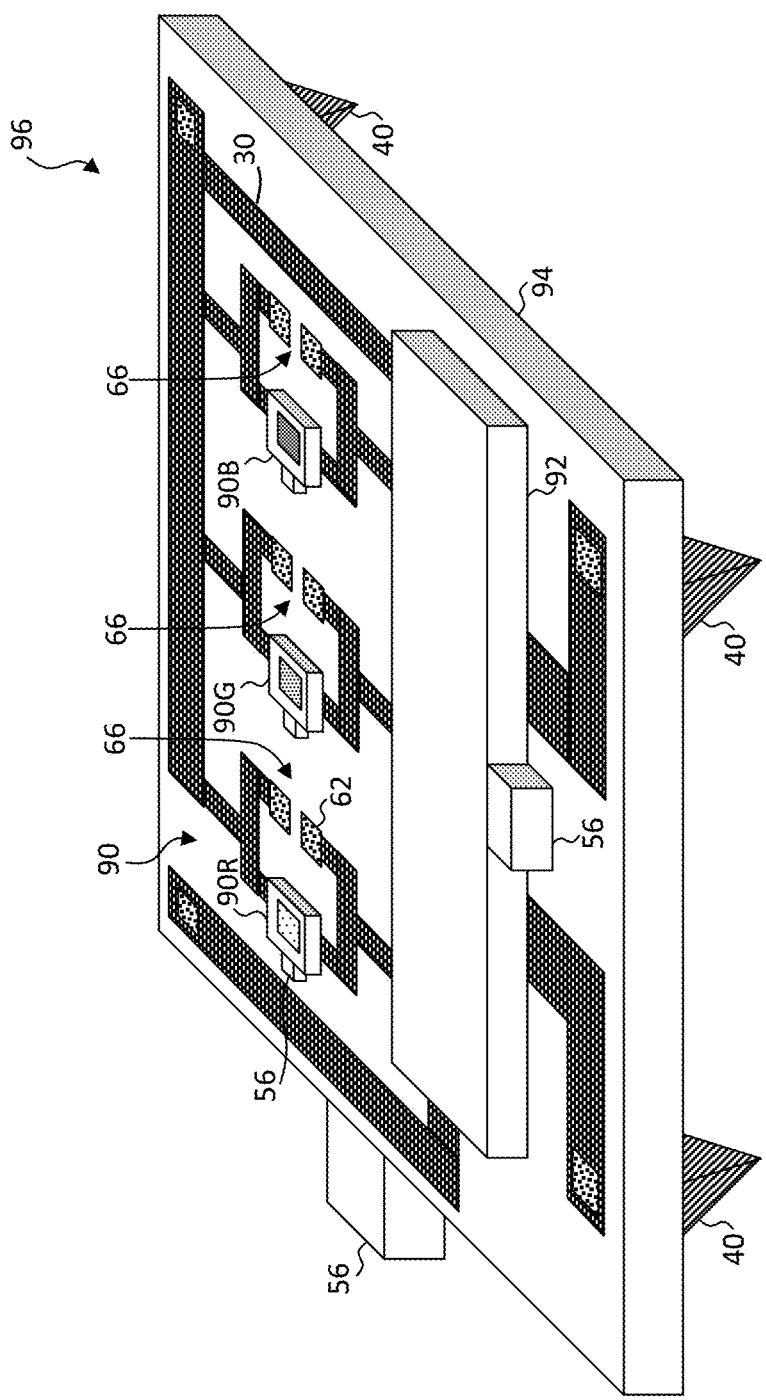

Referring to FIG. 28A in a further embodiment of the present invention, each pixel substrate 94 comprises a redundant micro-LED 90D corresponding to each micro-LED 90 electrically connected in parallel (as shown) or serial (not shown) with the corresponding micro-LED 90 using pixel conductors 30. The redundant micro-LED 90D can operate in the place of the corresponding micro-LED 90 and emit the same color of light if the corresponding micro-LED 90 is faulty or missing. Alternatively, and as shown in FIG. 28B, each pixel substrate 94 comprises a replacement micro-LED location 66 for each of the one or more micro-LEDs 90, the replacement micro-LED location 66 electrically connected to one or more of the pixel conductors 30 in parallel with the corresponding micro-LED 90. The replacement micro-LED location 66 can include one or more contact pads 62 for micro-LEDs 90 that are electrically connected through connection posts 40 (not shown) or with photolithographic connections. A replacement micro-LED 90D can be disposed, for example by micro-transfer printing, in the replacement micro-LED location 66 and operate in the place of the corresponding micro-LED 90 if the corresponding micro-LED 90 is faulty or missing.

Figure 29A:
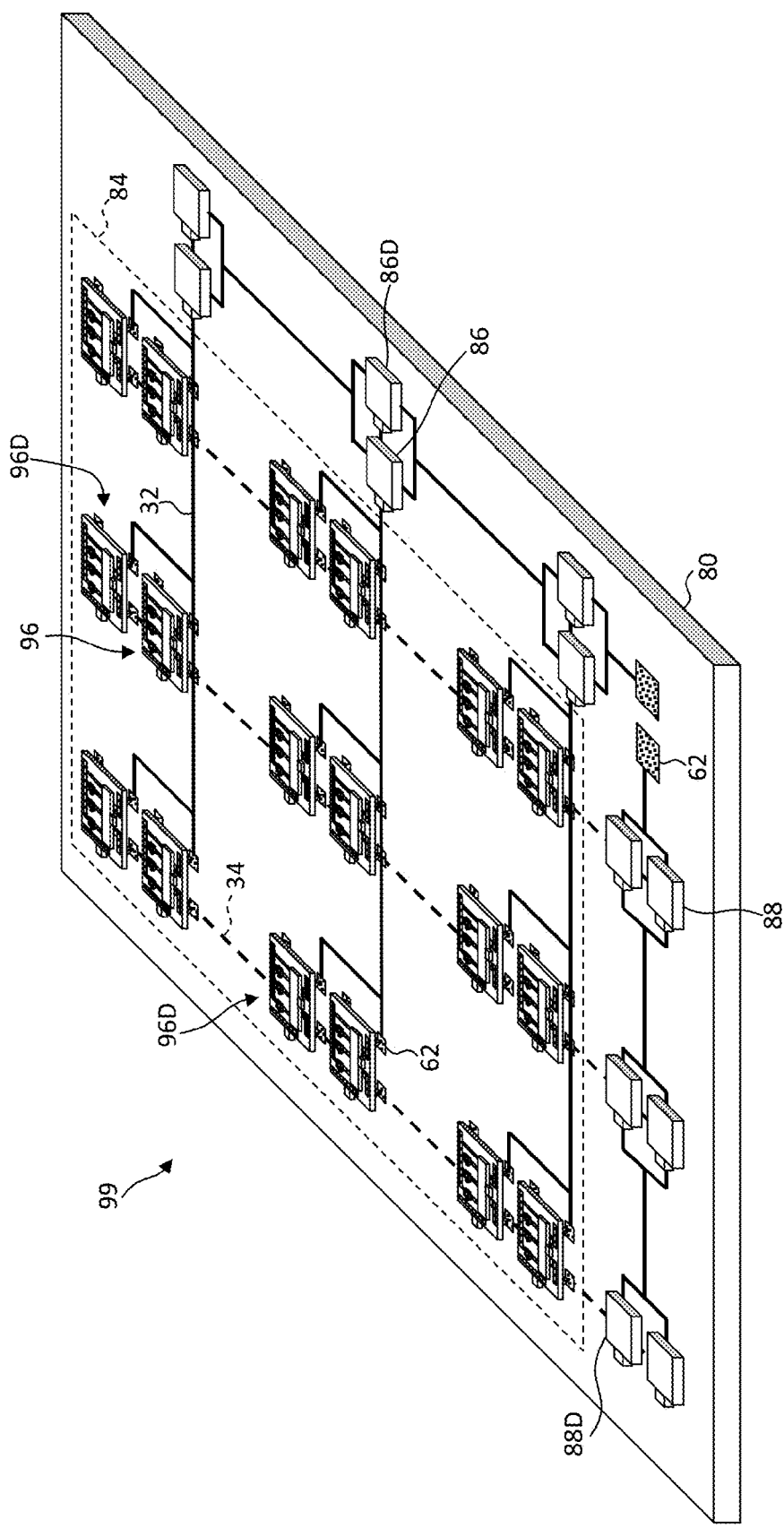
FIGS. 29A and 29B are perspectives of redundant and replacement micro-pixels, row controller, and column controllers in a micro-printed display according to embodiments of the present invention.

As shown in FIG. 29A, according to another embodiment of the present invention, the display substrate 80 of the micro-printed display 99 includes a redundant micro-pixel 96D corresponding to each micro-pixel 96 disposed over or on the display substrate 80 and electrically connected in parallel with the corresponding micro-pixel 96 using the row and column conductors 32, 34. The redundant micro-pixel 96D can operate in the place of the corresponding micro-pixel 96 if the corresponding micro-pixel 96 is faulty or missing. The use of redundant micro-LEDs 90, pixel controllers 92, and micro-pixels 96 is discussed in more detail in U.S. patent application Ser. No. 14/807,226, entitled Parallel Redundant Chiplet System, filed Jul. 23, 2015, referenced above.

Figure 29B:
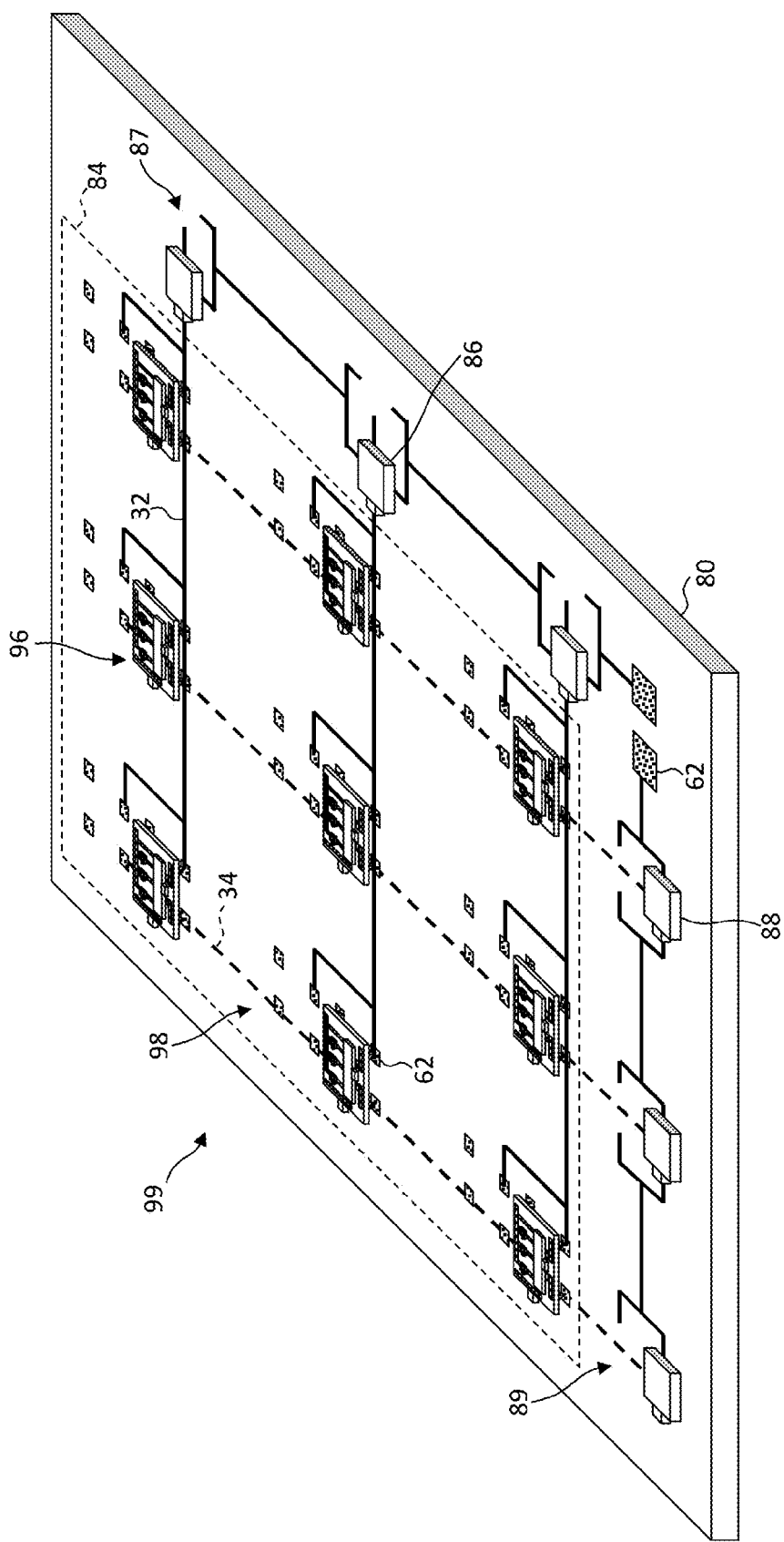

Alternatively, and as shown in FIG. 29B, each display substrate 80 comprises a replacement micro-pixel location 98 for each of the one or more micro-pixels 96, the replacement micro-pixel location 98 electrically connected to the row and column conductors 32, 34 in parallel with the corresponding micro-pixel 96. The replacement micro-pixel location 98 can include one or more contact pads 62 for micro-pixels 96 that are electrically connected through connection posts 40 (not shown) or with photolithographic connections.

If a faulty micro-pixel 96 is discovered, a replacement micro-pixel 96D (electrically and optically equivalent to a redundant micro-pixel 96D) can be disposed, for example by micro-transfer printing, in the micro-pixel replacement location 98, and electrically connected to the row conductor 32 and the column conductor 34 of the corresponding faulty micro-pixel 96. A portion of one or more of the wires (ground, power, row conductor 32, column conductor 34) can be cut, for example with a laser, to electrically isolate the faulty micro-pixel 96. The replacement micro-pixel 96D can operate in the place of the corresponding micro-pixel 96 if the corresponding micro-pixel 96 is faulty or missing. The use of replacement micro-LEDs 90 is discussed in more detail in U.S. patent application Ser. No. 15/040,810, entitled Matrix-Addressed Device Repair, filed Feb. 10, 2016, referenced above.

As shown in FIGS. 29A and 29B, the column conductors 34 are shown with a dashed line to indicate that they are formed in an electrically separate layer from the row conductors 32. However, the row or column conductors 32, 34 can be formed in row or column segments and electrically connected with jumpers, either independent jumpers or integrated into the micro-pixel 96, as described with respect to FIGS. 6, 8, 9, 11 and 13, for example. For clarity of illustration, although the power and ground connections and contact pads 62 for the micro-pixels 96 are shown in FIGS. 29A and 29B, the corresponding wires on the display substrate 80 are not shown (as is also true for FIGS. 7-13 and 27). The use of electrical jumpers is discussed in more detail in U.S. patent application Ser. No. 62/366,945, entitled Single Metal Layer Display, filed Jul. 26, 2016, referenced above.

The pixel conductors 30 can be made in a wafer fabrication facility using integrated circuit photolithographic methods and materials at a high resolution. Maintaining such a high resolution over the extent of a large display substrate 80 can be difficult or expensive. Therefore, in an embodiment of the present invention, the row and column conductors 32, 34 have a width that is greater than the width of the pixel conductor 30 and the row and column conductors 32, 34 have a lower resolution than the pixel conductors 30. By a lower resolution conductor is meant that the relative size and spacing is larger than a corresponding high resolution conductor.

Referring further to FIGS. 29A and 29B, a plurality of row controllers 86 are disposed over or on the display substrate 80 and are electrically connected to the row conductors 32. Each row conductor 32 can be electrically connected to one row controller 86. Each row controller 86 can be a separate, independent, and distinct row controller 86 with a separate, independent, and distinct row controller substrate. The row controllers 86 can provide control signals to each row of micro-pixels 96 and can be serially connected in a daisy chain, as shown, or connected in parallel. In a further embodiment of the present invention, each row controller 86 has a corresponding redundant row controller 86D electrically connected in parallel with the row controller 86. The redundant row controller 86D can operate in the place of the corresponding row controller 86 if the corresponding row controller 86 is faulty or missing.

Alternatively, and as shown in FIG. 29B, each display substrate 80 comprises a replacement row controller location 87 for each of the one or more row controllers 86, the replacement row controller locations 87 electrically connected to the row conductors 32 in parallel with the corresponding row controller 86. The replacement row controller location 87 can include one or more contact pads 62 for replacement row controllers 86D that are electrically connected through connection posts 40 (not shown) or with photolithographic connections. A replacement row controller 86D can be disposed, for example by micro-transfer printing, in the replacement row controller location 87 and can operate in the place of the corresponding row controller 86 if the corresponding row controller 86 is faulty or missing.

As is also shown in FIGS. 29A and 29B, a plurality of column controllers 88 are disposed over or on the display substrate 80 and are electrically connected to the column conductors 34. Each column conductor 34 can be electrically connected to one column controller 88. Each column controller 88 can be a separate, independent, and distinct column controller 88 with a separate, independent, and distinct column controller substrate. The column controllers 88 can provide control signals to each column of micro-pixels 96 and can be serially connected in a daisy chain, as shown, or connected in parallel. In a further embodiment of the present invention, each column controller 88 has a corresponding redundant column controller 88D electrically connected in parallel with the column controller 88. The redundant column controller 88D can operate in the place of the corresponding column controller 88 if the corresponding column controller 88 is faulty or missing.

Alternatively, and as shown in FIG. 29B, each display substrate 80 comprises a replacement column controller location 89 for each of the one or more column controllers 88, the replacement column controller locations 89 electrically connected to the column conductors 34 in parallel with the corresponding column controller 88. The replacement column controller location 89 can include one or more contact pads 62 for replacement column controllers 88D that are electrically connected through connection posts 40 (not shown) or with photolithographic connections. A replacement column controller 88D can be disposed, for example by micro-transfer printing, in the replacement column controller location 89 and can operate in the place of the corresponding row controller 86 if the corresponding row controller 86 is faulty or missing.

The row and column controllers 86, 88 can be controlled by a display controller (not shown) external to the display area 84 or the display substrate 80. A design for each of the serially connected row and column controllers 86, 88 has been completed and used to control and provide data for micro-pixels 96 having the pixel controller 92 illustrated in FIG. 23 and micro-LEDs 90 as shown in FIG. 26. The use of serially connected row and column controllers 86, 88 is discussed in more detail in U.S. patent application Ser. No. 15/003,721, entitled Serial Row-Select Matrix-Addressed System, filed Jan. 21, 2016, referenced above.

In an embodiment of the present invention, the row conductors 32 have row segments disposed between the column conductors 34 and the micro-pixels 96 comprises an electrical connection between adjacent row segments on opposite sides of the column conductors 34. Alternatively, the column conductors 34 have column segments disposed between the row conductors 32 and the micro-pixels 96 comprise an electrical connection between adjacent column segments on opposite sides of the row conductors 32.

In another embodiment, the row conductors 32 have row segments disposed between the column conductors 34 and comprising jumpers that form an electrical connection between adjacent row portions on opposite sides of the column conductors 34.

Alternatively, column conductors have column segments disposed between the row conductors 32 and comprising jumpers that form an electrical connection between adjacent column segments on opposite sides of the row conductors 32.

According to various embodiments of the present invention, the printable electronic component source wafer 12 can be provided with the printable electronic components 10, release layer (sacrificial layer 52), tethers 56, and connection posts 40 already formed, or they can be constructed as part of the process of the present invention. Similarly, any source wafers having micro-transfer printable electronic devices 20 thereon can be constructed or transfer printed as part of the process of the present invention.

Connection posts 40 are electrical connections formed on a side (e.g., post side 21) of the printable electronic component 10 that extend generally perpendicular to a surface of the post side 21. Such connection posts 40 can be formed from metals such as aluminum, titanium, tungsten, copper, silver, gold, or other conductive metals. In some embodiments, the connection posts 40 are made of one or more high elastic modulus metals, such as tungsten. As used herein, a high elastic modulus is an elastic modulus sufficient to maintain the function and structure of the connection posts 40 when pressed into a destination substrate 60 contact pads 62.

The connection posts 40 can be formed by repeated masking and deposition processes that build up three-dimensional structures, for example, by etching one or more layers of metal evaporated or sputtered on the process side of the printable electronic component 10. Such structures can also be made by forming sacrificial portions 54 of a sacrificial layer 52 on the source wafer 50, etching a well into the surface of the sacrificial portions 54 to form connection post forms 42, filling or covering the connection post forms 42 with a patterned conductive material such as metal, optionally coating the patterned conductive material and filling in the connection post form 42 with a dielectric material, and then removing the sacrificial portions 54. In some embodiments, the connection posts 40 electrically connected to the electronic devices 20 and the connection posts 40 and the electronic devices 20, together with other functional active or passive structures formed in the active layer on the source wafer 12, make up the printable electronic component 10.

The connection posts 40 (including the additional contact posts 40A) can have a variety of aspect ratios and typically have a peak area smaller than a base area. The connection posts 40 can have a sharp point for embedding in or piercing destination substrate 60 contact pads 62. The connection posts 40 can include a post material coated with an electrically conductive material different from the post material. The post material can be an electrically conductive metal or a doped or undoped semiconductor or an electrically insulating polymer, for example a resin, cured, resin, or epoxy and can have any of a variety of hardness or elastic modulus values. In an embodiment, the post material is softer than the conductive material so that the conductive material can crumple when the connection post 40 is under mechanical pressure. Alternatively, the conductive material is softer than the post material so that it deforms before the post material when under mechanical pressure. By deform is meant that the connection posts 40 or the contact pads 62 or conductive material change shape as a consequence of the transfer printing. The connection post 40 or post material can be a semiconductor material, such as silicon or GaN, formed by etching material from around the connection post 40. Coatings, such as the conductive material can be evaporated or sputtered over the post material structure and then patternwise etched to form the connection post 40. The conductive material can be a solder or other metal or metal alloy that flows under a relatively low temperature, for example less than 120 degrees C. In particular, the conductive material can have a melting point less than the melting point of the post material.

In certain embodiments, the two or more adjacent connection posts 40 comprise a first and a second connection post of different heights. In certain embodiments, the distance between two or more connection posts 40 is less than a width or length of the contact pads 62 in a direction parallel to the destination substrate 60. In certain embodiments, the connection posts 40 are disposed in groups, the connection posts 40 within a group are electrically connected to a common destination substrate 60 contact pad 62 and the connection posts 40 in different groups are electrically connected to different contact pads 62. In certain embodiments, the connection posts 40 are disposed in groups and a spacing between adjacent connection posts 40 within a given group is less than a spacing between adjacent groups. In certain embodiments, the connection posts 40 within a group are electrically shorted together. In certain embodiments, each of the two or more connection posts 40 is a multi-layer connection post 40. In certain embodiments, the contact pad 62 comprises a material that is the same material as a material included in the connection post 40.

In certain embodiments, the contact pads 62 comprise a material that is softer than that of the connection post 40. In certain embodiments, the connection posts 40 comprise a material that is softer than that of the contact pads 62. In certain embodiments, a conductive material other than a material of the destination substrate contact pad 62 or the connection post 40 adheres or electrically connects, or both, the contact pad 62 to the connection post 40. In certain embodiments, the contact pad 62 has a first conductive layer and a second conductive layer over the first conductive layer, and the second conductive layer has a lower melting temperature than the first conductive layer. In embodiments, the contact pad 62 is coated with a non-conductive layer or the contact pad is 62 formed on a compliant non-conductive layer. In certain embodiments, the second conductive layer is a solder. In certain embodiments, the contact pad 62 is welded to the connection post 40. In certain embodiments, the contact pads 62 are non-planar and the connection posts 40 are inserted into the contact pads 62.

The destination substrate 60 contact pads 62 can be made of a relatively soft metal, such as tin, solder, or tin-based solder, to assist in forming good electrical contact with the connection posts 40 and adhesion with the printable electronic components 10. As used herein, a soft metal may refer to a metal into which a connection post 40 can be pressed to form an electrical connection between the connection post 40 and the contact pad 62. In this arrangement, the contact pad 62 can plastically deform and flow under mechanical pressure to provide a good electrical connection between the connection post 40 and the contact pad 62.

In another embodiment of the present invention, the connection posts 40 can include a soft metal and the contact pads 62 include a high elastic modulus metal. In this arrangement, the connection posts 40 can plastically deform and flow under mechanical pressure to provide a good electrical connection between the connection post 40 and the contact pads 62.

If an optional layer of adhesive 64 is formed on the destination substrate 60 (FIG. 18), the connection posts 40 can be driven through the adhesive layer 64 to form an electrical connection with the contact pads 62 beneath the adhesive layer 64. The adhesive layer 64 can be cured to more firmly adhere the printable electronic components 10 to the destination substrate 60 and maintain a robust electrical connection between the connection posts 40 and contact pads 62 in the presence of mechanical stress. The adhesive layer 64 can undergo some shrinkage during the curing process that can further strengthen the electrical connectivity and adhesion between the connection post 40 and the contact pads 62.

In alternative embodiments of the present invention, the connection posts 40 of the printable electronic components 10 are in contact with, are embedded in, or pierce the contact pads 62 of the destination substrate 60. In other or additional embodiments, either or both one or more of the connection posts 40 and the contact pads 62 are deformed or crumpled into a non-planar shape or are deformed so that the surfaces of the connection posts 40 and the contact pads 62 change shape on contact with each other. The deformation or crumpling can improve the electrical connection between the connection posts 40 and the contact pads 62 by increasing the surface area that is in contact between the connection posts 40 and the contact pads 62. To facilitate deformation, in an embodiment the connection posts 40 have a composition softer than that of the contact pads 62 or the contact pads 62 have a composition softer than the connection posts 40.

In another embodiment, the contact pads 62 are coated with an optional polymer layer that can extend over the destination substrate 60. The connection posts 40 of the printable electronic components 10 are driven through the polymer layer to make electrical contact with the contact pads 62. The polymer layer can protect the contact pads 62 and serve to embed the connection posts 40 in the contact pads 62 by adhering to the connection posts 40. Alternatively, a compliant polymer layer is formed beneath the contact pads 62 to facilitate the mechanical contact made when the connection posts 40 are embedded in the contact pads 62. For example, a metal or metal alloy containing as gold, tin, silver, or aluminum, can be formed over a polymer layer or a polymer layer coated over a metal or metal alloy containing gold, tin, silver, or aluminum. The compliant polymer layer can also serve to adhere the connection posts 40 to the contact pads 62.

In some embodiments, the printable electronic components 10 include small integrated circuits such as LEDs or assemblies of such small integrated circuits formed in or disposed on a semiconductor wafer, for example gallium arsenide or silicon, which can have a crystalline structure. Processing technologies for these materials typically employ high heat and reactive chemicals. However, by employing transfer technologies that do not stress the printable electronic component 10 or substrate materials, more benign environmental conditions can be used compared to thin-film manufacturing processes. Thus, the present invention has an advantage in that flexible substrates, such as polymeric substrates, that are intolerant of extreme processing conditions (e.g. heat, chemical, or mechanical processes) can be employed for the destination substrates 60. Furthermore, it has been demonstrated that crystalline semiconductor substrates have strong mechanical properties and, in small sizes, can be relatively flexible and tolerant of mechanical stress. This is particularly true for substrates having 5-micron, 10-micron, 20-micron, 50-micron, or even 100-micron thicknesses. Alternatively, the printable electronic components 10 can be formed in a microcrystalline, polycrystalline, or amorphous semiconductor layer.

The printable electronic components 10 can be constructed using foundry fabrication processes used in the art. Layers of materials can be used, including materials such as metals, oxides, nitrides and other materials used in the integrated-circuit art. Each printable electronic component 10 can be or include a complete semiconductor integrated circuit and can include, for example, transistors. The printable electronic components 10 can have different sizes, for example, 1000 square microns or 10,000 square microns, 100,000 square microns, or 1 square mm, or larger, and can have variable aspect ratios, for example 1:1, 2:1, 5:1, or 10:1. The printable electronic components 10 can be rectangular or can have other shapes.

Embodiments of the present invention provide advantages over other printing methods described in the prior art. By employing connection posts 40 on printable electronic components 10 and a printing method that provides printable electronic components 10 on a destination substrate 60 and connection posts 40 adjacent to the destination substrate 60, a low-cost method for printing chiplets in large quantities over a destination substrate 60 is provided. Furthermore, additional process steps for electrically connecting the printable electronic components 10 to the destination substrate 60 are obviated.

The source wafer 12 and printable electronic components 10, micro-transfer printing stamps, and destination substrate 60 can be made separately and at different times or in different temporal orders or locations and provided in various process states.

The method of the present invention can be iteratively applied to a single or multiple destination substrates 60. By repeatedly transferring sub-arrays of printable electronic components 10 from a transfer stamp to a destination substrate 60 and relatively moving the transfer stamp and destination substrates 60 between stamping operations by a distance equal to the spacing of the selected printable electronic components 10 in the transferred sub-array between each transfer of printable electronic components 10, an array of printable electronic components 10 formed at a high density on a source wafer 12 can be transferred to a destination substrate 60 at a much lower density. In practice, the source wafer 12 is likely to be expensive, and forming printable electronic components 10 with a high density on the source wafer 12 will reduce the cost of the printable electronic components 10, especially as compared to forming printable electronic components 10 on the destination substrate 60.

In particular, in the case wherein the active printable electronic component 10 is or includes an integrated circuit formed in a crystalline semiconductor material, the integrated circuit substrate provides sufficient cohesion, strength, and flexibility that it can adhere to the destination substrate 60 without breaking as the transfer stamp is removed.

In comparison to thin-film manufacturing methods, using densely populated source substrate wafers 12 and transferring printable electronic components 10 to a destination substrate 60 that requires only a sparse array of printable electronic components 10 located thereon does not waste or require active layer material on a destination substrate 60. The present invention can also be used in transferring printable electronic components 10 made with crystalline semiconductor materials that have higher performance than thin-film active components. Furthermore, the flatness, smoothness, chemical stability, and heat stability requirements for a destination substrate 60 used in embodiments of the present invention may be reduced because the adhesion and transfer process is not substantially limited by the material properties of the destination substrate 60. Manufacturing and material costs may be reduced because of high utilization rates of more expensive materials (e.g., the source substrate) and reduced material and processing requirements for the destination substrate 60.

As is understood by those skilled in the art, the terms "over" and "under" are relative terms and can be interchanged in reference to different orientations of the layers, elements, and substrates included in the present invention. For example, a first layer on a second layer, in some implementations means a first layer directly on and in contact with a second layer. In other implementations, a first layer on a second layer includes a first layer and a second layer with another layer therebetween.

The terms row and column are arbitrary and relative designations and can be exchanged in embodiments of the present invention.

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST 10 printable/printed electronic component
10A additional printable electronic component
12 printable electronic component wafer/source wafer
13 component substrate
16 control circuit
20 electronic device/LED
20C controller
20R red LED
20G green LED
20B blue LED
21 post side
22 device electrical contact
23 stamp side
24 dielectric structure
26 encapsulation layer
28 dielectric layer
30 electrical conductor/electrode/pixel conductor
32 row conductor
33 parallel portion
34 column conductor
36 electrical conductor/wire 40 connection post/spike/first connection post
40A additional connection post
40C column connection post
40R row connection post
41 unconnected post
42 connection post form
50 wafer/wafer material
52 sacrificial layer
54 sacrificial portion
56 tether
58 anchor/anchor portion
60 destination substrate
62 contact pad
64 adhesive/adhesive layer
66 replacement micro-LED location
70 light
80 display substrate
82 display
84 display area
86 row controller
86D redundant/replacement row controller
87 replacement row controller location
88 column controller
88D redundant/replacement column controller
89 replacement column controller location
90 micro-LED
90D redundant/replacement micro-LED
90R red micro-LED
90G green micro-LED
90B blue micro-LED
92 pixel controller
94 pixel substrate
96 micro-pixel
96D redundant/replacement micro-pixel
98 replacement micro-pixel location
99 micro-printed display
100 provide source wafer step
110 pattern sacrificial layer step
120 make connection post forms step
130 provide LED step
140 pattern dielectric and electrodes step
150 pattern encapsulation layer step
200 etch sacrificial layer step
210 provide display substrate step
220 pattern electrical conductors step
230 micro-transfer print printable electronic component step

The invention claimed is:

1. A micro-printed display, comprising:
a display substrate;
an array of electrically conductive patterned row conductors formed on or over the display substrate, the row conductors extending in a row direction;
an array of electrically conductive patterned column conductors formed on or over the display substrate, the column conductors electrically isolated from the row conductors and extending in a column direction different from the row direction; and
a plurality of micro-pixels disposed over or on the display substrate, each micro-pixel uniquely electrically connected to a row conductor and a column conductor and wherein each micro-pixel comprises:
a pixel substrate separate, independent and distinct from the display substrate and the pixel substrate of any other micro-pixel, the pixel substrate having electrically conductive patterned pixel conductors provided thereon; and
(ii) one or more micro-light-emitting diodes (micro-LEDs) disposed on or over the pixel substrate, each micro-LED having an LED substrate separate, independent and distinct from any other LED substrate, the display substrate, and any pixel substrate, and each of the one or more micro-LEDs electrically connected to one or more of the pixel conductors,
wherein the micro-LEDs or the micro-pixels comprise a broken, fractured, or separated tether or both the micro-LEDs and the micro-pixels comprise a broken, fractured, or separated tether.

2. The micro-printed display of claim 1, wherein the one or more micro-LEDs each have connection posts that are electrically connected to the pixel conductors on the pixel substrate.

3. The micro-printed display of claim 1, wherein the micro-pixels each comprise a pixel controller disposed on or over the pixel substrate and having a controller substrate separate, independent and distinct from the display substrate, any pixel substrate, any micro-LED substrate, and any other controller substrate and wherein the pixel controller includes a control circuit that is electrically connected to and controls the one or more micro-LEDs of the micro-pixel.

4. The micro-printed display of claim 3, wherein the pixel controller has connection posts that are electrically connected to the pixel conductors on the pixel substrate.

5. The micro-printed display of claim 1, wherein each pixel substrate has a connection post that forms at least a part of the electrical connection to the row conductor and a connection post that forms at least a part of the electrical connection to the column conductor.

6. The micro-printed display of claim 1, wherein each pixel substrate comprises a redundant micro-LED corresponding to each micro-LED electrically connected in parallel or serial with the corresponding micro-LED.

7. The micro-printed display of claim 1, wherein each pixel substrate comprises a replacement LED location for each of the one or more micro-LEDs, the replacement micro-LED location electrically connected to one or more of the pixel conductors in parallel with the corresponding micro-LED.

8. The micro-printed display of claim 1, comprising a redundant micro-pixel corresponding to each micro-pixel disposed over or on the display substrate and electrically connected in parallel with the corresponding micro-pixel.

9. The micro-printed display of claim 1, comprising a replacement micro-pixel location for each of the micro-pixels, the replacement micro-pixel location electrically connected to a row conductor and a column conductor in parallel with the corresponding micro-pixel.

10. The micro-printed display of claim 1, wherein the row and column conductors have a width that is greater than the width of the pixel conductor and the row and column conductors have a lower resolution than the pixel conductors.

11. The micro-printed display of claim 1, comprising a plurality of row controllers disposed over or on the display substrate and electrically connected to the row conductors.

12. The micro-printed display of claim 11, wherein the row controllers are serially connected in a daisy chain.

13. The micro-printed display of claim 11, comprising a redundant row controller corresponding to each row controller disposed over or on the display substrate and electrically connected in parallel with the corresponding row controller.

14. The micro-printed display of claim 11, comprising a replacement row-controller location for each of the row controllers, the replacement row-controller location electrically connected in parallel with the corresponding row controller.

15. The micro-printed display of claim 1, comprising a plurality of column controllers disposed over or on the display substrate and electrically connected to the column conductors.

16. The micro-printed display of claim 15, wherein the column controllers are serially connected in a daisy chain.

17. The micro-printed display of claim 15, comprising a redundant column controller corresponding to each column controller disposed over or on the display substrate and electrically connected in parallel with the corresponding column controller.

18. The micro-printed display of claim 15, comprising a replacement column-controller location for each of the column controllers, the replacement column-controller location electrically connected in parallel with the corresponding column controller.

19. The micro-printed display of claim 1, wherein row conductors have row segments disposed between the column conductors and the micro-pixels comprise an electrical connection between adjacent row segments on opposite sides of the column conductors or wherein column conductors have column segments disposed between the row conductors and the micro-pixels comprise an electrical connection between adjacent column segments on opposite sides of the row conductors.

20. The micro-printed display of claim 1, wherein row conductors have row segments disposed between the column conductors and comprising jumpers that form an electrical connection between adjacent row segments on opposite sides of the column conductors or wherein column conductors have column segments disposed between the row conductors and comprising jumpers that form an electrical connection between adjacent column segments on opposite sides of the row conductors.

21. The micro-printed display of claim 20, wherein the jumper is a portion of the micro-pixel.

22. The micro-printed display of claim 20, wherein the jumper has a substrate separate, independent, and distinct from the micro-pixel.

23. A micro-printed display, comprising:
a display substrate;
an array of electrically conductive patterned row conductors formed on or over the display substrate, the row conductors extending in a row direction;
an array of electrically conductive patterned column conductors formed on or over the display substrate, the column conductors electrically isolated from the row conductors and extending in a column direction different from the row direction; and
a plurality of micro-pixels disposed over or on the display substrate, each micro-pixel uniquely electrically connected to a row conductor and a column conductor and wherein each micro-pixel comprises:
(iii) a pixel substrate separate, independent and distinct from the display substrate and the pixel substrate of any other micro-pixel, the pixel substrate having electrically conductive patterned pixel conductors provided thereon; and
(iv) one or more micro-light-emitting diodes (micro-LEDs) disposed on or over the pixel substrate, each micro-LED having an LED substrate separate, independent and distinct from any other LED substrate, the display substrate, and any pixel substrate, and each of the one or more micro-LEDs electrically connected to one or more of the pixel conductors,
wherein the row and column conductors have a width that is greater than the width of the pixel conductor and the row and column conductors have a lower resolution than the pixel conductors.

24. A micro-printed display, comprising:
a display substrate;
an array of electrically conductive patterned row conductors formed on or over the display substrate, the row conductors extending in a row direction;
an array of electrically conductive patterned column conductors formed on or over the display substrate, the column conductors electrically isolated from the row conductors and extending in a column direction different from the row direction; and
a plurality of micro-pixels disposed over or on the display substrate, each micro-pixel uniquely electrically connected to a row conductor and a column conductor and wherein each micro-pixel comprises:
a pixel substrate separate, independent and distinct from the display substrate and the pixel substrate of any other micro-pixel, the pixel substrate having electrically conductive patterned pixel conductors provided thereon; and
(ii) one or more micro-light-emitting diodes (micro-LEDs) disposed on or over the pixel substrate, each micro-LED having an LED substrate separate, independent and distinct from any other LED substrate, the display substrate, and any pixel substrate, and each of the one or more micro-LEDs electrically connected to one or more of the pixel conductors; and
either (a) a plurality of row controllers disposed over or on the display substrate and electrically connected to the row conductors, wherein the row controllers are serially connected in a daisy chain, or (b) a plurality of column controllers disposed over or on the display substrate and electrically connected to the column conductors, wherein the column controllers are serially connected in a daisy chain, or both (a) and (b).

* * * * *